United States Patent
Kanzaki et al.

(10) Patent No.: US 10,669,474 B2
(45) Date of Patent: Jun. 2, 2020

(54) LIGHT SOURCE UNIT, AND DISPLAY AND LIGHTING DEVICE EACH INCLUDING SAME

(71) Applicant: Toray Industries, Inc., Tokyo (JP)

(72) Inventors: Tatsuya Kanzaki, Otsu (JP); Yuichiro Iguchi, Otsu (JP); Masaaki Umehara, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/338,841

(22) PCT Filed: Aug. 18, 2017

(86) PCT No.: PCT/JP2017/029689
§ 371 (c)(1),
(2) Date: Apr. 2, 2019

(87) PCT Pub. No.: WO2018/066240
PCT Pub. Date: Apr. 12, 2018

(65) Prior Publication Data
US 2020/0048546 A1     Feb. 13, 2020

(30) Foreign Application Priority Data
Oct. 4, 2016 (JP) .................................. 2016-196148

(51) Int. Cl.
*C09K 11/06* (2006.01)
*F21V 9/32* (2018.01)
(Continued)

(52) U.S. Cl.
CPC .............. *C09K 11/06* (2013.01); *C07F 5/022* (2013.01); *C09K 11/02* (2013.01);
(Continued)

(58) Field of Classification Search
CPC ........ C09K 11/06; H01L 33/502; G02B 6/005; F21V 9/32
See application file for complete search history.

(56) References Cited

U.S. PATENT DOCUMENTS

| 5,446,157 A | 8/1995 | Morgan et al. |
| 2006/0268537 A1 | 11/2006 | Kurihara et al. |
| (Continued) | | |

FOREIGN PATENT DOCUMENTS

| JP | 08509471 A | 10/1996 |
| JP | 2000208262 A | 7/2000 |
| (Continued) | | |

OTHER PUBLICATIONS

Burghart et al., "3,5-Diaryl-4,4-difluoro-4-bora-3a,4a-diaza-s-indacene (BODIPY) Dyes: Synthesis, Spectroscopic, Electrochemical, and Structural Properties", J. Org. Chem., 1999, vol. 64, No. 21—pp. 7813-7819.
(Continued)

*Primary Examiner* — Anthony Ho
(74) *Attorney, Agent, or Firm* — RatnerPrestia

(57) ABSTRACT

A light source unit includes: a light emitting body; and a color conversion film including an organic luminescent material configured to convert at least a part of incident light incident from the light emitting body into light having a wavelength longer than a wavelength of the incident light. The light emitting body includes a light source, and a layer including a green phosphor and formed on the light source. The organic luminescent material has a light emission wavelength peak in a wavelength region of 580 nm or longer and 750 nm or shorter.

18 Claims, 8 Drawing Sheets

(51) Int. Cl.

| | | |
|---|---|---|
| *C07F 5/02* | (2006.01) | |
| *C09K 11/02* | (2006.01) | |
| *C09K 11/08* | (2006.01) | |
| *C09K 11/77* | (2006.01) | |
| *F21V 8/00* | (2006.01) | |
| *H01L 33/50* | (2010.01) | |

(52) U.S. Cl.
CPC ...... *C09K 11/0883* (2013.01); *C09K 11/7734* (2013.01); *F21V 9/32* (2018.02); *G02B 6/005* (2013.01); *H01L 33/502* (2013.01); *C09K 2211/1007* (2013.01); *C09K 2211/1018* (2013.01)

(56) References Cited

U.S. PATENT DOCUMENTS

| | | |
|---|---|---|
| 2008/0284316 A1 | 11/2008 | Kurihara et al. |
| 2009/0147497 A1 | 6/2009 | Nada |
| 2012/0162573 A1 | 6/2012 | Takahashi et al. |
| 2014/0210338 A1 | 7/2014 | Matsumura et al. |
| 2016/0104821 A1 | 4/2016 | Hino et al. |

FOREIGN PATENT DOCUMENTS

| | | |
|---|---|---|
| JP | 2006338901 A | 12/2006 |
| JP | 2007307893 A | 11/2007 |
| JP | 2008287073 A | 11/2008 |
| JP | 2009010013 A | 1/2009 |
| JP | 2009140822 A | 6/2009 |
| JP | 2010061824 A | 3/2010 |
| JP | 2010159411 A | 7/2010 |
| JP | 2011054659 A | 3/2011 |
| JP | 2013001791 A | 1/2013 |
| JP | 2016080802 A | 5/2016 |
| WO | 9419355 A1 | 9/1994 |

OTHER PUBLICATIONS

Fedors et al., "A Method for Estimating Both the Solubility Parameters and Molar Volumes of Liquids", Poly. Eng. Sci., 1974, vol. 14, No. 2—pp. 147-154.

International Search Report and Written Opinion for International Application No. PCT/JP2017/029689, dated Nov. 21, 2017—10 pages.

Kollmannsberger et al., "Electrogenerated Chemiluminescence and Proton-Dependent Switching of Fluorescence: Functionalized Difluoroboradiaza-s-indacenes", Angew. Chem., Int. Ed. Engl., 1997 vol. 36, No. 12—pp. 1333-1335.

LIGHT SOURCE UNIT, AND DISPLAY AND LIGHTING DEVICE EACH INCLUDING SAME

CROSS REFERENCE TO RELATED APPLICATIONS

This is the U.S. National Phase application of PCT/JP2017/029689, filed Aug. 18, 2017, which claims priority to Japanese Patent Application No. 2016-196148, filed Oct. 4, 2016, the disclosures of each of these applications being incorporated herein by reference in their entireties for all purposes.

FIELD OF THE INVENTION

The present invention relates to a light source unit, and a display and a lighting device each including the light source unit.

BACKGROUND OF THE INVENTION

Application of a multicoloring technique making use of a color conversion method to liquid crystal displays, organic electroluminescent (EL) displays, lighting devices, and other devices is being energetically studied. Color conversion means conversion of light emitted from a light-emitting body into light having a longer wavelength, and, for example, indicates conversion of blue light emission into green or red light emission.

A composition having such a color conversion function (hereinafter, referred to as a color conversion composition) is used, and combined with, for example, a blue light source, whereby the three primary colors, namely, blue, green, and red can be extracted, in other words, white light can be obtained from the blue light source. A white light source obtained by combining the blue light source with the composition having the color conversion function is used as a backlight unit, and a combination of a liquid crystal driving unit and color filters allows a full-color display to be produced. Without the liquid crystal driving unit, the residual part can be used as a white light source as it is, which can be applied as a white light source such as light-emitting diode (LED) lighting using an LED.

Examples of a problem with a liquid crystal display making use of a color conversion system include the enhancement of color reproducibility. To enhance color reproducibility, making a full width at half maximum of each of blue, green and red emission spectra of a backlight unit narrower and thereby enhancing the color purity of each of blue, green and red are effective.

To solve this problem, there has been proposed a technique of using a combination of a light emitting body having a light emission peak wavelength in a wavelength range of 240 nm to 560 nm, a green phosphor having a light emission peak wavelength in a wavelength range of 510 nm to 550 nm, a red phosphor activated by a tetravalent manganese ion, and a color filter having a blue pixel in which the difference between the maximum and the minimum of a transmittance in a wavelength range of 420 nm to 460 nm in a spectral transmittance curve is 4% or smaller (for example, see Patent Literature 1).

PATENT LITERATURE

Patent Literature 1: Japanese Patent Application Laid-open No. 2016-80802

Patent Literature 2: Japanese Patent Application Laid-open No. 2010-159411
Patent Literature 3: Japanese Patent Application Laid-open No. 2013-1791
Patent Literature 4: Japanese Unexamined Patent Application Publication (Translation of PCT Application) No. H8-509471
Patent Literature 5: Japanese Patent Application Laid-open No. 2000-208262
Patent Literature 6: Japanese Patent Application Laid-open No. 2007-307893

Non-Patent Literature

Non-Patent Literature 1: J. Org. Chem., vol. 64, No. 21, pp. 7813-7819 (1999)
Non-Patent Literature 2: Angew. Chem., Int. Ed. Engl., vol. 36, pp. 1333-1335 (1997)
Non-Patent Literature 3: Poly. Eng. Sci., vol. 14, No. 2, pp. 147-154 (1974)

SUMMARY OF THE INVENTION

However, the method described in Patent Literature 1 causes a larger full width at half maximum in the light emission wavelength of the green phosphor. Therefore, it has been difficult for an obtained liquid crystal display to offer both higher brightness and enhanced color reproducibility.

The present invention has been made in view of the above-mentioned circumstances, and an object of the present invention is to provide a light source unit for displays and lighting devices, the light source unit being capable of offering both higher brightness and enhanced color reproducibility.

To solve the problem described above and to achieve the object, a light source unit according to the present invention includes: a light emitting body; and a color conversion film including an organic luminescent material configured to convert at least a part of incident light incident from the light emitting body into light having a wavelength longer than a wavelength of the incident light. The light emitting body includes a light source, and a layer including a green phosphor and formed on the light source. The organic luminescent material has a light emission wavelength peak in a wavelength region of 580 nm or longer and 750 nm or shorter.

In the light source unit according to an embodiment of the present invention, the green phosphor is an Eu-activated β-sialon phosphor.

In the light source unit according to an embodiment of the present invention, the green phosphor has a light emission wavelength peak in a range of 525 nm or longer and 545 nm or shorter.

In the light source unit according to an embodiment of the present invention, a laminated film including eleven or more of alternating layers of different thermoplastic resins is provided between the light emitting body and the color conversion film. In the configuration of the light source unit according to an embodiment of the present invention, the laminated film has a reflectivity of 70% or higher when light having a wavelength of 580 nm or longer and 750 nm or shorter enters the laminated film at an incident angle of 60°. In the configuration of the light source unit according to an embodiment of the present invention, the laminated film has a reflectivity of 20% or lower when light having a wavelength of 400 nm or longer and 580 nm or shorter enters the laminated film at an incident angle of 10°.

In the light source unit according to an embodiment of the present invention, the color conversion film includes a polyester resin.

In the light source unit according to an embodiment of the present invention, the organic luminescent material includes a pyrromethene derivative.

In the light source unit according to an embodiment of the present invention, the organic luminescent material includes a compound of Formula (1):

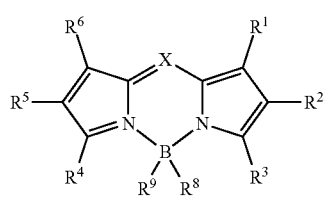

(1)

wherein X is C—$R^7$ or N; $R^1$ to $R^9$ are the same as or different from each other, and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring each formed between adjacent substituents.

In the light source unit according to an embodiment of the present invention, in the Formula (1), X is C—$R^7$, $R^7$ being a group of Formula (2):

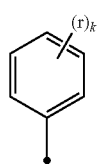

(2)

wherein r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group; k is an integer of 1 to 3; and, when k is 2 or larger, rs are the same as or different from each other.

In the light source unit according to an embodiment of the present invention, in the Formula (1), $R^1$, $R^3$, $R^4$, and $R^6$ are the same as or different from each other, and are a substituted or unsubstituted aryl group.

In the light source unit according to an embodiment of the present invention, a light diffusion film is laminated on either or both faces of the color conversion films.

In the light source unit according to an embodiment of the present invention, a prism sheet is provided on a light emission face of the color conversion film.

In the light source unit according to an embodiment of the present invention, the color conversion film and the laminated film are laminated.

In the light source unit according to an embodiment of the present invention, a functional layer is provided between the color conversion film and the laminated film, and a refraction index n3 of the functional layer is between a refraction index n1 of the laminated film and a refraction index n2 of the color conversion film.

In the light source unit according to an embodiment of the present invention, the color conversion film or the laminated film arranged is kept separated from the light emitting body.

A display according to an embodiment of the present invention includes the light source unit according to the above-mentioned invention.

18. A lighting device according to an embodiment of the present invention includes the light source unit according to the above-mentioned invention.

The light source unit according to the present invention is capable of offering both higher brightness and enhanced color reproducibility, and being suitably used for displays and lighting devices.

DETAILED DESCRIPTION OF EMBODIMENTS OF THE INVENTION

Embodiments of the present invention will be described in detail below. However, the present invention is not intended to be limited to the embodiments including Examples below, and various modifications may be made with achieving the object of the invention and without departing from the spirit of the invention.

<Light Source Unit>

A light source unit according to the present invention includes a light emitting body and a color conversion film. The light emitting body includes a light source and a phosphor layer including a green phosphor and formed on the light source. The color conversion film includes an organic luminescent material configured to convert at least a part of incident light incident from the light emitting body into light having a wavelength longer than that of the incident light. The organic luminescent material has a light emission wavelength peak in a wavelength region of 580 nm or longer and 750 nm or shorter.

The light source unit is capable of emitting white light with a mechanism described below. For example, a case of employing a blue light source as the light source is now discussed. In this case, at least a part of blue light emitted from the light source is absorbed into the green phosphor in the phosphor layer, and converted into green light. A part of light penetrating the phosphor layer is absorbed into the organic luminescent material in the color conversion film, and converted into red light having a light emission wavelength peak in a wavelength region of 580 nm or longer and 750 nm or shorter. Thus, light emitted from the light source finally turns into a mixed light of blue light, green light, and red light, and accordingly white light emission can be achieved.

Figure 1A:
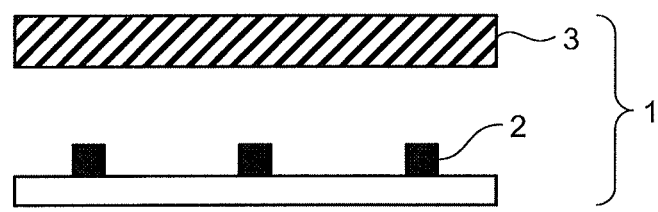
FIG. 1A is a schematic sectional view illustrating an example of a light source unit according to the present invention.

A method for arranging the light emitting body and the color conversion film is not particularly limited here. FIG. 1A is a diagram illustrating what is called a direct-lit type configuration. In FIG. 1A, a light emitting body 2 and a color conversion film 3 are arranged so as to face each other. Between the light emitting body 2 and the color conversion film 3, an air layer may be arranged or a highly transparent resin may be filled.

Figure 1B:
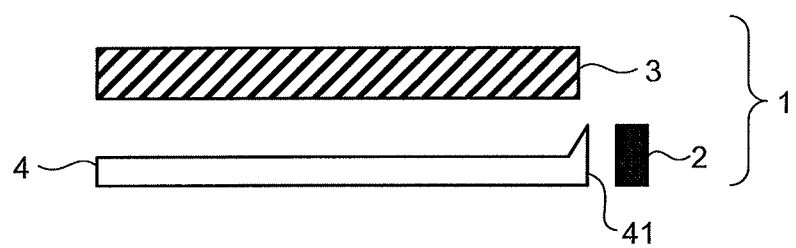
FIG. 1B is a schematic sectional view illustrating another example of the light source unit according to an embodiment of the present invention.

FIG. 1B is a diagram illustrating what is called an edge-lit type configuration. In FIG. 1B, a light-guiding plate 4 and a color conversion film 3 are arranged so as to face each other. The light-guiding plate 4 has, at an edge thereof, an incidence face 41 on which light from the light emitting body 2 is incident. The light-guiding plate 4 is configured to change the direction of travel of light incident upon the incidence face 41 from the light emitting body 2 to a direction perpendicular to the light emitting body 2, in other words, a direction toward the color conversion film 3.

Figure 1C:
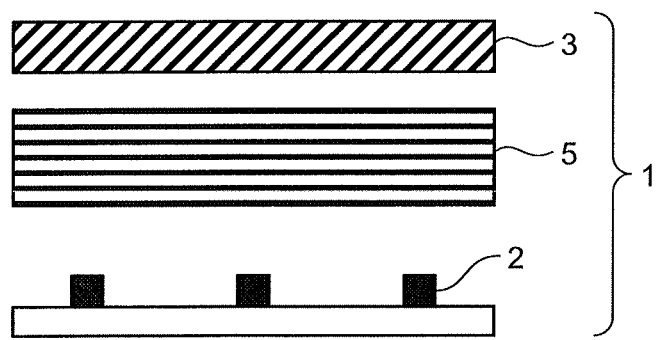
FIG. 1C is a schematic sectional view illustrating another example of the light source unit according to an embodiment of the present invention.

FIG. 1C is a diagram illustrating the configuration of another embodiment of a light source unit 1 according to an embodiment of the present invention. As illustrated in FIG. 1C, a laminated film 5 including eleven or more of alternating layers of different thermoplastic resins may be provided between a light emitting body 2 and a color conversion film 3.

Also in the case where the light source unit 1 according to an embodiment of the present invention has a configuration other than the above-described configurations, an optical film, such as a diffusing plate, a reflecting film, or a polarizing reflecting film, is preferably interposed in the light source unit 1. Furthermore, in order to enhance color purity, the light source unit 1 may be configured to further include a color filter.

<Light Emitting Body>

The light emitting body includes a light source and a layer including a green phosphor and formed on the light source.

(Light Source)

The type of the light source is not particularly limited, but, preferred is a light source that exhibits light emission in a wavelength region in which the green phosphor described later can absorb light. Examples of the light source include a hot cathode tube, a cold cathode tube, a fluorescent light source such as inorganic electroluminescence, an organic electroluminescent element light source, an LED light source, and an incandescent light source. An LED light source is particularly preferred. In display and lighting device applications, from the viewpoint of enhancing the color purity of blue light, a blue LED light source having a light emission peak wavelength in a range of 400 nm to 500 nm is still more preferred.

The light source may have one light emission peak or may have two or more light emission peaks. To enhance the color reproduction range of displays and lighting devices, the light source preferably has one light emission peak. Alternatively, light sources having different light emission peaks may be used arbitrarily in combination.

To enhance the color purity of blue light, the lower limit of the light emission peak wavelength is more preferably 430 nm or longer, still more preferably 440 nm or longer, and particularly preferably 445 nm or longer.

To make an overlap between green and blue emission spectra smaller, light emission whose peak wavelength is observed in a region of 500 nm or shorter is preferably used as blue light emission. To further increase the effect, the upper limit of the light emission peak wavelength of the light source is more preferably 480 nm or shorter, still more preferably 470 nm or shorter, and particularly preferably 465 nm or shorter.

To further enhance the color purity of blue light, the full width at half maximum of the light emission peak wavelength of blue light is preferably 30 nm or shorter, and more preferably 25 nm or shorter.

(Phosphor Layer)

The phosphor layer includes a green phosphor. The phosphor layer preferably includes mainly a green phosphor and a matrix resin. Furthermore, the phosphor layer may include other components, as needed. The other components that the phosphor layer may include are the same as those included in a phosphor composition described later.

The film thickness of the phosphor layer is not particular limited, but, is preferably 10 μm or larger and 1,000 μm or smaller from the viewpoint of the ease of molding. From the viewpoint of enhancing heat resistance, the film thickness of the phosphor layer is preferably 500 μm or smaller, more preferably 300 μm or smaller, and still more preferably 200 μm or smaller.

In the present invention, the film thickness of a layer or a sheet refers to a film thickness (average film thickness) measured based on the method A for determination of thickness by mechanical scanning in JIS K 7130 (1999) "Plastics-Film and sheeting-Determination of thickness".

The phosphor layer can be obtained by molding a phosphor composition or phosphor sheet described later. At the molding step, a matrix resin may be cured, as needed.

The phosphor layer is not particularly limited in shape, but a sheet type is preferably used. To obtain a sheet-shaped phosphor layer, the later-mentioned method for producing a phosphor sheet can be employed.

The arrangement of the phosphor layer is not particularly limited. The phosphor layer may be in contact with the light source or may be separated from the light source.

(Green Phosphor)

The green phosphor is preferably a phosphor configured to be excited with light emitted from the light source and exhibit light emission in which a peak wavelength is observed in a region of 500 nm or longer and 580 nm or shorter. Hereinafter, light emission in which a peak wavelength is observed in a range of 500 nm or longer and 580 nm or shorter is referred to as "green light emission".

In the case where blue light having a wavelength in a range of 400 nm or longer and 500 nm or shorter is used as excitation light, light emission in which a peak wavelength is observed in a region of 500 nm or longer is preferably used as green light emission. This is because, in this case, an overlap between blue and green emission spectra is smaller, and accordingly the color reproducibility of the light source unit is enhanced. From the viewpoint of further increasing the effect, the lower limit of the light emission peak wavelength of the green phosphor is more preferably 515 nm or longer, still more preferably 525 nm or longer, and particularly preferably 535 nm or longer.

To make an overlap between green and red emission spectra smaller, light emission in which a peak wavelength is observed in a region of 580 nm or shorter is preferably used as green light emission. From the viewpoint of increasing the effect, the upper limit of the light emission peak wavelength of the green phosphor is more preferably 560 nm or shorter, still more preferably 550 nm or shorter, and particularly preferably 545 nm or shorter. In the present invention, the light emission wavelength peak is particularly preferably 535 nm or longer and 545 nm or shorter. When the light emission peak is in this range, the light source unit with high brightness and excellent color reproducibility can be achieved.

To further enhance the color purity of green light, the full width at half maximum of the light emission peak of the green phosphor is preferably 55 nm or shorter, more preferably 50 nm or shorter, and particularly preferably 45 nm or shorter.

Examples of such a green phosphor include an Eu-activated chlorosilicate phosphor, an Eu-activated β-sialon phosphor, an Eu-activated thiogallate phosphor, a rare-earth aluminate phosphor, a lanthanum silicon nitride-based phosphor, a Ce-activated lutetium aluminum garnet phosphor, a nano-crystal, and a quantum dot. These green phosphors may be used alone or in combination of two or more of them. Among these phosphors, an Eu-activated β-sialon phosphor is particularly preferably used because this phosphor has a narrower full width at half maximum at a light emission wavelength peak and is excellent in durability.

The green phosphor content of the phosphor layer is not particularly limited, but is suitably selected depending on the type of the green phosphor, for example. Usually, the green phosphor content is preferably 3 parts by weight or larger, and more preferably 10 parts by weight or larger, with respect to 100 parts by weight of a matrix resin component. Furthermore, the green phosphor content is preferably 900 parts by weight or smaller, and more preferably 800 parts by weight or smaller.

(Matrix Resin)

The phosphor layer preferably includes a matrix resin. Examples of the matrix resin include a silicone resin, an epoxy resin, a polyarylate resin, a PET modified polyarylate resin, a polycarbonate resin, a cyclic olefin, a polyethylene terephthalate resin, a polymethyl methacrylate resin, a polypropylene resin, a modified acrylic resin, a polystyrene resin, and an acrylonitrile-styrene copolymer resin. From the viewpoint of transparency, a silicone resin and an epoxy resin are preferred. Furthermore, from the viewpoint of heat resistance, a silicone resin is particularly preferred.

As the silicone resin to be used in the present invention, a curable silicone resin is preferred. The resin may be composed of single liquid component or two liquid components (three liquid components). Examples of the curable silicone resin that cause a condensation reaction with moisture in the air or a catalyst include de-alcoholic, de-oxime, de-acetic acid, and de-hydroxylamine type curable silicone resins. Examples of the curable silicone resin that cause a hydrosilylation reaction with a catalyst include an addition-reacting curable silicone resin. Any of these curable silicone resins may be used. In particular, the addition-reacting silicone resin is more preferred because this resin does not generate a by-product accompanied by a cure reaction, has smaller cure shrinkage, and can be more easily and promptly cured by heating.

As an example, the addition-reacting silicone resin is formed by a hydrosilylation reaction of a compound having an alkenyl group bonded to a silicon atom and a compound having a hydrogen atom bonded to a silicon atom. Examples of such a resin include a resin formed by a hydrosilylation reaction of a compound having an alkenyl group bonded to a silicon atom, such as vinyltrimethoxysilane, vinyltriethoxysilane, allyltrimethoxysilane, propenyltrimethoxysilane, norbornenyltrimethoxysilane, or octenyltrimethoxysilane, and a compound having a hydrogen atom bonded to a silicon atom, such as methylhydrogenpolysiloxane, dimethylpolysiloxane-CO-methylhydrogenpolysiloxane, ethylhydrogenpolysiloxane, or methylhydrogenpolysiloxane-CO-methylphenylpolysiloxane. In addition, as the silicone resin, a known resin described in, for example, Patent Literature 2 (Japanese Patent Application Laid-open No. 2010-159411) may also be utilized.

Furthermore, as the silicone resin, a commercially available resin such as a common silicone sealant in LED applications may also be used. Specific examples of the silicone sealant include OE-6630A/B and OE-6336A/B, manufactured by Dow Corning Toray Co., Ltd., and SCR-1012A/B and SCR-1016A/B, manufactured by Shin-Etsu Chemical Co., Ltd.

The silicone resin may have a hot-melt property. This is because, when the phosphor layer has a hot-melt property, the phosphor layer can be heated and stuck onto an LED chip in a later-mentioned method for a phosphor sheet. Here, the hot-melt property means the property of softening when heated. When the phosphor sheet has a hot-melt property, it is not necessary to use an adhesive for the sticking of the sheet onto the LED chip, and accordingly, a production process can be simpler. The phosphor layer having a hot-melt property means a phosphor layer having a storage elastic modulus at 25° C. of 0.1 MPa or higher and a storage elastic modulus at 100° C. of lower than 0.1 MPa.

A particularly preferred example of the silicone resin having a hot-melt property is a crosslinked product obtained when a crosslinkable silicone composition is subjected to a hydrosilylation reaction as described in Patent Literature 3 (Japanese Patent Application Laid-open No. 2013-1791). The storage elastic modulus of this crosslinked product decreases at temperatures from 60° C. to 250° C., and the crosslinked product acquires higher adhesiveness when heated, and hence, the crosslinked product can be preferably used as the matrix resin for a phosphor sheet that needs no adhesive.

The ratio of the matrix resin with respect to total solids in the phosphor layer is preferably 10% by weight or higher and 90% by weight or lower. When the ratio of the matrix resin is in the above-mentioned range, the durability of the phosphor layer is enhanced.

(Other Components)

As the other components, for example, fine particles, such as fumed silica, glass powder, or quartz powder, an inorganic filler or a pigment, such as titanium oxide, zirconia oxide, barium titanate, or zinc oxide, a flame retardant, a heat-resistant agent, an antioxidant, a dispersant, a solvent, and a tackifier, such as a silane coupling agent or a titanium coupling agent, may be blended in the phosphor layer, as needed, to the extent of not impairing the effects of the present invention.

(Phosphor Composition)

A phosphor composition can be used for molding the phosphor layer. The above-described green phosphor and matrix resin, and, if needed, the other components and a solvent are mixed in their respective predetermined amounts. After the above-mentioned components are mixed to achieve a predetermined composition, the mixture is homogeneously mixed and dispersed using a stirring-kneading machine such as a homogenizer, a rotating-revolving stirrer, a three-roller, a ball mill, a planetary ball mill, or a bead mill, whereby a phosphor composition is obtained. Defoaming under a vacuum or reduced pressure condition is preferably performed after or during the mixing and dispersing process. A specific component may be previously mixed in, or treatment such as aging may be carried out. The solvent may be removed using an evaporator to achieve a desired solid content concentration.

(Method for Producing Light Emitting Body by Using Phosphor Composition)

FIG. 2A, FIG. 2B, FIG. 2C, and FIG. 2D illustrate an example of a preferred method for producing an LED package as the light emitting body by using a phosphor composition. Note that the method for producing the light emitting body is not limited to a method described below.

The production method using the phosphor composition particularly preferably includes at least the steps of: (A) pouring the phosphor composition into a package frame; and (B) sealing in the package with a sealant after the pouring step.

Figure 2A:
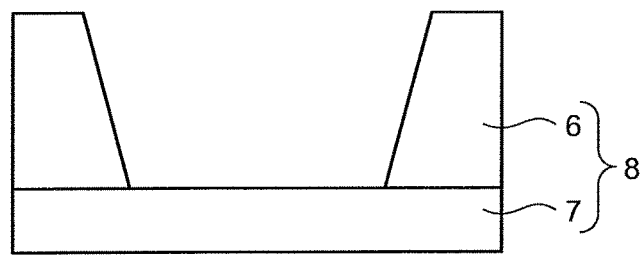
FIG. 2A is a sectional view for describing an example of a method for producing a light emitting body of the light source unit according to an embodiment of the present invention.
Figure 2B:
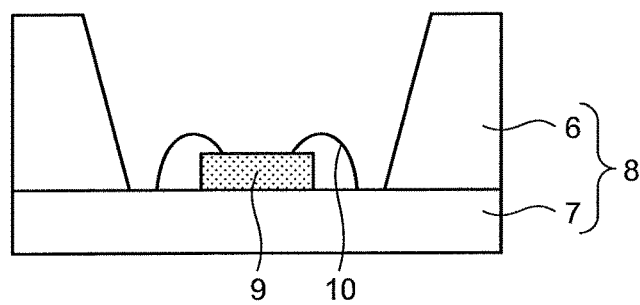
FIG. 2B is a sectional view for describing the example of the method for producing the light emitting body of the light source unit according to an embodiment of the present invention.

Specifically, as illustrated in FIG. 2A, a printed circuit board 7 provided with a reflector 6 is first prepared as a package frame 8. As illustrated in FIG. 2B, an LED chip 9 using wire 10 is mounted on the prepared printed circuit board 7.

Figure 2C:
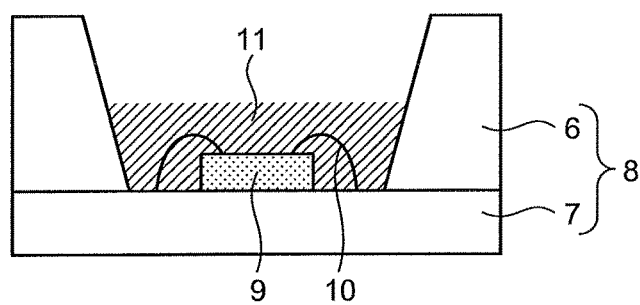
FIG. 2C is a sectional view for describing the example of the method for producing the light emitting body of the light source unit according to an embodiment of the present invention.

Next, as illustrated in FIG. 2C, the phosphor composition is poured in a desired amount into the package frame 8 mounted with the LED chip 9. Examples of a method for pouring the phosphor composition include methods, such as injection molding, compression molding, casting, transfer molding, coating, potting (dispensing), printing, and transfer, but the method for pouring the phosphor composition is not limited to these methods. Potting (dispensing) is particularly preferably employed.

After the phosphor composition is poured, the phosphor composition is thermoset so that the phosphor composition with a form matching the form of a package can be provided on the LED chip 9. The thermosetting can be carried out using a common heating device such as a hot air dryer or an infrared dryer. The thermosetting is carried out under conditions of usually a temperature of 40° C. to 250° C. and a thermosetting time of 1 minute to 5 hours, and preferably a temperature of 60° C. to 200° C. and a thermosetting time of 2 minutes to 4 hours. In this case, stepwise thermosetting, such as step-cure, may be applied.

Figure 2D:
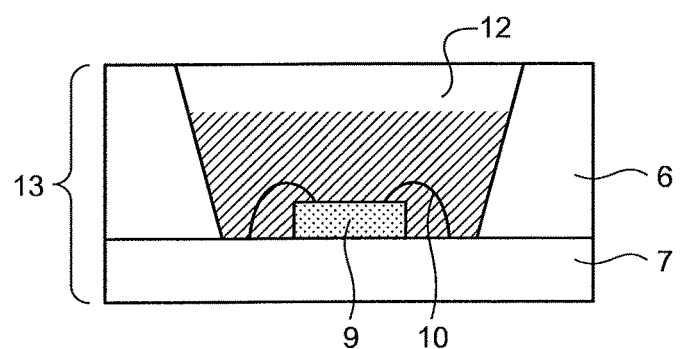
FIG. 2D is a sectional view for describing the example of the method for producing the light emitting body of the light source unit according to an embodiment of the present invention.

Subsequently, as illustrated in FIG. 2D, a transparent sealant 12 is poured and thermoset to seal in the LED chip 9. At this time, a pouring method and thermosetting conditions follow the above-described conditions for the phosphor composition. Thus, an LED package 13 is produced. Note that, although not illustrated, for example, an overcoat layer made of a transparent resin or a lens may be provided on the transparent sealant 12, as needed.

Figure 3A:
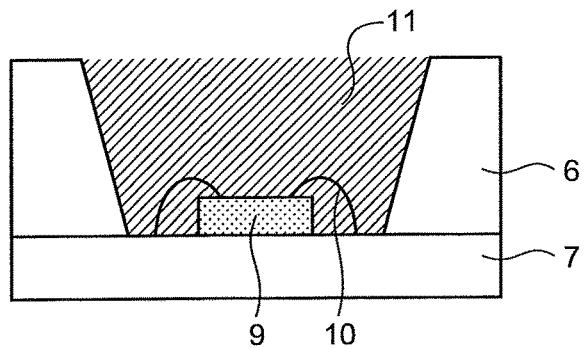
FIG. 3A is a schematic sectional view illustrating a configuration example of the light emitting body in the light source unit according to an embodiment of the present invention.
Figure 3B:
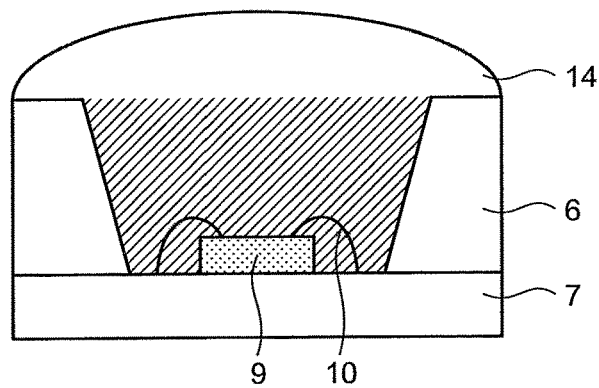
FIG. 3B is a schematic sectional view illustrating another configuration example of the light emitting body in the light source unit according to an embodiment of the present invention.
Figure 3C:
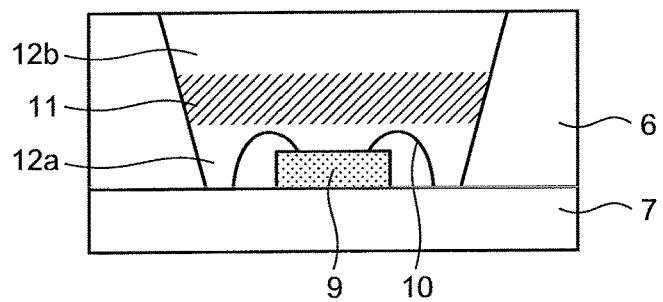
FIG. 3C is a schematic sectional view illustrating another configuration example of the light emitting body in the light source unit according to an embodiment of the present invention.
Figure 3D:
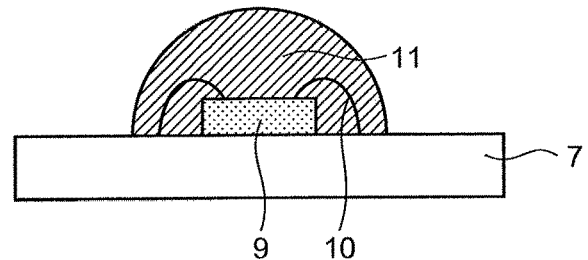
FIG. 3D is a schematic sectional view illustrating another configuration example of the light emitting body in the light source unit according to an embodiment of the present invention.

FIG. 3A, FIG. 3B, FIG. 3C, and FIG. 3D each illustrate preferred examples of light emitting bodies produced by methods using the phosphor composition. A configuration illustrated in FIG. 3A is the same as the configuration illustrated in FIG. 2D, except that the transparent sealant 12 is not used, and a resin of a phosphor layer 11 also serves as a sealant. A configuration illustrated in FIG. 3B is the same as the configuration illustrated in FIG. 3A, except that a lens 14 is formed on the top face of the phosphor layer 11. A configuration illustrated in FIG. 3C is the same as the configuration illustrated in FIG. 2D, except that a configuration of a transparent sealant 12a/the phosphor layer 11/a transparent sealant 12b is applied. A configuration illustrated in FIG. 3D is an example of a light emitting body in which the phosphor layer 11 is formed in the form of a lens without using the reflector 6.

As the transparent sealant, a known material excellent in, for example, molding processability, transparency, heat resistance, and adhesiveness may be used. Examples of the material include an epoxy resin, a silicone resin (including organopolysiloxane cured products (crosslinked products) such as silicone rubber and silicone gel), a urea resin, a fluororesin, and a polycarbonate resin. As a transparent adhesive, the above-mentioned transparent sealant may be used.

(Phosphor Sheet)

For molding the phosphor layer, a phosphor sheet may be used. The phosphor sheet is formed by making the phosphor composition into a sheet. The phosphor sheet includes a green phosphor, and preferably includes mainly a green phosphor and a matrix resin. The green phosphor and the matrix resin, and other components that may be included in the phosphor sheet are the same as those included in the above-described phosphor composition.

The thickness of the phosphor sheet is not particular limited, but, is preferably 10 μm or larger and 1,000 μm or smaller. The phosphor sheet having a thickness of 10 μm or larger leads to enhancement of uniformity in the film thickness of the sheet. The phosphor sheet having a thickness of 1,000 μm or smaller leads to enhancement of the cracking resistance of the sheet. The thickness of the phosphor sheet is more preferably 30 μm or larger and 300 μm or smaller.

From the viewpoint of enhancing the heat resistance of the phosphor sheet, the film thickness of the phosphor sheet is preferably 200 μm or smaller, more preferably 100 μm or smaller, and still more preferably 50 μm or smaller.

From the viewpoints of storage, transportation, and processability, the phosphor sheet preferably has high elasticity at temperatures around room temperature. In contrast, from the viewpoint of changing a shape so as to follow the shape of the light source and making the sheet stuck fast onto the light extraction face of the light source, the phosphor sheet preferably has low elasticity under a certain temperature condition and thus exhibits flexibility, close-adhesiveness, and fluidity. The phosphor sheet may be a laminate provided with other layers. Examples of the other layers include a base material and a barrier layer.

(Base Material)

As the base material, for example, known metal, film, glass, ceramics, and paper can be used without any particular limitation. Specific examples of the base material include plates or foils made of metals such as aluminum (including aluminum alloy), zinc, copper, and iron; films made of plastics such as cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin, a copolymer of tetrafluoroethylene and ethylene (ETFE) as a thermoplastic fluorocarbon resin; films made of plastics such as an α-polyolefin resin, a polycaprolactone resin, an acrylic resin, a silicone resin, and copolymer resins of these resins with ethylene; papers laminated with the above-mentioned plastics or papers coated with the above-mentioned plastics, papers laminated or vapor-deposited with the above-mentioned metals, and plastic films laminated or vapor-deposited with the above-mentioned metals. In addition, when the base material is a metal plate, the surface of the metal plate may be subjected to chromium-based or nickel-based plating treatment or ceramic treatment.

The thickness of the base material is not particularly limited, but the lower limit thereof is preferably 25 μm or larger, and more preferably 38 μm or larger. Furthermore, the upper limit of the thickness of the base material is preferably 5,000 μm or smaller, and more preferably 3,000 μm or smaller.

(Other Layers)

The barrier layer is not particularly limited and is suitably used, for example, to provide the phosphor sheet with enhanced gas barrier properties. Examples of the barrier layer include metal oxide thin films made of silicon oxide, aluminum oxide, tin oxide, indium oxide, yttrium oxide, magnesium oxide, mixtures thereof, and what are obtained by adding other elements to the above-mentioned oxides; and films made of various resins, such as polyvinylidene chloride, an acrylic resin, a silicone resin, a melamine resin, a urethane resin, and a fluororesin. Examples of a film having a barrier function against moisture include films made of various resins, such as polyethylene, polypropylene, nylon, polyvinylidene chloride, a copolymer of vinylidene chloride and vinyl chloride, a copolymer of vinylidene chloride and acrylonitrile, and a fluororesin.

Depending on a function required for the phosphor sheet, the phosphor sheet may further include an auxiliary layer having an antireflection function, an antiglare function, an antireflection antiglare function, a light diffusing function, a hard coat function (a friction resistance function), an antistatic function, an antifouling function, an electromagnetic wave shielding function, an infrared ray cutting function, an ultraviolet ray cutting function, a polarizing function, or a toning function.

(Method for Producing Phosphor Sheet)

The phosphor sheet can be prepared using the above-described phosphor composition. The phosphor composition prepared using the above-described method is applied onto the base material and dried to prepare a phosphor sheet laminate. The application can be carried out using a reverse roll coater, a blade coater, a slit die coater, a direct gravure coater, an offset gravure coater, a kiss coater, a natural roll coater, an air knife coater, a roll blade coater, a two stream coater, a rod coater, a wire bar coater, an applicator, a dip coater, a curtain coater, a spin coater, or a knife coater. Here, to obtain uniformity in the film thickness of the phosphor sheet, the application is preferably performed using a slit die coater.

The drying of the phosphor sheet can be carried out using a common heating device such as a hot air dryer or an infrared dryer. The heating of the phosphor sheet can be carried out using a common heating device such as a hot air dryer or an infrared dryer. At this time, the heating is performed under conditions of usually a temperature of 40° C. to 250° C. and a heating time of 1 minute to 5 hours, and preferably a temperature of 60° C. to 200° C. and a heating time of 2 minutes to 4 hours. Furthermore, stepwise thermosetting such as step-cure may be employed.

After preparing the phosphor sheet laminate, the base material may be changed, as needed. In this case, examples of a simpler method for changing the base material include a method of re-laminating the base material by using a hot plate and a method using a vacuum laminator or a dry film laminator.

The phosphor sheet can also be stuck using an adhesive such as a transparent resin, without being directly stuck onto a light source. Covering the light-emitting face of the light source with the phosphor sheet is preferred because such covering can cause light from the light source to directly enter the phosphor sheet without loss of the light due to reflection or other reasons. Thus, white light having small variations in color, offering higher efficiency, and having uniformity can be achieved.

(Method for Producing Light-Emitting Body by Using Phosphor Sheet)

FIG. 4A, FIG. 4B, FIG. 4C, FIG. 4D, and FIG. 4E illustrate an example of a light emitting body by using the phosphor sheet. Note that the following descriptions merely indicate an example of the production method, and the production method is not limited by the descriptions.

Specifically, the method for producing a light-emitting body by using the phosphor sheet includes mainly three steps. A first step is the step of making the phosphor sheet into pieces. A second step is the step of picking up the pieces of the phosphor sheet. A third step is the step of sticking the picked-up phosphor sheet onto the light source. Note that the production method may further include other steps, as needed.

Hereinafter, an example will be described in which the phosphor sheet is formed on the base material, and a product obtained by forming the phosphor sheet on the base material is made into pieces, and a piece thereof is stuck onto an LED chip serving as the light source.

(Step of Making Phosphor Sheet into Pieces)

The phosphor sheet can be made into pieces by a method, such as punching by a mold, laser processing, dicing, or cutting. At this time, the phosphor layer may be in a semi-cured state or may be cured in advance. Laser processing releases high energy, and therefore, it is very difficult to avoid the burning of a resin or deterioration of the phosphor, and therefore, cutting using a cutter is preferred.

Figure 4A:
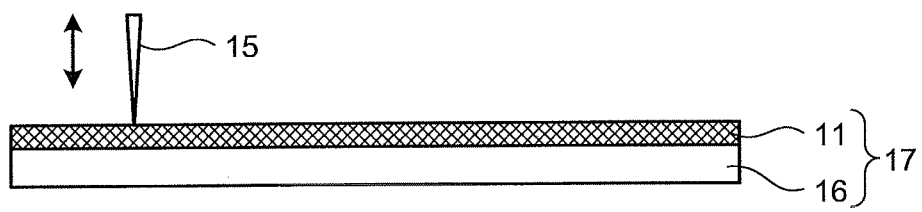
FIG. 4A is a sectional view for describing an example of a method for producing the light emitting body of the light source unit according to an embodiment of the present invention.
Figure 4B:
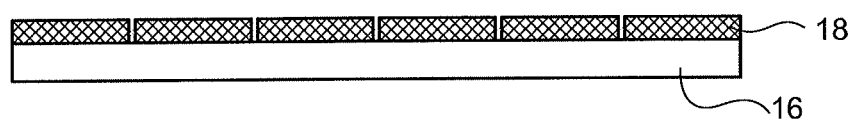
FIG. 4B is a sectional view for describing the example of the method for producing the light emitting body of the light source unit according to an embodiment of the present invention.

FIG. 4A and FIG. 4B illustrate an example of cutting the phosphor layer 11 with the cutter 15. At this time, phosphor layer pieces 18 are in a state of being stuck on the base material 16.

The phosphor layer 11 may be subjected to processing for boring a hole before or after the fragmenting step or simultaneously with the fragmenting step. For the processing of boring a hole, a known method such as laser processing or punching with a mold can be preferably used, but, laser processing causes the burning of a resin or deterioration of the phosphor, and hence, punching with a mold is more preferred.

(Step of Picking-Up Pieces of Phosphor Sheet)

Figure 4C:
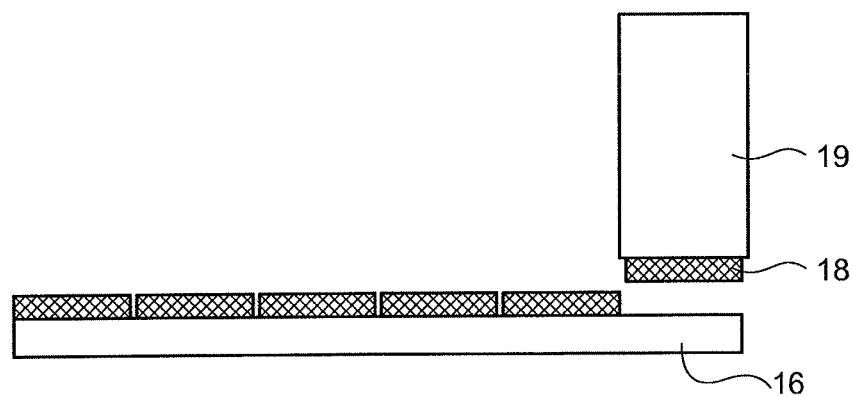
FIG. 4C is a sectional view for describing the example of the method for producing the light emitting body of the light source unit according to an embodiment of the present invention.

At the pick-up step, the phosphor layer 11 is picked up by a pickup device equipped with a suction unit, such as a collet. FIG. 4C illustrates an example of the step of picking up a phosphor layer piece 18 by a collet 19.

(Step of Sticking Picked-Up Phosphor Sheet onto LED Chip)

Figure 4D:
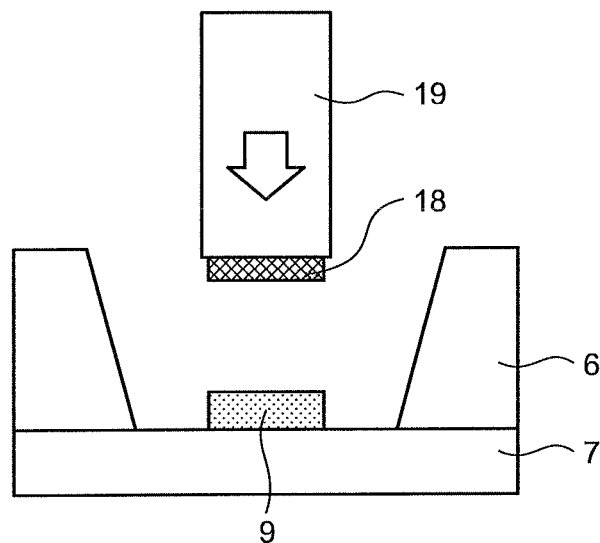
FIG. 4D is a sectional view for describing the example of the method for producing the light emitting body of the light source unit according to an embodiment of the present invention.

FIG. 4D illustrates the step of transporting the picked-up phosphor layer piece 18 with the collet 19 and sticking the piece onto an LED chip 9.

Specifically, the collet 19 having picked-up the phosphor layer piece 18 is transported and the piece is stuck onto the light extraction face of the LED chip 9. At this time, a reflector may be formed around the LED chip. For the sticking, an adhesive (not illustrated) is preferably used. As the adhesive, known die-bonding agents and adhesives can be used. For example, adhesives of an acrylic resin, an epoxy resin, a urethane resin, a silicone resin, a modified silicone resin, a phenol resin, a polyimide resin, a polyvinyl alcohol resin, a polymethacrylate resin, a melamine resin, and a urea resin may be used. In the case where the phosphor layer has adhesiveness, this adhesiveness may be used in place of an adhesive.

(Subsequent Step)

Subsequently, an electrode of the LED chip 9 and circuit wiring of a circuit board are electrically connected by a known method, whereby a light emitting body can be obtained. In the case where the LED chip 9 has an electrode on the light extraction face side thereof, the electrode on the top face of the LED chip 9 and circuit wiring of the circuit board may be connected by wire-bonding. In the case where the LED chip 9 is a flip chip having an electrode pad provided on a face opposite to the light-emitting face, the electrode face of the LED chip 9 faces the circuit wiring of the circuit board, and the LED chip 9 and the circuit board are butt-joined for connection. The connection of the circuit board with the LED chip 9 may be performed before the sticking of the picked-up phosphor layer piece 18.

Figure 4E:
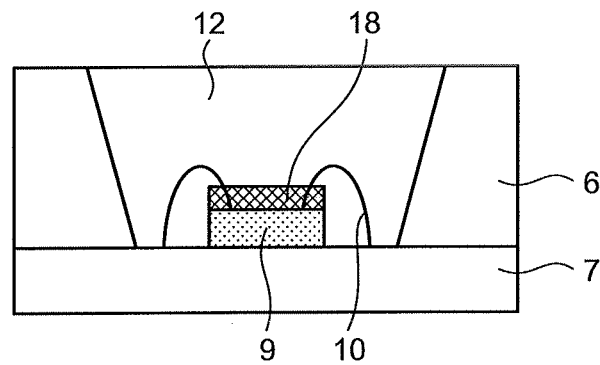
FIG. 4E is a sectional view for describing the example of the method for producing the light emitting body of the light source unit according to an embodiment of the present invention.

As illustrated in FIG. 4E, after the attachment of the phosphor layer piece 18, the LED chip 9 is electrically connected to a substrate by wire 10, and subsequently, the LED chip 9 may be sealed in by the transparent sealant 12. From the viewpoints of transparency and heat resistance, a silicone resin is preferably used as the transparent sealant 12.

In the case where a face-up type LED chip 9 is applied, the phosphor layer is made into pieces in the same manner as described above, and subsequently, a piece thereof is stuck onto the light extraction face of the LED chip 9. Subsequently, a face opposite to the light extraction face of the LED chip 9 is fixed to a circuit board, and the LED chip 9 and the circuit board are electrically connected by a known method, such as wire bonding, whereby a light-emitting body can be obtained.

Alternatively, in a modification example, a piece of the phosphor layer may be stuck onto an LED chip in the state of being mounted on a substrate.

FIG. 5A, FIG. 5B, FIG. 5C, and FIG. 5D each illustrate preferred examples of light emitting bodies produced by methods using the phosphor sheet. In a configuration illustrated in FIG. 5A, the LED chip 9 is connected to an electrode 20 via a gold bump 21, and the phosphor sheet 11 is stuck on the top face of the LED chip 9.

Figure 5A:
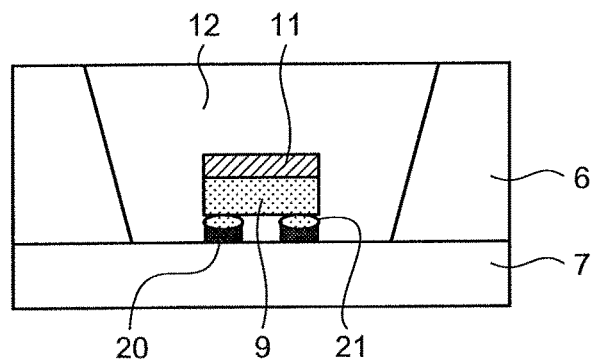
FIG. 5A is a schematic sectional view illustrating a configuration example of the light emitting body of the light source unit according to an embodiment of the present invention.
Figure 5B:
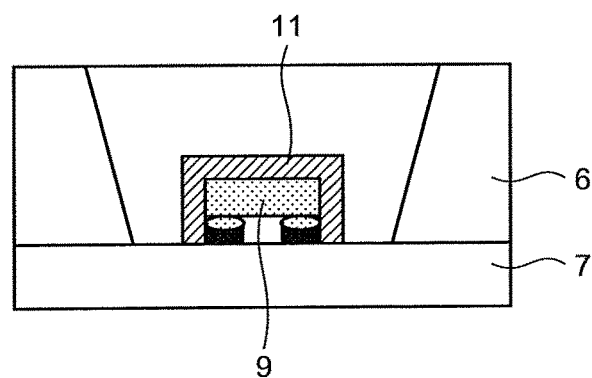
FIG. 5B is a schematic sectional view illustrating another configuration example of the light emitting body in the light source unit according to an embodiment of the present invention.

In a configuration illustrated in FIG. 5B, the phosphor sheet 11 is stuck on not only the top face but also the side face of the LED chip 9. This aspect is preferred because a wavelength of light emitted from the side face of the LED chip 9 can also be converted.

Figure 5C:
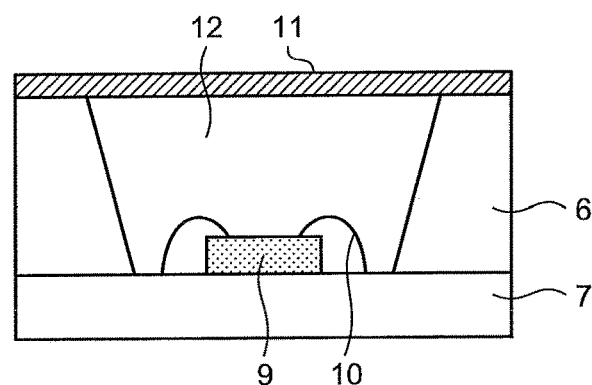
FIG. 5C is a schematic sectional view illustrating another configuration example of the light emitting body in the light source unit according to an embodiment of the present invention.

In a configuration illustrated in FIG. 5C, the phosphor sheet 11 is stuck not only on the top face of the LED chip 9 but also on the top face of the transparent sealant 12.

Figure 5D:
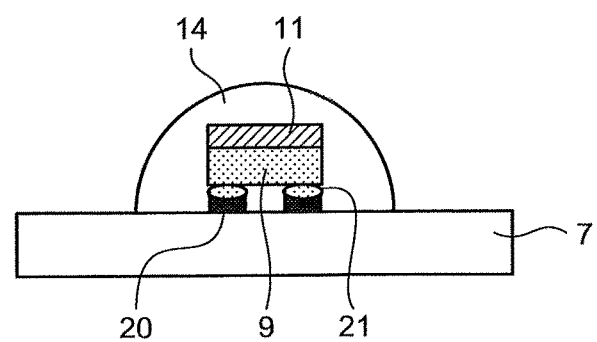
FIG. 5D is a schematic sectional view illustrating another configuration example of the light emitting body in the light source unit according to an embodiment of the present invention.

In a configuration illustrated in FIG. 5D, the LED chip 9 is sealed in by a lens 14 without using a reflector or the transparent sealant 12.

Note that the LED package 13 to which a phosphor sheet is applicable is not limited to the above-described packages. The configurations of the components illustrated in FIG. 2A to FIG. 5D can be used in combination. Alternatively, the components in FIG. 2A to FIG. 5D may be replaced with or used in combination with known components other than these components. As a transparent sealant and a transparent adhesive, the above-mentioned sealants and adhesives may be used.

<Color Conversion Film>

A color conversion film includes at least one organic luminescent material and functions as a color conversion layer configured to convert incident light into light having a wavelength longer than that of the incident light. The color conversion film is preferably a continuous layer. Here, the continuous layer means a non-divided layer. For example, in the case where a layer is patterned and the patterns are present in the same plane, this layer is regarded as a divided layer, which is not regarded as the continuous layer in the present invention. In contrast, even when a layer partially has a cut or a recess, as long as the layer is integrally configured as a whole, the layer can be regarded as the continuous layer.

The film thickness of the color conversion film is particularly not limited, but is preferably 10 μm or larger and 1,000 μm or smaller, from the viewpoints of the toughness and the ease of molding of the film. From the viewpoint of enhancing heat resistance, the film thickness of the color conversion film is preferably 200 μm or smaller, more preferably 100 μm or smaller, and still more preferably 50 μm or smaller. The color conversion film can be produced using a color conversion composition described later.

(Organic Luminescent Material)

The luminescent material used in the present invention is a material that, when irradiated with any light, emits light having a wavelength different from that of the irradiation light. In order to achieve highly efficient color conversion, a luminescent material that has a higher luminescence quantum yield as a light emission characteristic is preferred. Common examples of the luminescent material include known luminescent material, such as inorganic phosphors, fluorescent pigments, fluorescent dyes, and quantum dots, but, from the viewpoints of achieving uniformity in dispersion, reducing the amount of usage, and reducing a load on environments, organic luminescent materials are preferably employed.

The organic luminescent material used in the present invention preferably emits light whose peak wavelength is observed in a region of 580 nm or longer and 750 nm or shorter when excited by either or both of light emitted from the light source in a wavelength range of 400 nm or longer and 500 nm or shorter or the green phosphor. In the present specification, light emission in which a peak wavelength is observed in a region of 580 nm or longer and 750 nm or shorter is referred to as "red light emission".

A part of light emitted from the light source or the green phosphor penetrates the color conversion film, and therefore, when a blue LED having a sharp light-emission peak is employed as the light source, light emitted from the light source unit exhibits blue, green, and red emission spectra in a sharp form. Thus, white light with sufficient color purity can be achieved. As a result, particularly in displays, a larger color gamut with more vivid colors can be efficiently created.

In addition, in lighting device applications, light emission characteristics in green and red regions are enhanced, compared with a white LED which is currently a mainstream and formed by a combination of a blue LED and a yellow phosphor, and therefore, color reproducibility is enhanced, and accordingly a preferable white light source can be achieved.

As described above, in order to achieve a larger color gamut and enhance color reproducibility, an overlap among blue, green, and red emission spectra is preferably small.

In the case where light emission in which a peak wavelength is observed in a region of 500 nm and longer and 580 nm or shorter is used as green light emission, when light emission in which a peak wavelength is observed in a region of 580 nm or longer is used as red light emission, an overlap in the spectra is smaller, and accordingly color reproducibility is enhanced, which is preferred. From the viewpoint of increasing this effect, the lower limit of the light emission peak wavelength of the organic luminescent material is more preferably 620 nm or longer, still more preferably 630 nm or longer, and particularly preferably 635 nm or longer.

The upper limit of the peak wavelength of the red light is only required to be 750 nm or shorter, which is nearly the upper bound of the visible range, but, the upper limit is more preferably 700 nm or shorter because such upper limit leads to higher visibility. To further increase the effect, the upper limit of the peak wavelength of the organic luminescent material is still more preferably 680 nm or shorter, and particularly preferably 660 nm or shorter.

In order to further enhance the color purity of red light, the full width at half maximum of the light emission peak of the organic luminescent material is preferably 80 nm or shorter, more preferably 70 nm or shorter, still more preferably 60 nm or shorter, and particularly preferably 50 nm or shorter.

The shape of the light emission spectrum is not particularly limited, but is preferably a single peak because such a shape allows the efficient use of excitation energy and leads to higher color purity. Here, the single peak indicates a state in which, in a wavelength region, other than a peak having the highest intensity, there is no peak having an intensity 5% or higher than the intensity of the highest-intensity peak.

In the case where the organic luminescent material is a material that is excited by green light emission and thereby exhibits red light emission, the absorption peak wavelength of the organic luminescent material is preferably 550 nm or longer. When the absorption peak wavelength is 550 nm or longer, an overlap between the absorption peak wavelength and the light emission peak wavelength of the green phosphor is smaller, and thus, decrease in brightness can be substantially avoided. The lower limit of the absorption peak wavelength of the organic luminescent material is more preferably 560 nm or longer, still more preferably 565 nm or longer, and particularly preferably 570 nm or longer.

Furthermore, the absorption peak wavelength of the organic luminescent material is preferably 650 nm or shorter. This is because, when the absorption peak wavelength is 650 nm or shorter, light emission from the green phosphor can be sufficiently absorbed, and accordingly, the light emission intensity of the organic luminescent material is increased. The upper limit of the absorption peak wavelength of the organic luminescent material is more preferably 630 nm or shorter, still more preferably 620 nm or shorter, and particularly preferably 610 nm or shorter.

From the viewpoint of preventing a decrease in the intensity of green light emission, the full width at half maximum of the absorption peak of the organic luminescent material is preferably 80 nm or shorter, more preferably 70 nm or shorter, still more preferably 60 nm or shorter, and particularly preferably 50 nm or shorter. This is because, as the full width at half maximum of the absorption peak of the organic luminescent material is smaller, absorbance in the peak wavelength of light emission from the green phosphor is smaller.

The shape of an absorption spectrum is not particularly limited, but the spectrum preferably has a single peak because such a shape allows the efficient use of excitation energy. Here, the single peak indicates a state in which, in a wavelength region, other than a peak having the highest intensity, there is no peak having an intensity 5% or higher than the intensity of the highest-intensity peak.

When such an organic luminescent material and the green phosphor are used in combination, the light emission wavelength peak of the green phosphor is observed in a wavelength different from a wavelength obtained in the case where the green phosphor is used alone. In other words, the above-mentioned combination makes the peak wavelength of green light emission shorter and the full width at half maximum narrower, and thus the range of color reproduction is further expanded.

Preferred examples of the organic luminescent material include, but are not limited to:

compounds having a condensed aryl ring and derivatives thereof, such as naphthalene, anthracene, phenanthrene, pyrene, chrysene, naphthacene, triphenylene, perylene, fluoranthene, fluorene, and indene;

compounds having a heteroaryl ring and derivatives thereof, such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline, and pyrrolopyridine;

borane derivatives;

stilbene derivatives, such as 1,4-distyrylbenzene, 4,4'-bis(2-(4-diphenylaminophenyl)ethenyl)biphenyl, and 4,4'-bis(N-(stilben-4-yl)-N-phenylamino)stilbene;

aromatic acetylene derivatives, tetraphenylbutadiene derivatives, aldazine derivatives, pyrromethene derivatives, diketopyrrolo[3,4-c]pyrrole derivatives;

coumarin derivatives, such as coumarin 6, coumarin 7, and coumarin 153;

azole derivatives and metal complexes thereof, such as imidazole, thiazole, thiadiazole, carbazole, oxazole, oxadiazole, and triazole;

cyanine-based compounds such as indocyanine green;

xanthene-based compounds and thioxanthene-based compounds, such as fluorescein, eosine, and rhodamine;

polyphenylene-based compounds, naphthalimide derivatives, phthalocyanine derivatives and metal complexes thereof, and porphyrin derivatives and metal complexes thereof;

oxazine-based compounds, such as Nile red and Nile blue;

helicene-based compounds;

aromatic amine derivatives, such as N,N'-diphenyl-N,N'-di(3-methylphenyl)-4,4'-diphenyl-1,1'-diamine; and organic metal complex compounds of, for example, iridium (Ir), ruthenium (Ru), rhodium (Rh), palladium (Pd), platinum (Pt), osmium (Os), and rhenium (Re).

The color conversion film is only required to include at least one of the organic luminescent materials, and may include two or more of the organic luminescent materials. The organic luminescent material may be a fluorescent material or a phosphorescent material, but, from the viewpoint of achieving higher color reproducibility, the organic luminescent material is preferably a fluorescent material. Among these materials, compounds having a condensed aryl ring and derivatives thereof are preferred as the organic luminescent material because of their high thermal-stability and high light-stability. From the viewpoints of solubility and diversity in molecular structure, the organic luminescent material is preferably a compound having a coordinate bond. Also, the organic luminescent material is preferably a compound containing boron, such as a boron fluoride complex, because such a compound has a narrower full width at half maximum and is capable of emitting light efficiently. In particular, the organic luminescent material is preferably a pyrromethene derivative because the derivative has a higher luminescence quantum yield and has good durability. The organic luminescent material is more preferably a compound of Formula (1):

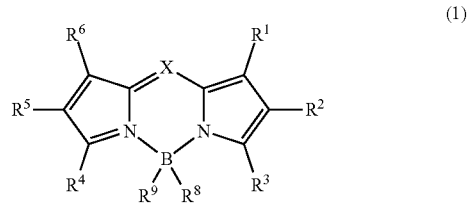

(1)

wherein X is C—$R^7$ or N; $R^1$ to $R^9$ may be the same as or different from each other, and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring each formed between adjacent substituents.

In all of the above-mentioned groups, hydrogen may be deuterium. The same applies to the following compounds or partial structures thereof.

In the following descriptions, for example, a substituted or unsubstituted $C_{6-40}$ aryl group means an aryl group in which the number of all carbon atoms, including the number of carbon atoms contained in a substituent substituted for the aryl group, is 6 to 40. The same applies to other substituents in which the numbers of carbon atoms are defined.

In all of the above-mentioned substituted groups, a substituent in the substituted group is preferably an alkyl group, a cycloalkyl group, a heterocyclic group, an alkenyl group a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, or a phosphine oxide group, and more preferably a specific substituent preferably recited in the descriptions of substituents. These substituents may be further substituted with the above-mentioned substituents.

The "unsubstituted" of the term "substituted or unsubstituted" means that a hydrogen atom or a deuterium atom has been substituted. The same applies to the term "substituted or unsubstituted" used in the following compounds or partial structures thereof.

The alkyl group refers to a saturated aliphatic hydrocarbon group, such as a methyl group, an ethyl group, an n-propyl group, an isopropyl group, an n-butyl group, a sec-butyl group, or a tert-butyl group. This saturated aliphatic hydrocarbon group may or does not necessarily have a substituent. When the group has been substituted, an additional substituent is not particularly limited. Examples of the additional substituent include an alkyl group, halogen, an aryl group, and a heteroaryl group. This point of view is also common to the following descriptions. In addition, the number of carbon atoms in the alkyl group is not particularly limited, but is in a range of preferably 1 or larger and 20 or smaller, and more preferably 1 or larger and 8 or smaller, from the viewpoints of availability and cost.

The cycloalkyl group refers to a saturated alicyclic hydrocarbon group, such as a cyclopropyl group, a cyclohexyl group, a norbornyl group, or an adamantyl group. This saturated alicyclic hydrocarbon group may or does not necessarily have a substituent. The number of carbon atoms in an alkyl group moiety is not particularly limited, but is preferably in a range of 3 or larger and 20 or smaller.

The heterocyclic group refers to an aliphatic ring having an atom, other than carbon, in the ring, such as a pyran ring, a piperidine ring, or a cyclic amide. This heterocyclic group may or does not necessarily have a substituent. The number of carbon atoms in the heterocyclic group is not particularly limited, but is preferably in a range of 2 or larger and 20 or smaller.

The alkenyl group refers to an unsaturated aliphatic hydrocarbon group having a double bond, such as a vinyl group, an allyl group, or a butadienyl group. This unsaturated aliphatic hydrocarbon group may or does not necessarily have a substituent. The number of carbon atoms in the alkenyl group is not particularly limited, but is preferably in a range of 2 or larger and 20 or smaller.

The cycloalkenyl group refers to an unsaturated alicyclic hydrocarbon group having a double bond, such as a cyclopentenyl group, a cyclopentadienyl group, or a cyclohexenyl group. This unsaturated alicyclic hydrocarbon group may or does not necessarily have a substituent.

The alkynyl group refers to an unsaturated aliphatic hydrocarbon group having a triple bond, such as an ethynyl group. This unsaturated aliphatic hydrocarbon group may or does not necessarily have a substituent. The number of carbon atoms in the alkynyl group is not particularly limited, but is preferably in a range of 2 or larger and 20 or smaller.

The alkoxy group refers to a functional group to which an aliphatic hydrocarbon group is bonded through an ether bond, such as a methoxy group, an ethoxy group, or a propoxy group. This aliphatic hydrocarbon group may or does not necessarily have a substituent. The carbon number of the alkoxy group is not particularly limited, but is preferably in a range of 1 or larger and 20 or smaller.

The alkylthio group is a group formed by substituting a sulfur atom for an oxygen atom of an ether bond of an alkoxy group. The hydrocarbon group of the alkylthio group may or does not necessarily have a substituent. The number of carbon atoms in the alkylthio group is not particularly limited, but is preferably in a range of 1 or larger and 20 or smaller.

The aryl ether group refers to a functional group to which an aromatic hydrocarbon group is bonded through an ether bond, such as a phenoxy group. This aromatic hydrocarbon group may or does not necessarily have a substituent. The number of carbon atoms in the aryl ether group is not particularly limited, but is preferably in a range of 6 or larger and 40 or smaller.

The aryl thioether group is a group formed by substituting a sulfur atom for an oxygen atom of an ether bond of an aryl ether group. An aromatic hydrocarbon group in the aryl thioether group may or does not necessarily have a substituent. The number of carbon atoms in the aryl thioether group is not particularly limited, but is preferably in a range of 6 or larger and 40 or smaller.

The aryl group refers to an aromatic hydrocarbon group, such as a phenyl group, a biphenyl group, a terphenyl group, a naphthyl group, a fluorenyl group, a benzofluorenyl group, a dibenzofluorenyl group, a phenanthryl group, an anthracenyl group, a benzophenanthryl group, a benzoanthracenyl group, a chrysenyl group, a pyrenyl group, a fluoranthenyl group, a triphenylenyl group, a benzofluoranthenyl group, a dibenzoanthracenyl group, a perylenyl group, or a helicenyl group. Among these groups, a phenyl group, a biphenyl group, a terphenyl group, a naphthyl group, a fluorenyl group, a phenanthryl group, an anthracenyl group, a pyrenyl group, a fluoranthenyl group, and a triphenylenyl group are preferred. The aryl group may or does not necessarily have a substituent. The number of carbon atoms in the aryl group is not particularly limited, but is in a range of preferably 6 or larger and 40 or smaller, and more preferably 6 or larger and 30 or smaller.

In the case where $R^1$ to $R^9$ are a substituted or unsubstituted aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, still more preferably a phenyl group, a biphenyl group, or a terphenyl group, and particularly preferably a phenyl group.

In the case where each substituent is further substituted with an aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, and particularly preferably a phenyl group.

The heteroaryl group refers to a cyclic aromatic group having one or a plurality of atoms other than carbon in the ring, such as a pyridyl group, a furanyl group, a thiophenyl group, a quinolinyl group, an isoquinolinyl group, a pyrazinyl group, a pyrimidyl group, a pyridazinyl group, a triazinyl group, a naphthylidinyl group, a cinnolinyl group, a phthaladinyl group, a quinoxalinyl group, a quinazolinyl group, a benzofuranyl group, a benzothiophenyl group, an indolyl group, a dibenzofuranyl group, a dibenzothiophenyl group, a carbazolyl group, a benzocarbazolyl group, a carbolinyl group, an indolocarbazolyl group, a benzofurocarbazolyl group, a benzothienocarbazolyl group, a dihydroindenocarbazolyl group, a benzoquinolinyl group, an acridinyl group, a dibenzoacridinyl group, a benzimidazolyl group, an imidazopyridyl group, a benzoxazolyl group, a benzothiazolyl group, or a phenanthrolinyl group. Here, the naphthylidinyl group refers to any of 1,5-naphthylidinyl group, 1,6-naphthylidinyl group, 1,7-naphthylidinyl group, 1,8-naphthylidinyl group, 2,6-naphthylidinyl group, and 2,7-naphthylidinyl group.

The heteroaryl group may or does not necessarily have a substituent. The number of carbon atoms in the heteroaryl group is not particularly limited, but is in a range of preferably 2 or larger and 40 or smaller, and more preferably 2 or larger and 30 or smaller.

In the case where $R^1$ to $R^9$ are a substituted or unsubstituted heteroaryl group, this heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, and particularly preferably a pyridyl group.

In the case where each substituent is further substituted with a heteroaryl group, the heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzoimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, and particularly preferably a pyridyl group.

The halogen refers to an atom selected from fluorine, chlorine, bromine, and iodine.

The carbonyl group, the carboxy group, the oxycarbonyl group, and the carbamoyl group may or do not necessarily have a substituent. Here, examples of the substituent include an alkyl group, a cycloalkyl group, an aryl group, and a heteroaryl group. These substituents may be further substituted.

The amino group is a substituted or unsubstituted amino group. Examples of a substituent in the substituted amino group include an aryl group, a heteroaryl group, a linear alkyl group, and a branched alkyl group. As the aryl group and the heteroaryl group, a phenyl group, a naphthyl group, a pyridyl group, and a quinolinyl group are preferred. These substituents may be further substituted. The number of carbon atoms is not particularly limited, but is in a range of preferably 2 or larger and 50 or smaller, more preferably 6 or larger and 40 or smaller, and particularly preferably 6 or larger and 30 or smaller.

The silyl group refers to an alkylsilyl group, such as a trimethylsilyl group, a triethylsilyl group, a tert-butyldimethylsilyl group, a propyldimethylsilyl group, or a vinyldimethylsilyl group; or an arylsilyl group, such as a phenyldimethylsilyl group, a tert-butyldiphenylsilyl group, a triphenylsilyl group, or a trinaphthylsilyl group. A substituent on silicon may be further substituted. The number of carbon atoms in the silyl group is not particularly limited, but is preferably in a range of 1 or larger and 30 or smaller.

The siloxanyl group refers to a silicon compound group through an ether bond, such as a trimethylsiloxanyl group. A substituent on silicon may be further substituted.

The boryl group is a substituted or unsubstituted boryl group. Examples of a substituent in the substituted group include an aryl group, a heteroaryl group, a linear alkyl group, a branched alkyl group, an aryl ether group, an alkoxy group, and a hydroxy group. Among these groups, an aryl group and an aryl ether group are preferred.

The phosphine oxide group refers to a group represented by —P(=O)$R^{10}R^{11}$. $R^{10}$ and $R^{11}$ are selected from the same groups as those of $R^1$ to $R^9$.

The condensed ring formed between adjacent substituents refers to a ring formed by mutual bonding between any two adjacent substituents (for example, $R^1$ and $R^2$ in Formula (1)) to form a conjugated or non-conjugated cyclic skeleton. Besides carbon, the condensed ring may include a constituent element selected from nitrogen, oxygen, sulfur, phosphorus, and silicon. The condensed ring may further condense with another ring.

The compound of Formula (1) has a high luminescence quantum yield and has a smaller full width at half maximum of a peak in an emission spectrum, and thus enables the achievement of efficient color conversion and higher color purity. Furthermore, by introducing an appropriate substituent into an appropriate portion of the compound of Formula (1), various characteristics and physical properties of the compound, such as light emission efficiency, color purity, thermal stability, light stability, and dispersibility, can be adjusted.

For example, compared with a case in which all of $R^1$, $R^3$, $R^4$, and $R^6$ are hydrogen, a case in which at least one of $R^1$, $R^3$, $R^4$, and $R^6$ is a substituted or unsubstituted alkyl group, a substituted or unsubstituted aryl group, or a substituted or unsubstituted heteroaryl group exhibits better thermal stability and better light stability.

In the case where at least one of $R^1$, $R^3$, $R^4$, and $R^6$ is a substituted or unsubstituted alkyl group, this alkyl group is preferably a $C_{1-6}$ alkyl group, such as a methyl group, an ethyl group, an n-propyl group, an isopropyl group, an n-butyl group, a sec-butyl group, a tert-butyl group, a pentyl group, or a hexyl group. Among these groups, a methyl group, an ethyl group, an n-propyl group, an isopropyl group, an n-butyl group, a sec-butyl group, and a tert-butyl group are more preferred because these groups are more excellent in thermal stability. Furthermore, from the viewpoints of preventing concentration quenching and enhancing a luminescence quantum yield, a sterically bulky tert-butyl group is still more preferred as the alkyl group. From the viewpoint of the ease of synthesis and availability of raw materials, a methyl group is also preferably used as the alkyl group.

In the case where at least one of $R^1$, $R^3$, $R^4$, and $R^6$ is a substituted or unsubstituted aryl group, this aryl group is preferably a phenyl group, a biphenyl group, a terphenyl group, or a naphthyl group, more preferably a phenyl group or a biphenyl group, and particularly preferably a phenyl group.

In the case where at least one of $R^1$, $R^3$, $R^4$, and $R^6$ is a substituted or unsubstituted heteroaryl group, this heteroaryl group is preferably a pyridyl group, a quinolinyl group, or a thiophenyl group, more preferably a pyridyl group or a quinolinyl group, and particularly more preferably a pyridyl group.

$R^1$, $R^3$, $R^4$, and $R^6$ may be the same as or different from each other. $R^1$, $R^3$, $R^4$, and $R^6$ are preferably a substituted or unsubstituted alkyl group because of its good solubility in a binder resin and a solvent. From the viewpoints of the ease of synthesis and the ease of availability of raw materials, a methyl group is preferably used as this alkyl group.

$R^1$, $R^3$, $R^4$, and $R^6$ may be the same as or different from each other. $R^1$, $R^3$, $R^4$, and $R^6$ are preferably a substituted or unsubstituted aryl group or a substituted or unsubstituted heteroaryl group because these groups lead to better thermal stability and better light stability. $R^1$, $R^3$, $R^4$, and $R^6$ may be the same as or different from each other, and are more preferably a substituted or unsubstituted aryl group, and particularly preferably a substituted or unsubstituted phenyl group.

Some substituents are capable of enhancing a plurality of properties, but only a limited number of substituents exhibits sufficient performance in all the properties. In particular, it is difficult to achieve both high light emission efficiency and high color purity. Therefore, by introducing a plurality of substituents, the compound can be balanced in terms of light emission characteristics and color purity, for example.

In particular, $R^1$, $R^3$, $R^4$, and $R^6$ may be the same as or different from each other, and in the case where $R^1$, $R^3$, $R^4$, and $R^6$ are a substituted or unsubstituted aryl group, a plurality of substituents is preferably introduced, for example, in such a manner that $R^1 \neq R^4$, $R^3 \neq R^6$, $R^1 \neq R^3$, or $R^4 \neq R^6$. Here, the symbol "$\neq$" means that groups have different structures. The simultaneous introduction of an aryl group capable of affecting color purity and an aryl group capable of affecting light emission efficiency enables minute adjustment of color purity and light emission efficiency. In particular, a case of $R^1 \neq R^3$ or $R^4 \neq R^6$ is preferred from the viewpoint of enhancing light emission efficiency and color purity with a good balance. In this case, one or more aryl groups having an influence on color purity can be introduced into a pyrrole ring at each end of the compound, while an aryl group having an influence on light emission efficiency can be introduced into any portion other than the pyrrole rings, and thus, both of these properties can be enhanced to the maximum. In the case where $R^1 \neq R^3$ or $R^4 \neq R^6$, $R^1 = R^4$ and $R^3 = R^6$ are more preferred from the viewpoints of heat resistance and color purity.

The aryl group mainly affecting color purity is preferably an aryl group substituted with an electron donating group. Examples of the electron donating group include an alkyl group and an alkoxy group. In particular, a $C_{1-8}$ alkyl group and a $C_{1-8}$ alkoxy group are preferred. A methyl group, an ethyl group, a tert-butyl group, and a methoxy group are more preferred. From the viewpoint of dispersibility, a tert-butyl group and a methoxy group are particularly preferred since the use of these groups prevent quenching due to aggregation of molecules. The substitution position of a substituent is not particularly limited, but twisting of a bond needs to be prevented in order to enhance the light stability, and therefore the substituent is preferably bonded at a meta- or para-position relative to a bonding site to a pyrromethene skeleton.

The aryl group mainly affecting efficiency is preferably an aryl group having a bulky substituent, such as a tert-butyl group, an adamantyl group or a methoxy group.

$R^1$, $R^3$, $R^4$, and $R^6$ may be the same as or different from each other. In the case where $R^1$, $R^3$, $R^4$, and $R^6$ are a substituted or unsubstituted aryl group, $R^1$, $R^3$, $R^4$, and $R^6$ may be the same as or different from each other and are preferably a substituted or unsubstituted phenyl group. In this case, $R^1$, $R^3$, $R^4$, and $R^6$ are each preferably selected from Ar-1 to Ar-6 mentioned below. In this case, examples of a preferred combination of $R^1$, $R^3$, $R^4$, and $R^6$ include, but are not limited to, combinations listed in Tables 1-1 to 1-11.

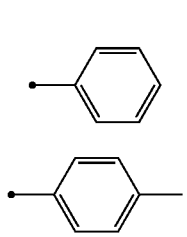
Ar-1

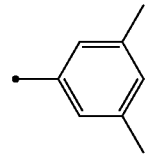
Ar-2

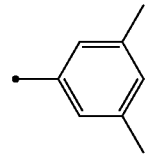
Ar-3

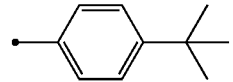
Ar-4

Ar-5

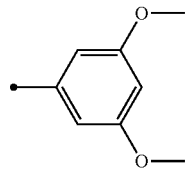
Ar-6

TABLE 1-1

| R1 | R3 | R4 | R6 |
|---|---|---|---|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |
| Ar-1 | Ar-1 | Ar-5 | Ar-6 |
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |

TABLE 1-1-continued

| R1 | R3 | R4 | R6 |
|---|---|---|---|
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |
| Ar-1 | Ar-3 | Ar-6 | Ar-1 |
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |

TABLE 1-2-continued

| R1 | R3 | R4 | R6 |
|---|---|---|---|
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
|---|---|---|---|
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |
| Ar-1 | Ar-5 | Ar-6 | Ar-6 |
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

TABLE 1-4

| R1 | R3 | R4 | R6 |
|---|---|---|---|
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |
| Ar-1 | Ar-6 | Ar-6 | Ar-5 |
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |
| Ar-2 | Ar-2 | Ar-2 | Ar-2 |
| Ar-2 | Ar-2 | Ar-2 | Ar-3 |
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
|---|---|---|---|
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |
| Ar-2 | Ar-3 | Ar-3 | Ar-3 |
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
|---|---|---|---|
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |

TABLE 1-6-continued

| R1 | R3 | R4 | R6 |
|---|---|---|---|
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |
| Ar-2 | Ar-5 | Ar-6 | Ar-5 |
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-3 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
|---|---|---|---|
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |

TABLE 1-7-continued

| R1 | R3 | R4 | R6 |
|---|---|---|---|
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |
| Ar-3 | Ar-2 | Ar-6 | Ar-3 |
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
|---|---|---|---|
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |
| Ar-3 | Ar-4 | Ar-2 | Ar-6 |
| Ar-3 | Ar-4 | Ar-3 | Ar-4 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |

TABLE 1-8-continued

| R1 | R3 | R4 | R6 |
|---|---|---|---|
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |
| Ar-3 | Ar-6 | Ar-2 | Ar-4 |
| Ar-3 | Ar-6 | Ar-2 | Ar-5 |
| Ar-3 | Ar-6 | Ar-2 | Ar-6 |

TABLE 1-9

| R1 | R3 | R4 | R6 |
|---|---|---|---|
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-4 | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |

TABLE 1-9-continued

| R1 | R3 | R4 | R6 |
|---|---|---|---|
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE-1-10

| R1 | R3 | R4 | R6 |
|---|---|---|---|
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-4 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |

TABLE-1-10-continued

| R1 | R3 | R4 | R6 |
|---|---|---|---|
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
|---|---|---|---|
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-1 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

$R^2$ and $R^5$ are preferably hydrogen, an alkyl group, a carbonyl group, an oxycarbonyl group, or an aryl group. Among these groups, hydrogen and an alkyl group are preferred from the viewpoint of thermal stability, and hydrogen is more preferred because hydrogen allows a smaller full width at half maximum in an emission spectrum to be more easily achieved.

$R^8$ and $R^9$ are preferably an alkyl group, an aryl group, a heteroaryl group, fluorine, a fluorine-containing alkyl group, a fluorine-containing heteroaryl group, or a fluorine-containing aryl group. $R^8$ and $R^9$ are more preferably fluorine or a fluorine-containing aryl group because fluorine and a fluorine-containing aryl group are more stable against the light source and lead to a higher luminescence quantum yield. Furthermore, from the viewpoint of the ease of synthesis, fluorine is still more preferred.

The fluorine-containing aryl group is an aryl group containing fluorine. Examples of the fluorine-containing aryl group include a fluorophenyl group, a trifluoromethylphenyl group, and a pentafluorophenyl group. The fluorine-containing heteroaryl group is a heteroaryl group containing fluorine. Examples of the fluorine-containing heteroaryl group include a fluoropyridyl group, a trifluoromethylpyridyl group, and a trifluoropyridyl group. The fluorine-containing alkyl group is an alkyl group containing fluorine. Examples of the fluorine-containing alkyl group include a trifluoromethyl group and a pentafluoroethyl group.

From the viewpoint of light stability, X is preferably C—$R^7$. When X is C—$R^7$, the substituent $R^7$ has a great influence on the durability of the compound of Formula (1), that is, a decrease in the light emission intensity of the compound with the lapse of time. Specifically, when $R^7$ is hydrogen, the high reactivity of the hydrogen causes the hydrogen to easily react with water and oxygen contained in the air, thereby causing decomposition. When $R^7$ is a substituent having a large degree of freedom of motion of a molecular chain, such as an alkyl group, reactivity actually decreases, but aggregation of the compounds in a composition proceeds with the lapse of time, and, as a result, a decrease in light emission intensity due to concentration quenching occurs. Hence, $R^7$ is preferably a group that is rigid, has a small degree of freedom of motion, and is unlikely to cause aggregation. Specifically, $R^7$ is preferably a substituted or unsubstituted aryl group or a substituted or unsubstituted heteroaryl group.

From the viewpoints of offering a higher luminescence quantum yield and causing less thermal decomposition and the viewpoint of light stability, X is preferably C—$R^7$, and $R^7$ is preferably a substituted or unsubstituted aryl group. From the viewpoint of not impairing a light emission wavelength, a phenyl group, a biphenyl group, a terphenyl group, a naphthyl group, a fluorenyl group, a phenanthryl group, and an anthracenyl group are preferred as the aryl group.

To further enhance the light stability, twisting in a carbon-carbon bond between $R^7$ and a pyrromethene skeleton needs to be appropriately prevented. When an excessive twist exists, light stability decreases, for example, reactivity to a light source increases. From these viewpoints, $R^7$ is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, and particularly preferably a substituted or unsubstituted phenyl group.

In addition, $R^7$ is preferably an appropriately bulky substituent. When $R^1$ has a certain degree of bulkiness, molecules can be prevented from aggregating. As a result, the light emission efficiency and durability are further enhanced.

Further preferable examples of the bulky substituent include a structure in Formula (2) illustrated below.

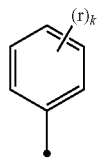

(2)

r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group. k is an integer of 1 to 3. When k is 2 or larger, r may be the same as or different from each other.

That is, in Formula (1), X is more preferably C—$R^7$, $R^7$ being a group of Formula (2).

From the viewpoint of offering a higher luminescence quantum yield, r is preferably a substituted or unsubstituted aryl group. Particularly preferred examples of the aryl group include a phenyl group and a naphthyl group. When r is an aryl group, k in Formula (2) is preferably 1 or 2. From the viewpoint of more efficiently preventing aggregation of molecules, k is more preferably 2. Furthermore, at least one of rs is preferably substituted with an alkyl group. In this case, from the viewpoint of thermal stability, particularly preferred examples of the alkyl group include a methyl group, an ethyl group, and a tert-butyl group.

From the viewpoints of controlling fluorescence wavelength and absorption wavelength and increasing compatibility with a solvent, r is preferably a substituted or unsubstituted alkyl group, a substituted or unsubstituted alkoxy group, or halogen, and more preferably a methyl group, an ethyl group, a tert-butyl group, or a methoxy group. From the viewpoint of dispersibility, r is particularly preferably a tert-butyl group or a methoxy group, whereby quenching due to aggregation of molecules can be prevented.

As another aspect of the compound of Formula (1), at least one of $R^1$ to $R^7$ is preferably an electron withdrawing group. In particular, it is preferred that: (1) at least one of $R^1$ to $R^6$ is an electron withdrawing group; (2) $R^7$ is an electron withdrawing group; or (3) at least one of $R^1$ to $R^6$ is an electron withdrawing group and $R^7$ is an electron withdrawing group. By thus introducing an electron withdrawing group into a pyrromethene skeleton, the electron density of the pyrromethene skeleton can be greatly reduced. With this reduction in electron density, the stability against oxygen is further improved, and the durability can be made higher.

The electron withdrawing group is also referred to as an electron accepting group, and is an atomic group that, in the organic electronics, attracts an electron from a substituted atomic group due to an inductive effect or a resonance effect. Examples of the electron withdrawing group include a group having a positive value as a substituent constant (op (para)) of Hammett's Rule. The substituent constant (op (para)) of Hammett's Rule can be cited from Kagaku Binran Kiso-Hen, 5th Edition (II, p. 380). Note that, although some phenyl groups take a positive value, the electron withdrawing group does not include a phenyl group in the present application.

Examples of the electron withdrawing group include —F (op: +0.06), —Cl (op: +0.23), —Br (op: +0.23), —I (op: +0.18), —$CO_2R^{12}$ (op: +0.45 when $R^{12}$ is an ethyl group), —$CONH_2$ (op: +0.38), —$COR^{12}$ (op: +0.49 when $R^{12}$ is a methyl group), —$CF_3$ (op: +0.50), —$SO_2R^{12}$ (op: +0.69 when $R^{12}$ is a methyl group), and —$NO_2$ (op: +0.81). $R^{12}$ s are each independently a hydrogen atom, a substituted or unsubstituted aromatic hydrocarbon group having a ring-forming carbon number of 6 to 30, a substituted or unsubstituted heterocyclic group having a ring-forming carbon number of 5 to 30, a substituted or unsubstituted $C_{1-30}$ alkyl group, or a substituted or unsubstituted $C_{1-30}$ cycloalkyl group. Specific examples of these groups include the same examples as those described above.

Preferred examples of the electron withdrawing group include fluorine, a fluorine-containing aryl group, a fluorine-containing heteroaryl group, a fluorine-containing alkyl group, a substituted or unsubstituted acyl group, a substituted or unsubstituted ester group, a substituted or unsubstituted amide group, a substituted or unsubstituted sulfonyl group, and a cyano group. This is because these groups are difficult to be chemically decomposed.

More preferred examples of the electron withdrawing group include a fluorine-containing alkyl group, a substituted or unsubstituted acyl group, a substituted or unsubstituted ester group, and a cyano group. This is because these groups lead to the effects of prevention of concentration quenching and an enhanced luminescence quantum yield. The electron withdrawing group is particularly preferably a substituted or unsubstituted ester group.

One particularly preferred example of the compound of Formula (1) is a compound in which $R^1$, $R^3$, $R^4$, and $R^6$ may be the same as or different from each other; $R^1$, $R^3$, $R^4$, and $R^6$ are a substituted or unsubstituted alkyl group; and X is C—$R^7$, $R^7$ being a group of Formula (2), and particularly preferably being a group of Formula (2) in which r is a substituted or unsubstituted phenyl group.

Another particularly preferred example of the compound of Formula (1) is a compound in which $R^1$, $R^3$, $R^4$, and $R^6$ may be the same as or different from each other; $R^1$, $R^3$, $R^4$, and $R^6$ are selected from the above-mentioned Ar-1 to Ar-6; and X is C—$R^7$, $R^7$ being a group of Formula (2), more preferably being a group of Formula (2) in which r is a tert-butyl group or a methoxy group, and particularly preferably being a group of Formula (2) in which r is a methoxy group.

Examples of the compound of Formula (1) are illustrated below, but the compound is not limited to these examples.

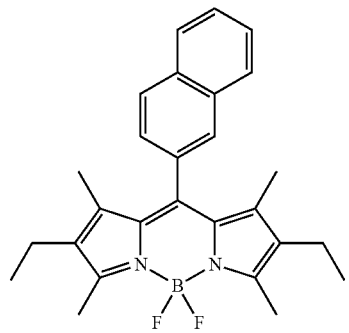

-continued
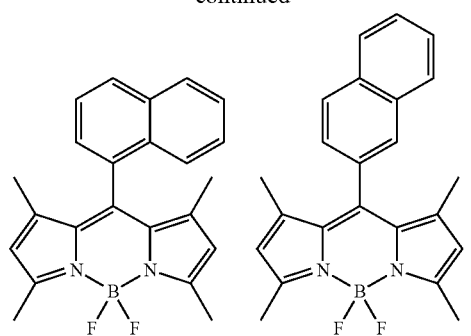
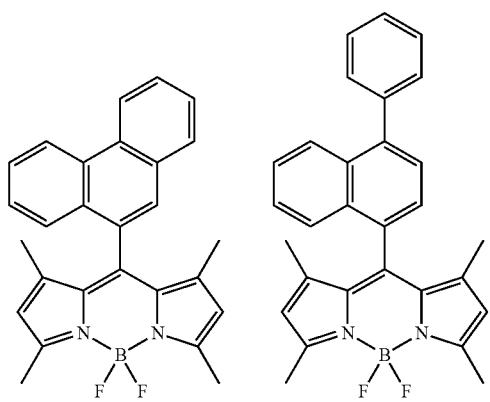
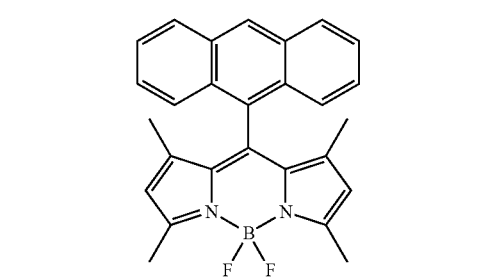
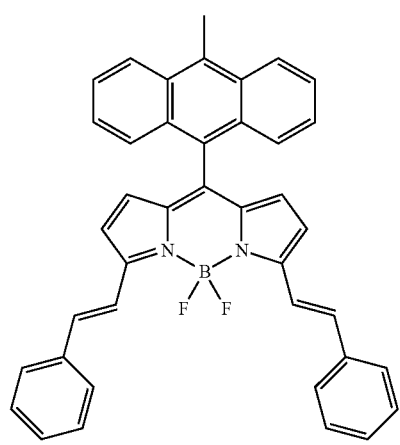
-continued
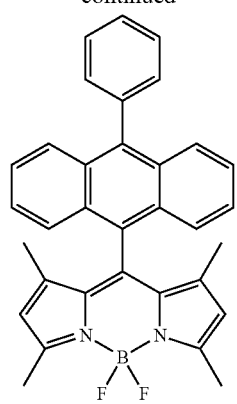
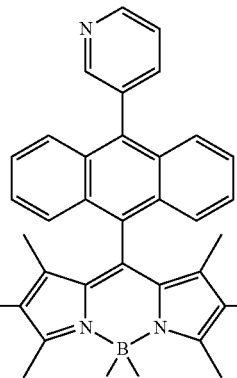
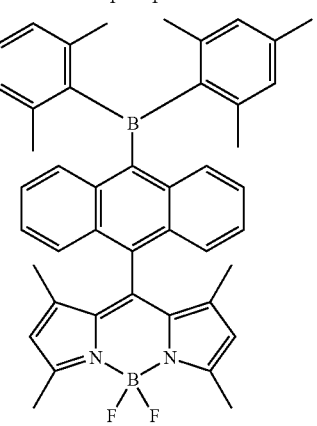
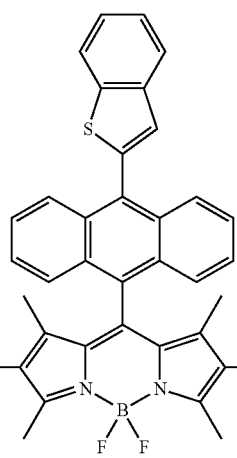

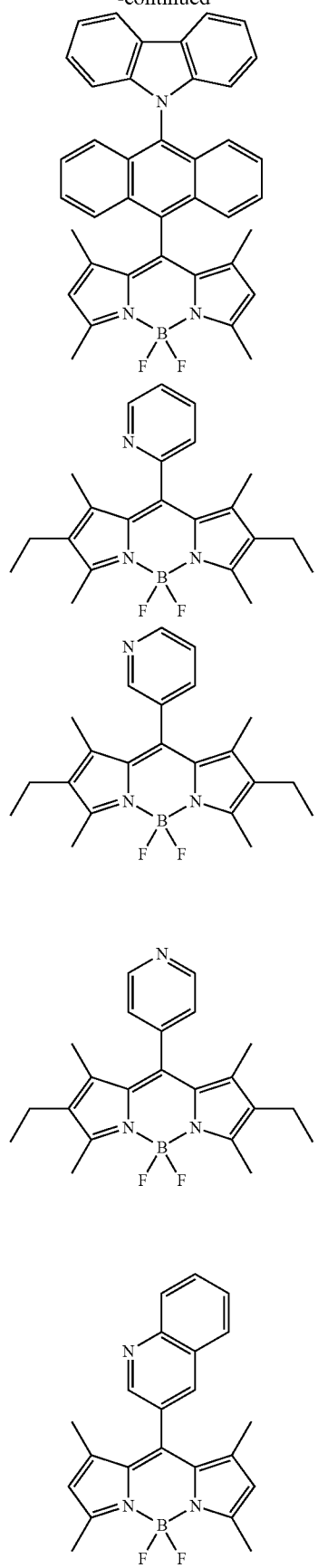
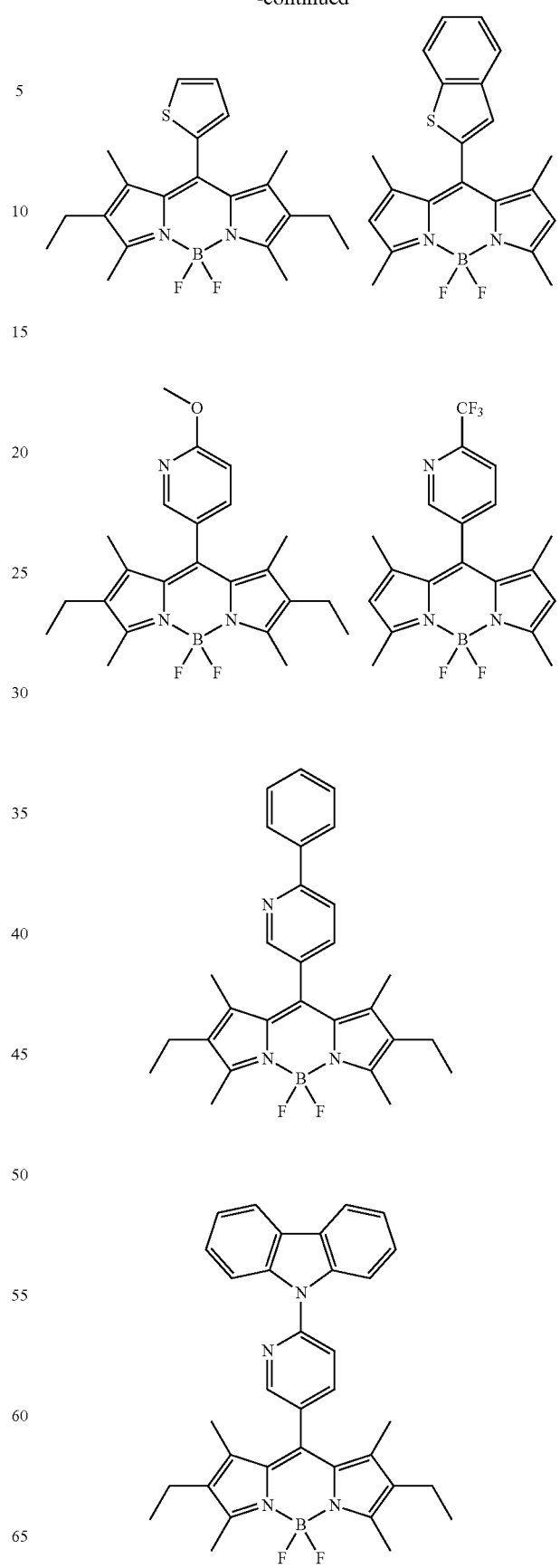

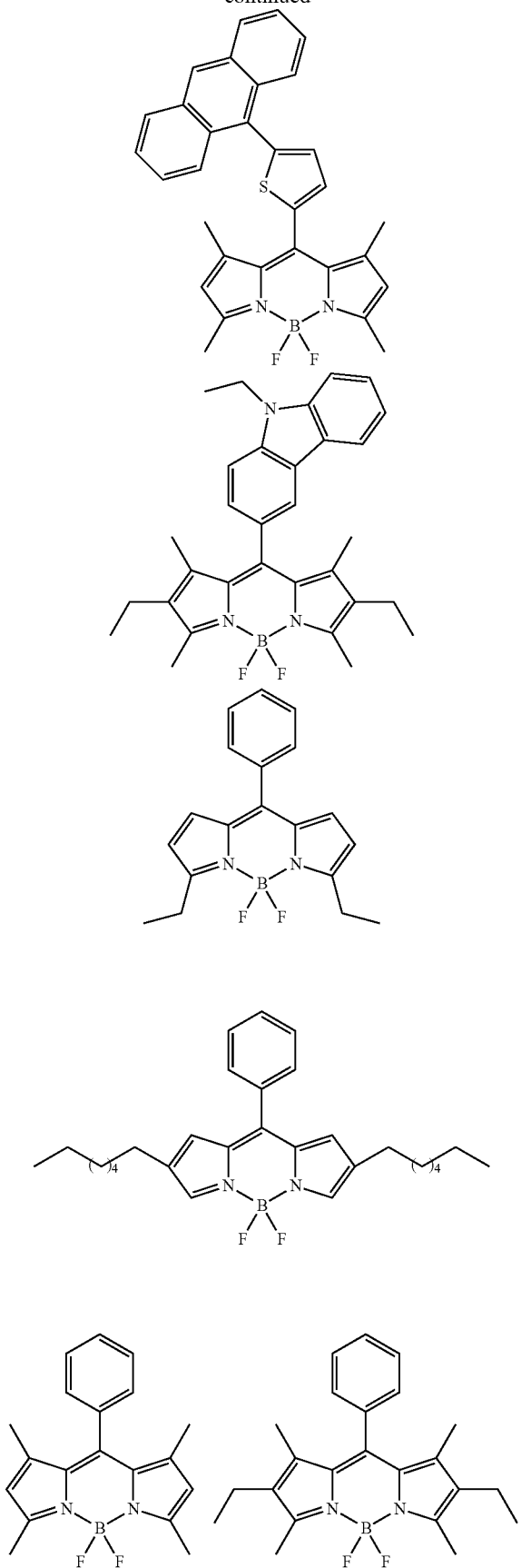

-continued
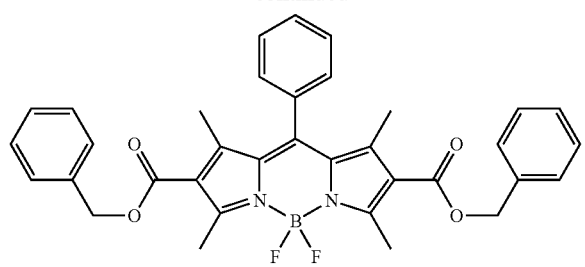
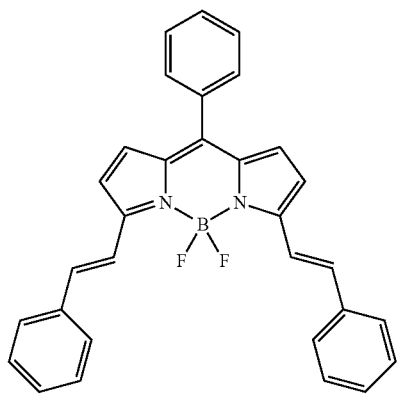
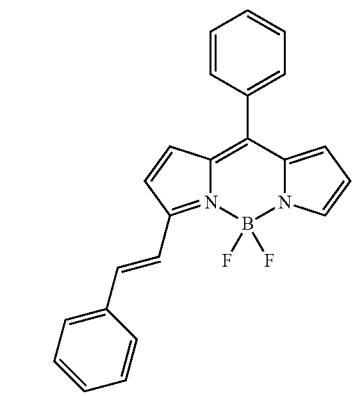
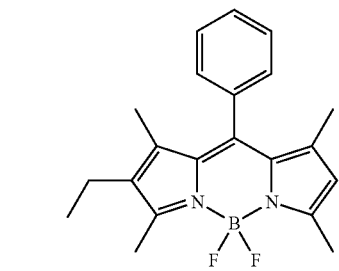
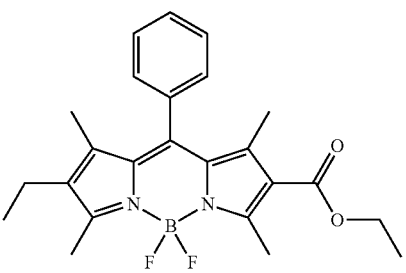
-continued
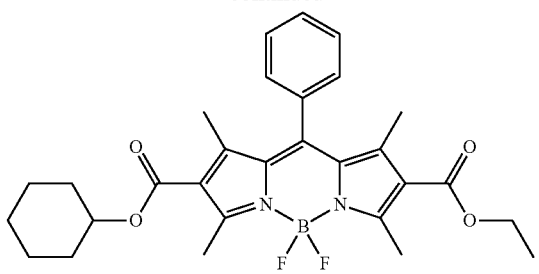
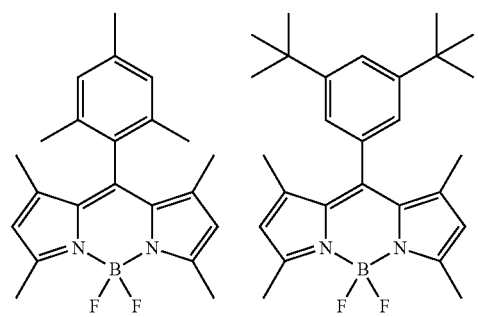
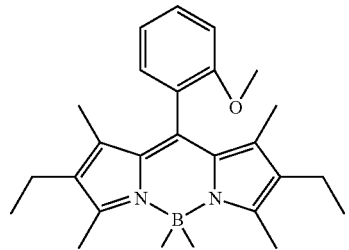
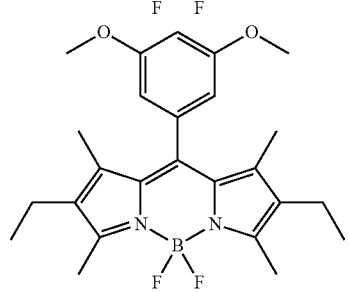
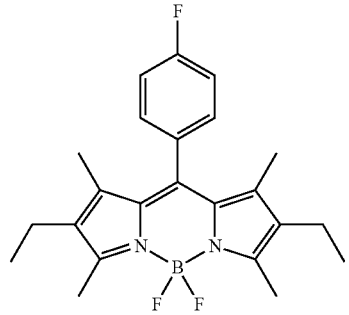
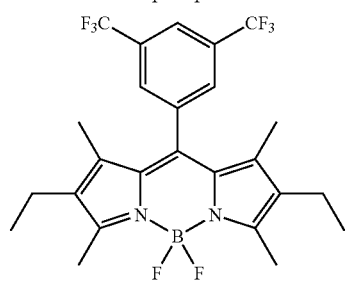

-continued
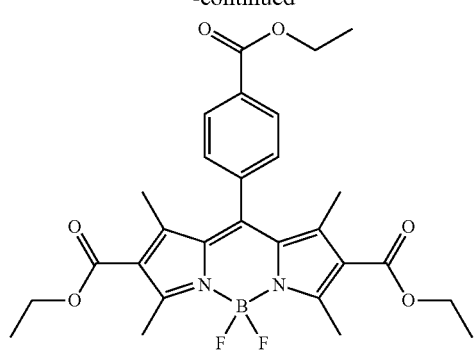
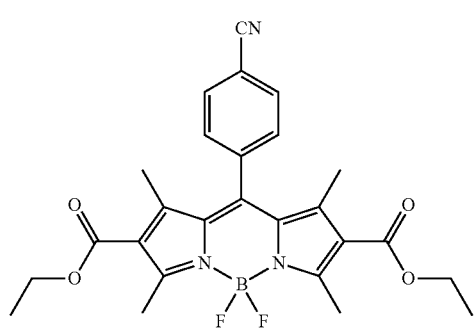
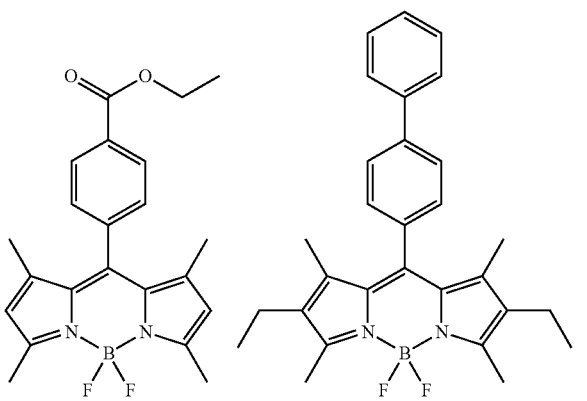
-continued
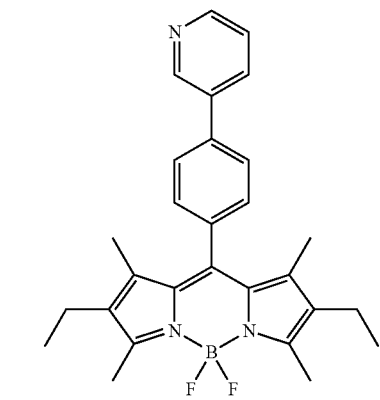
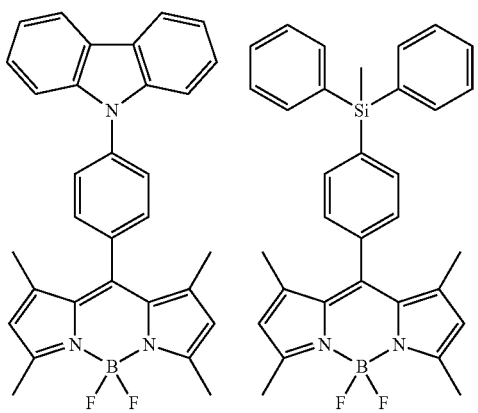
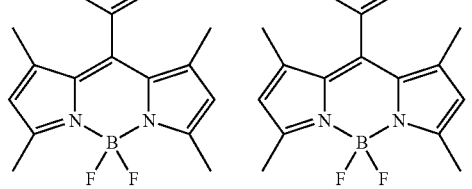
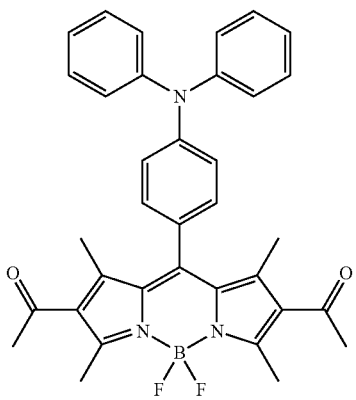
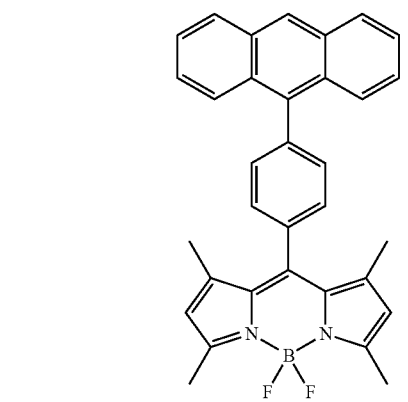
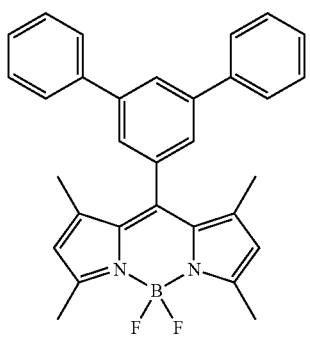

47
-continued
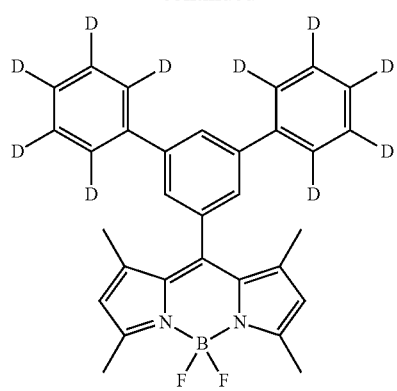
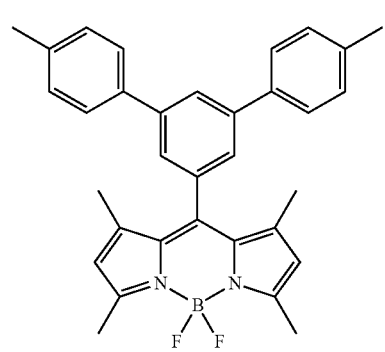
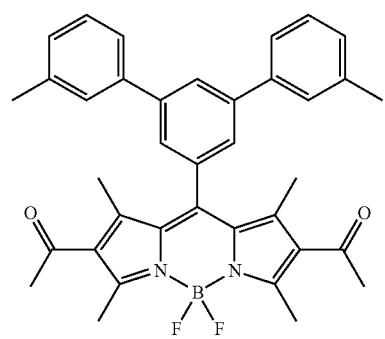
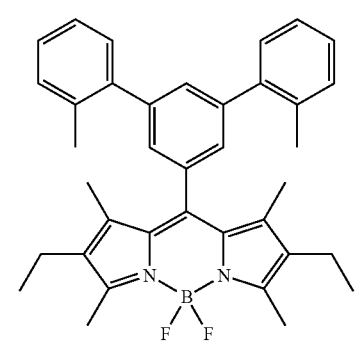
48
-continued
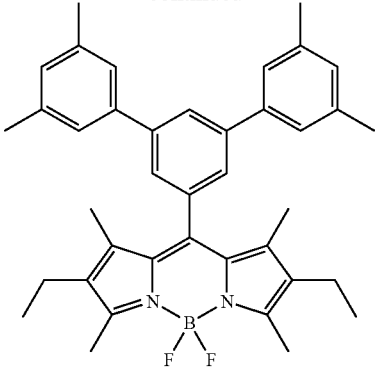
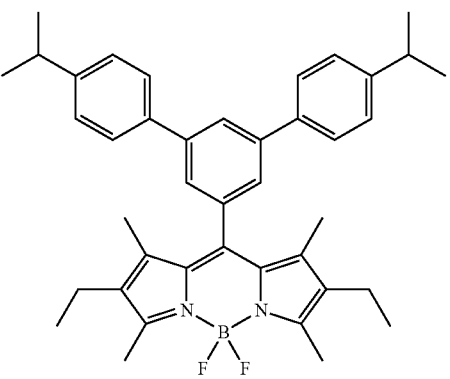
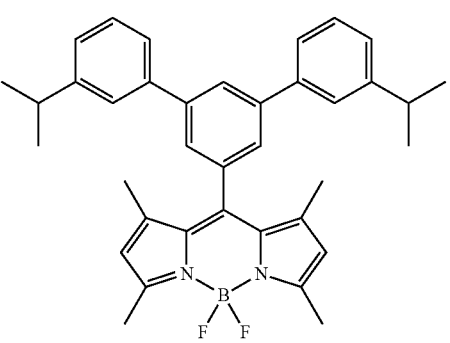
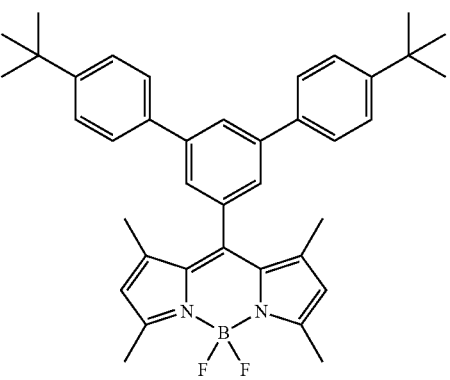

49
-continued
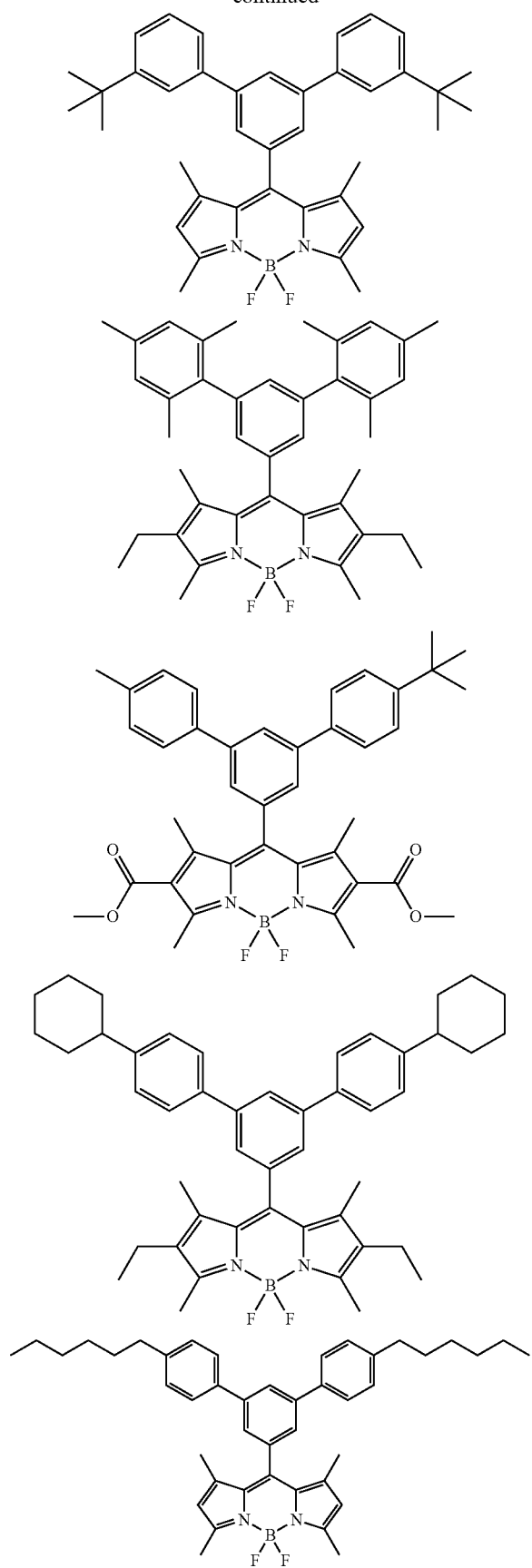
50
-continued
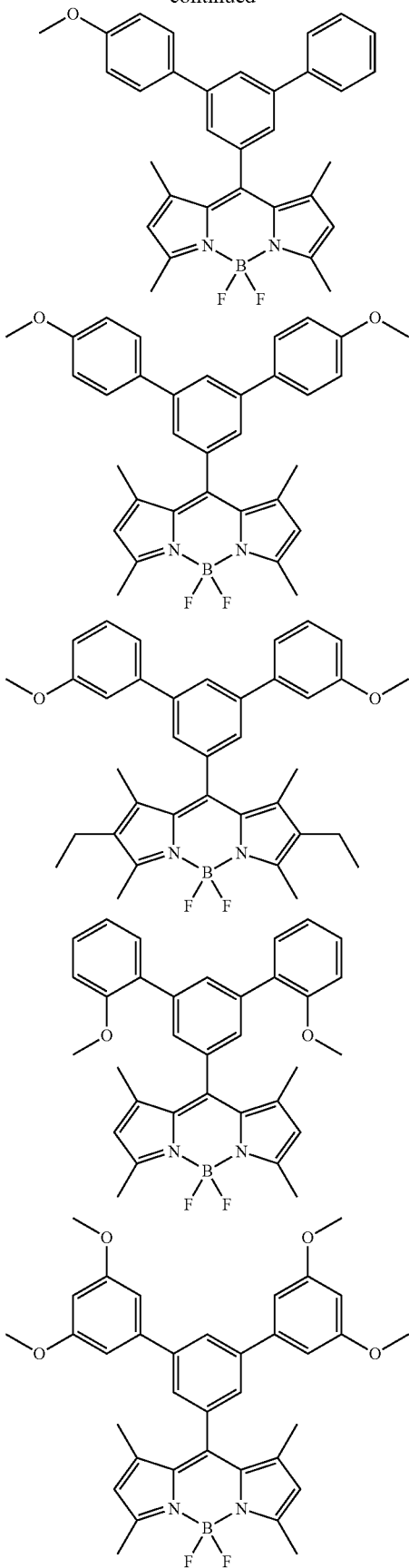

51
-continued
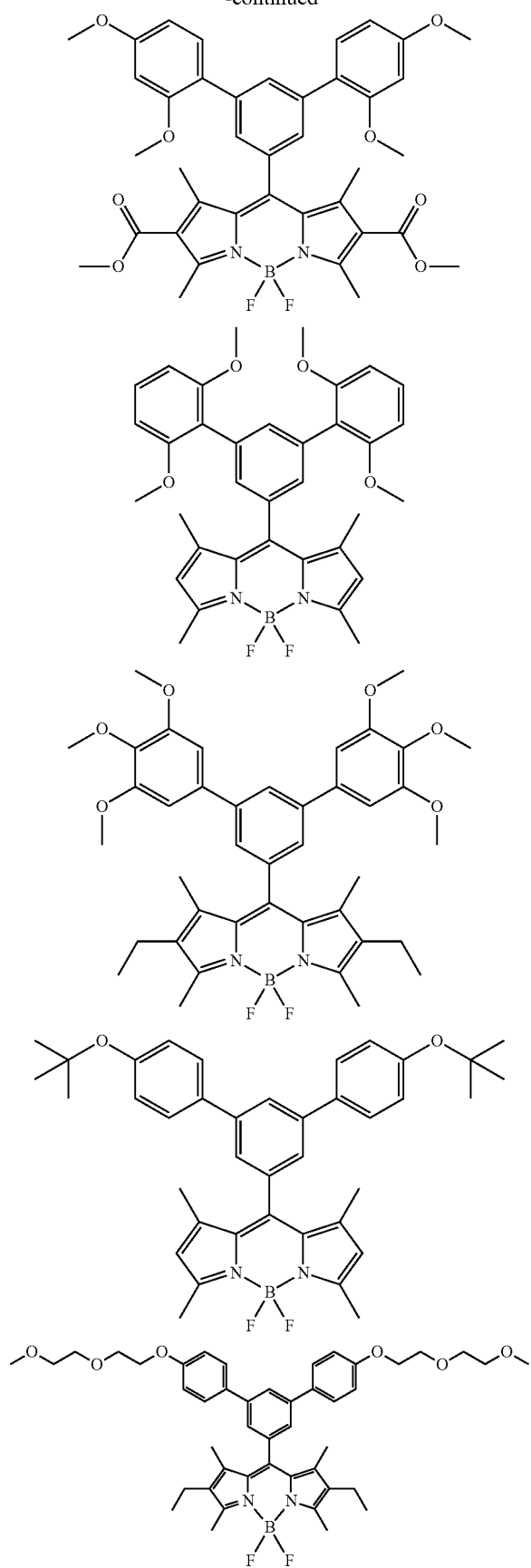
52
-continued
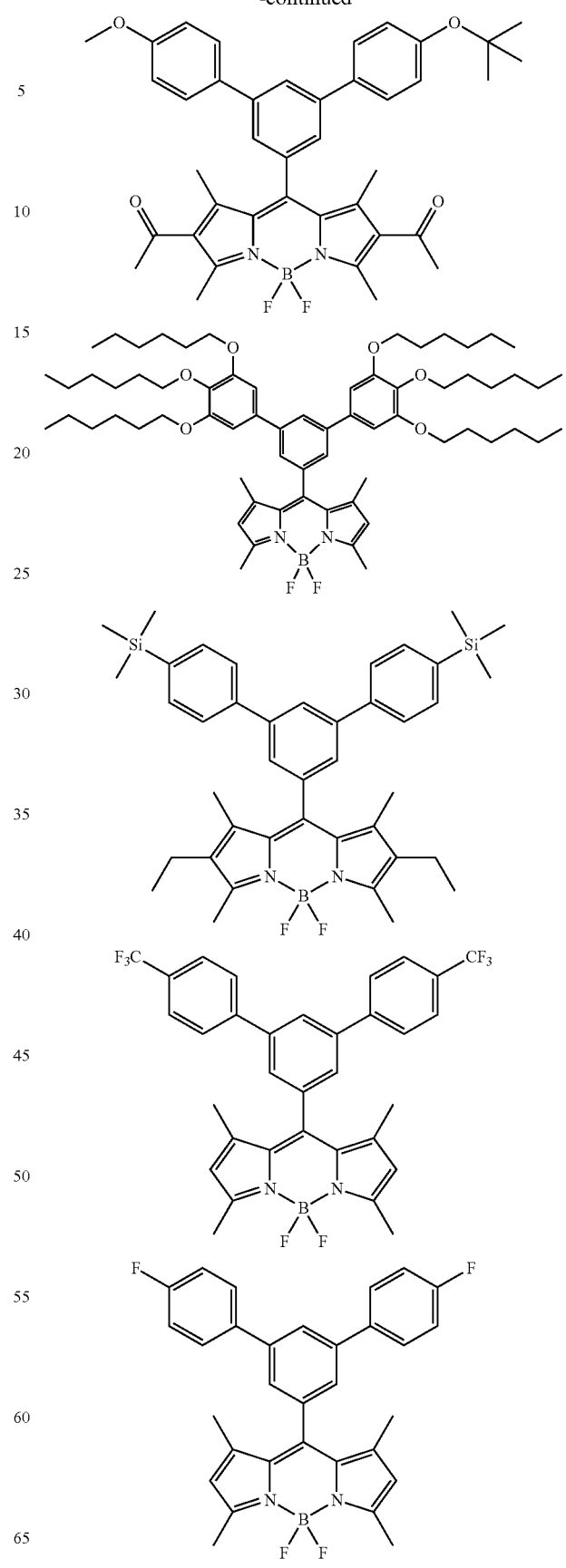

53
-continued
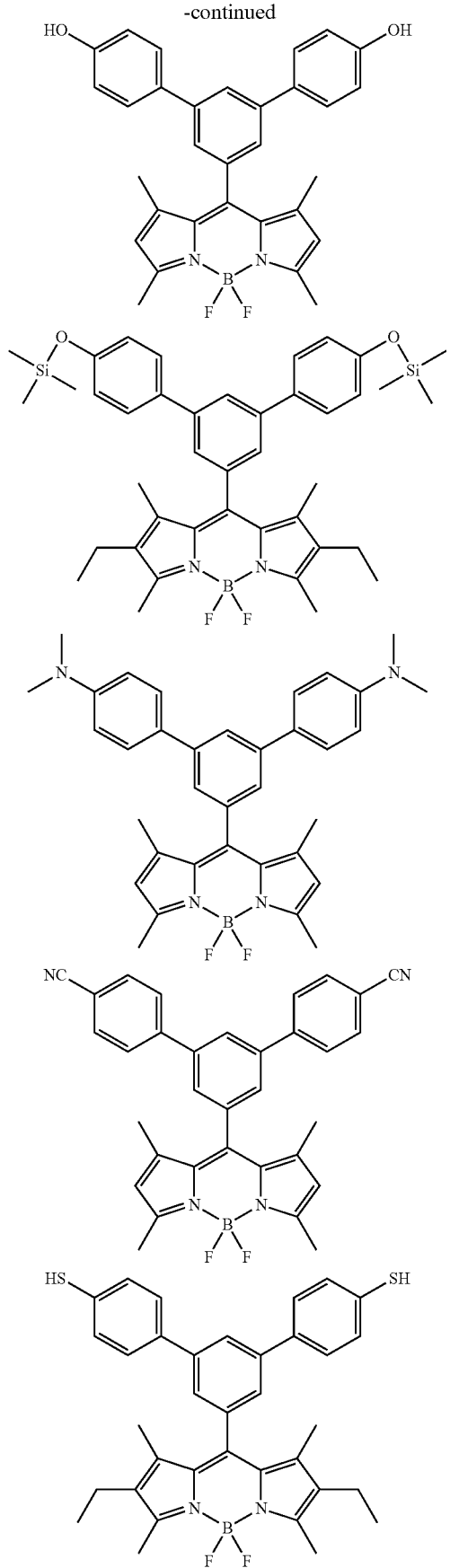
54
-continued
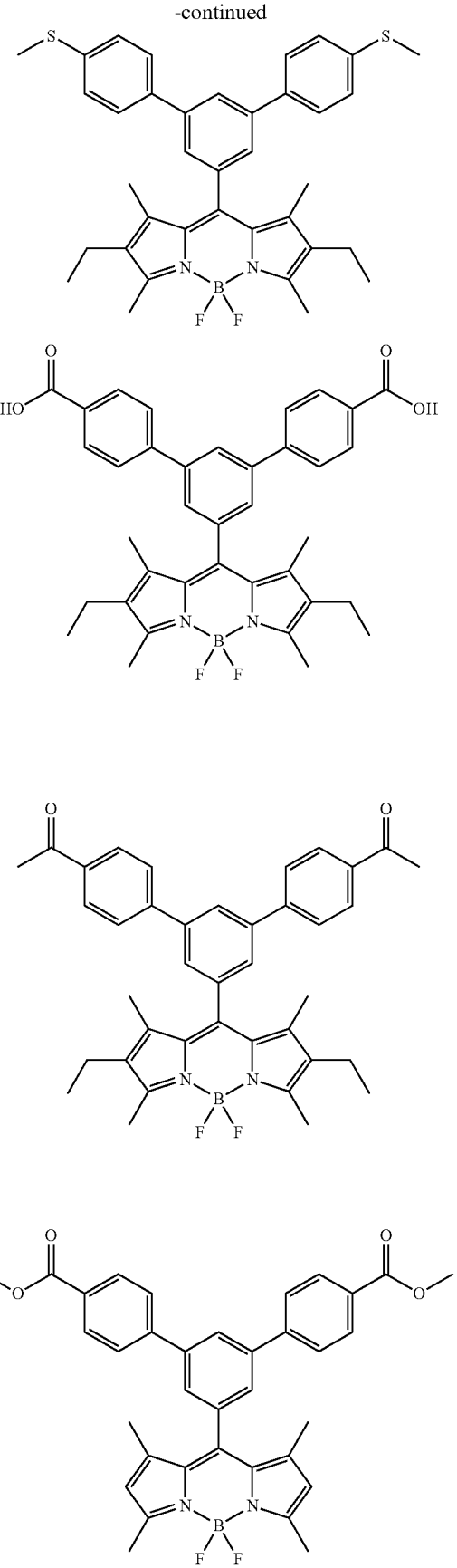

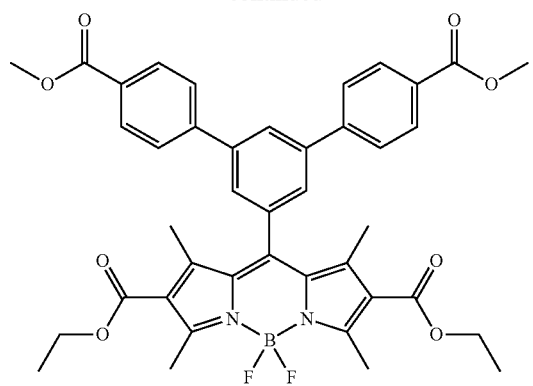
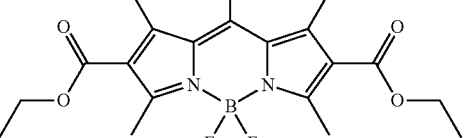
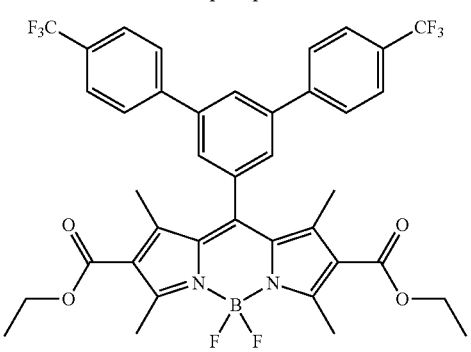
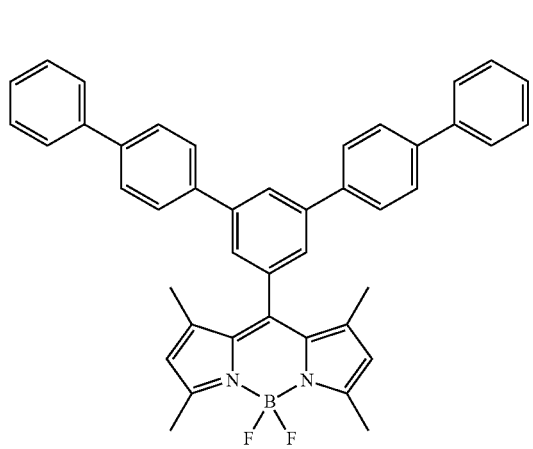
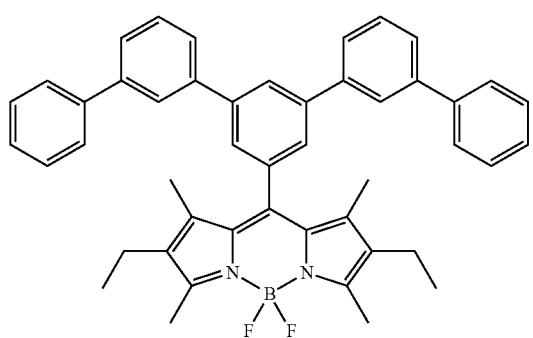
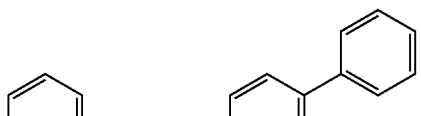
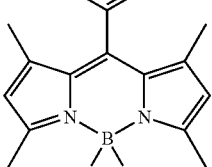
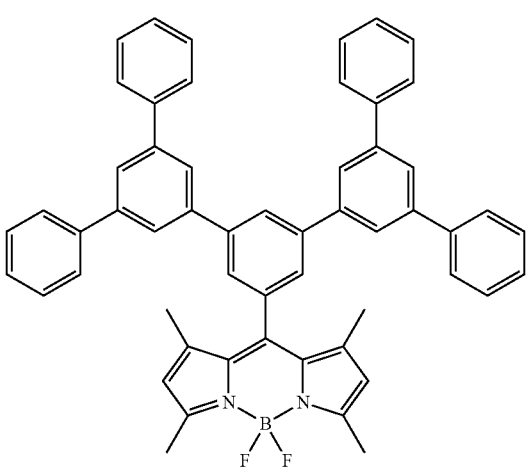
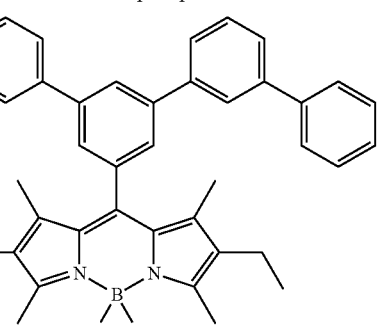
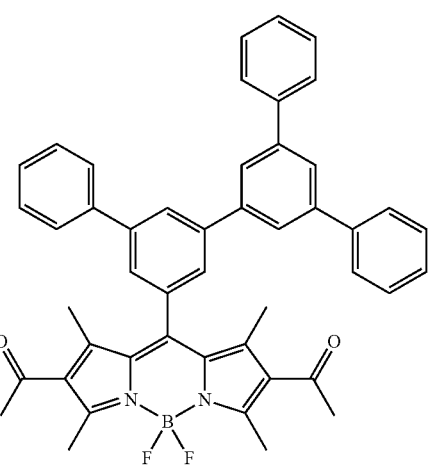
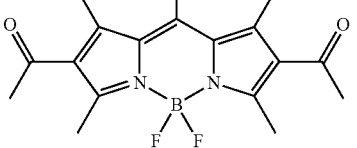

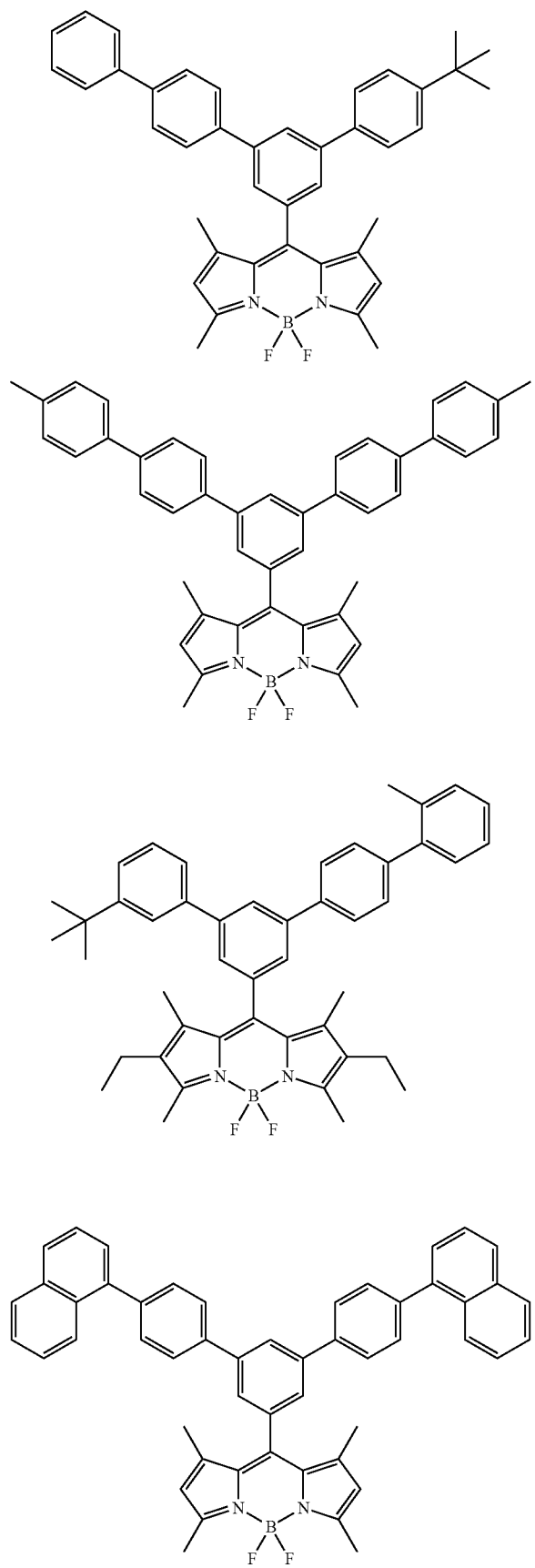
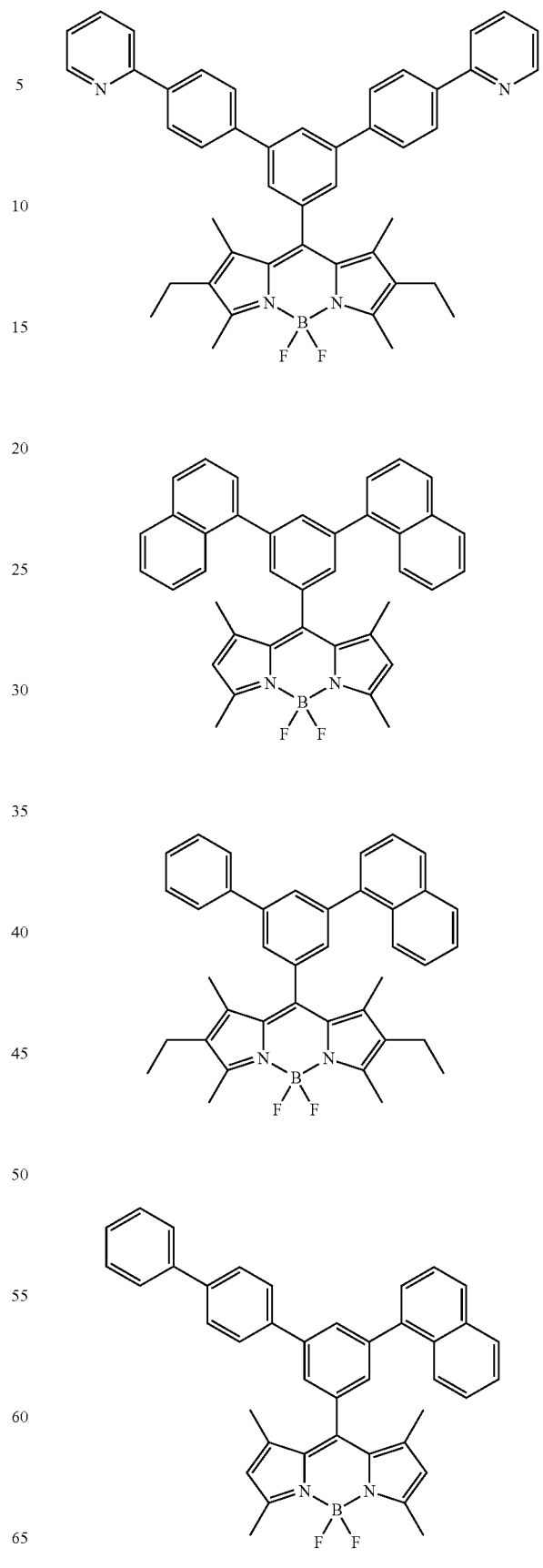

-continued
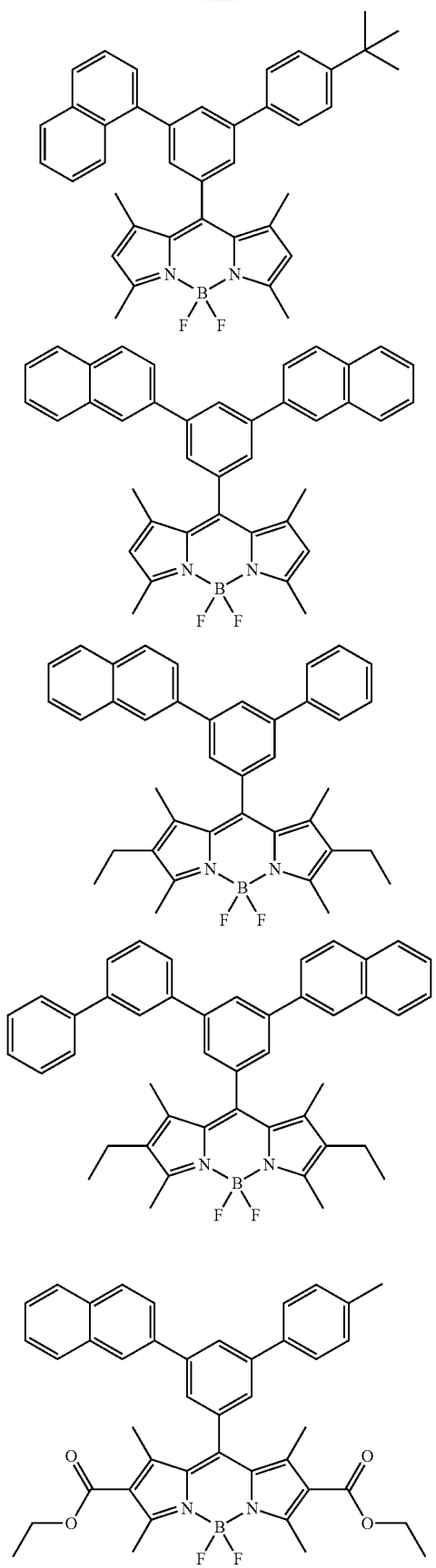
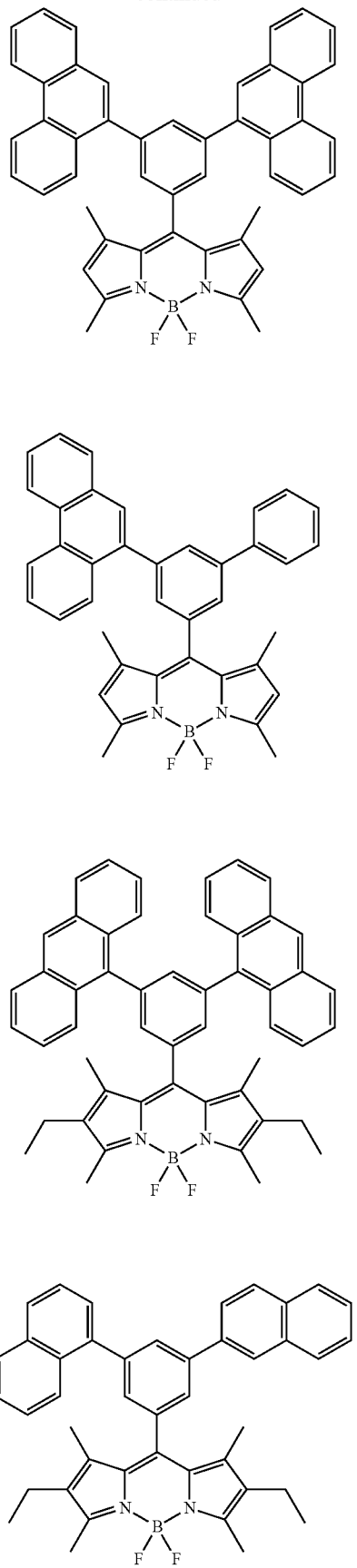

-continued
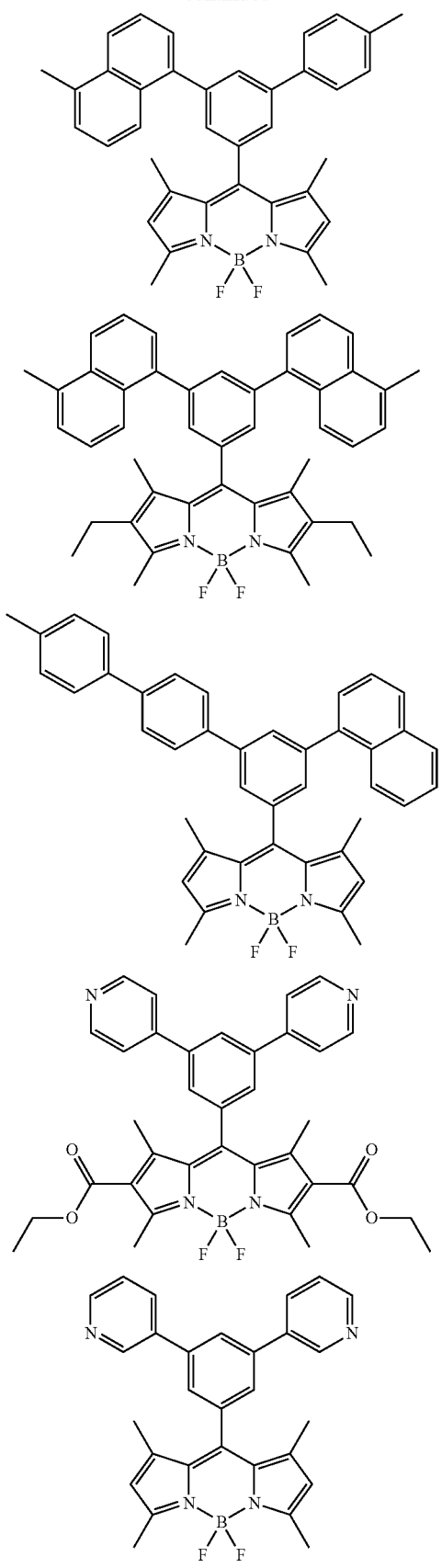
-continued
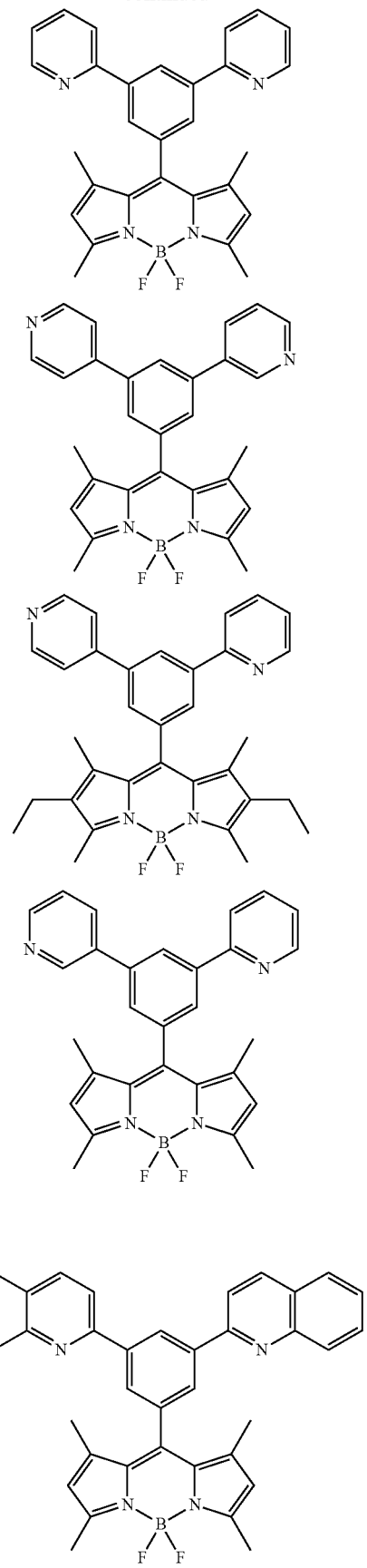

63
-continued
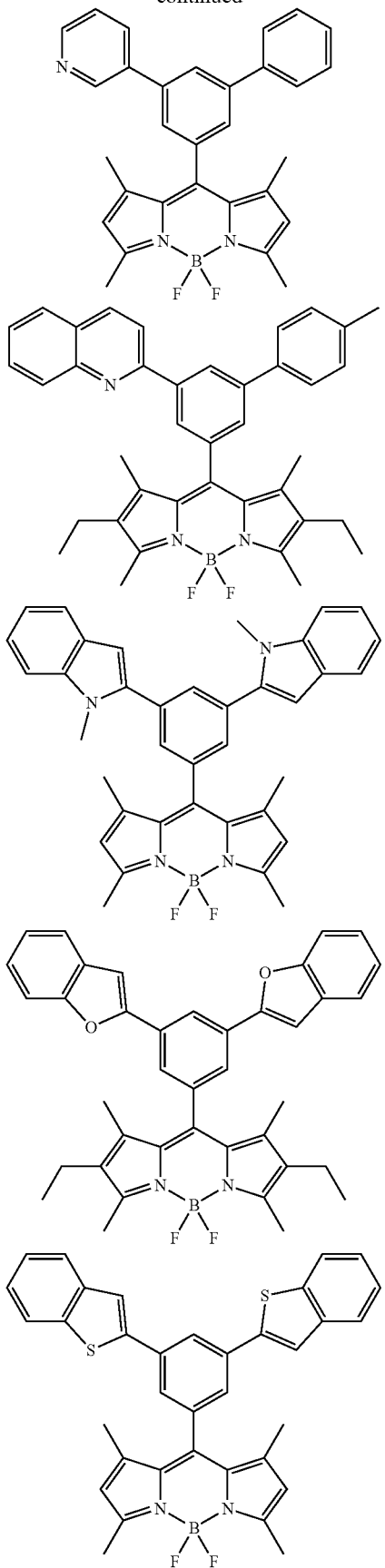
64
-continued
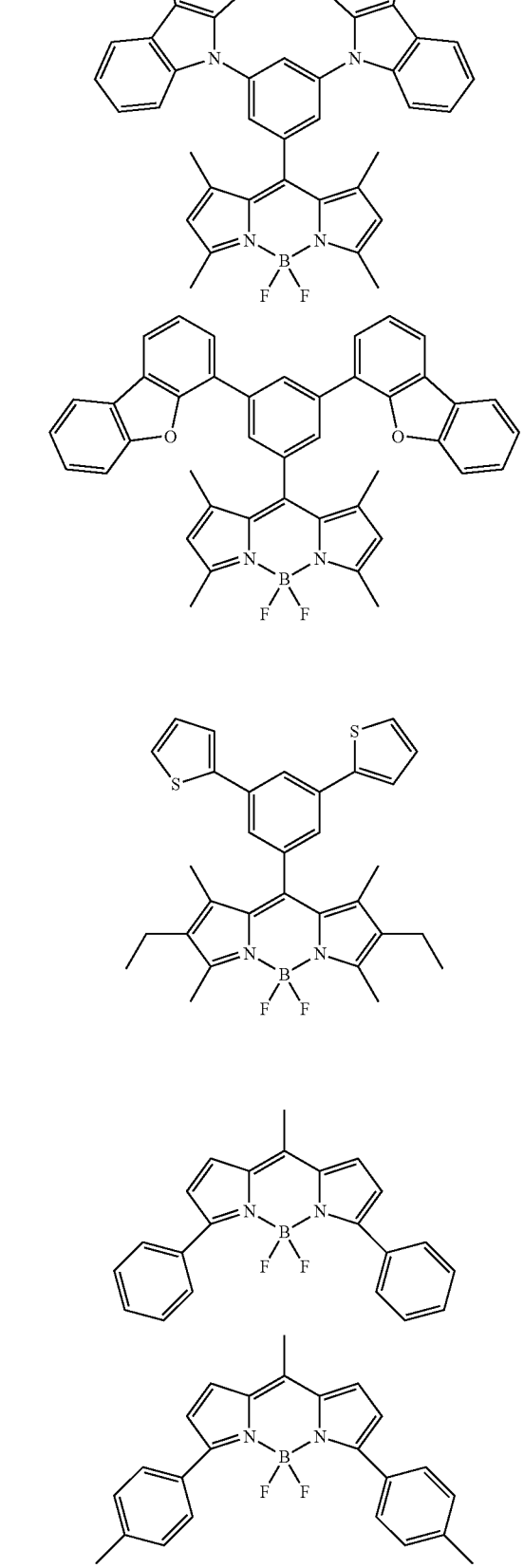

-continued
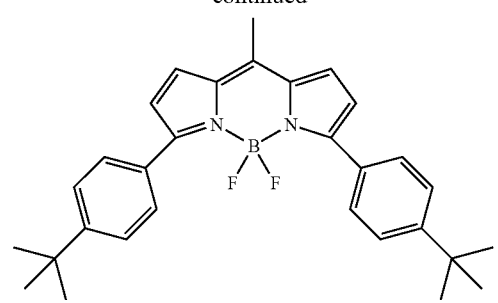
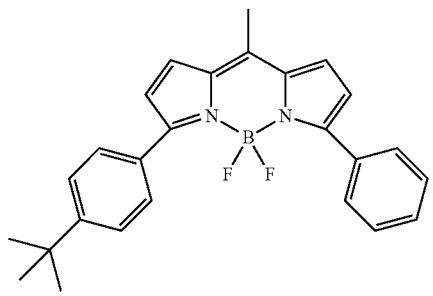
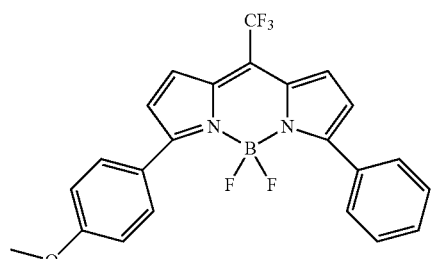
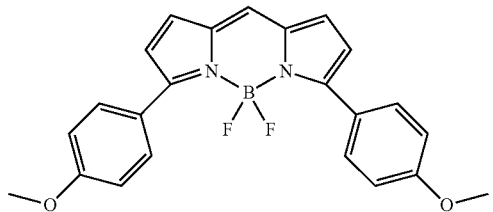
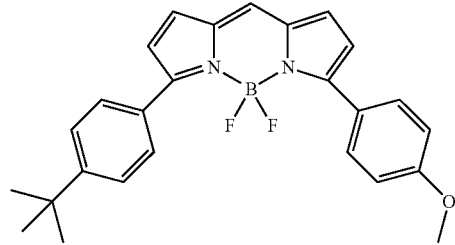
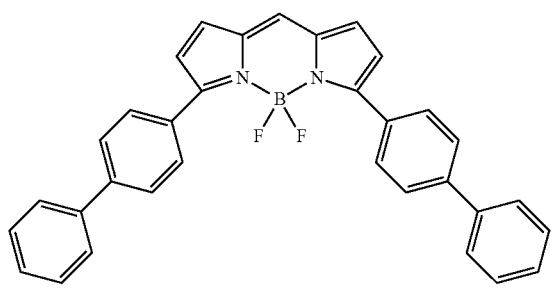
-continued
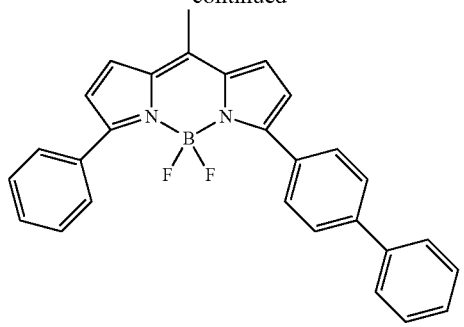
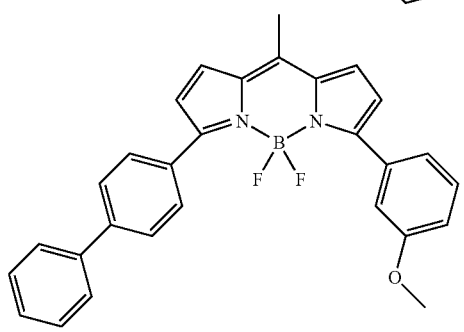
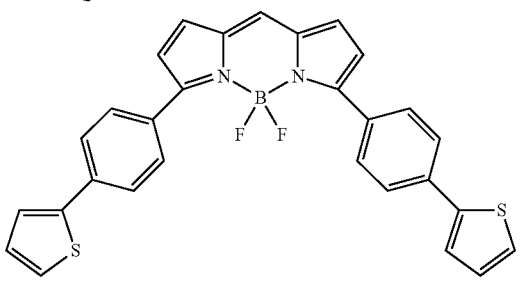
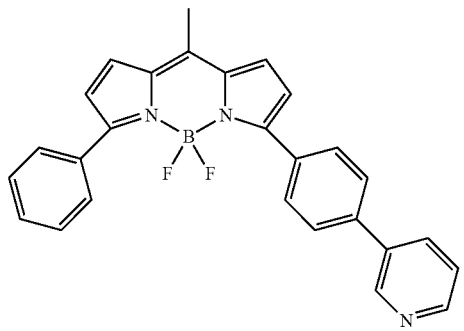
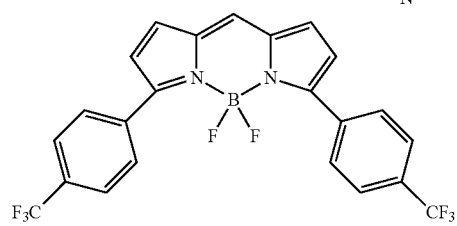
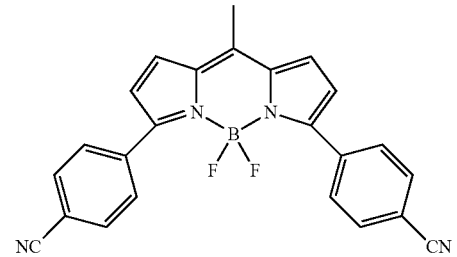

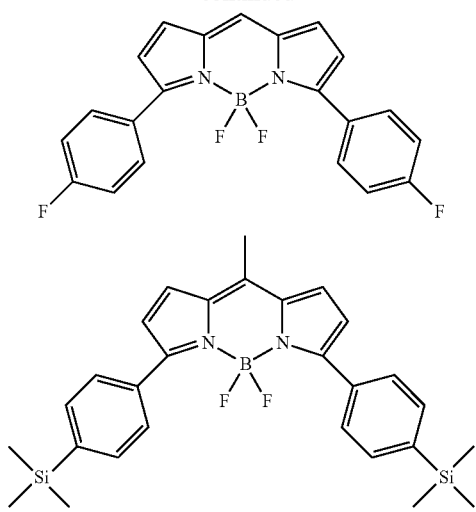
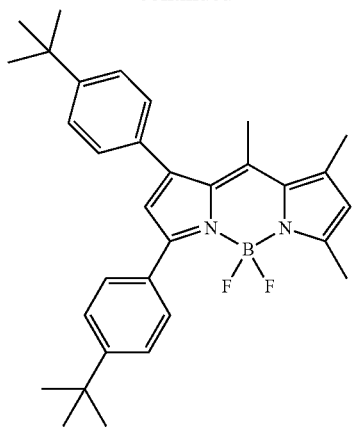
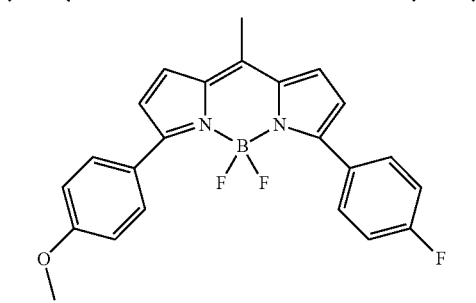
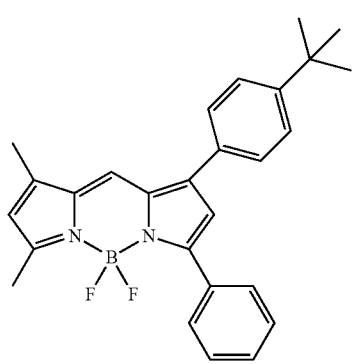
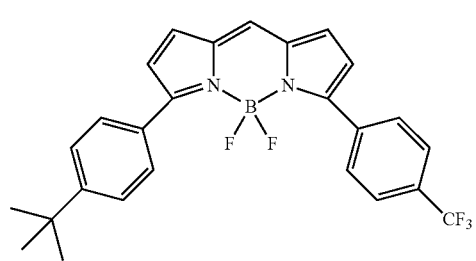
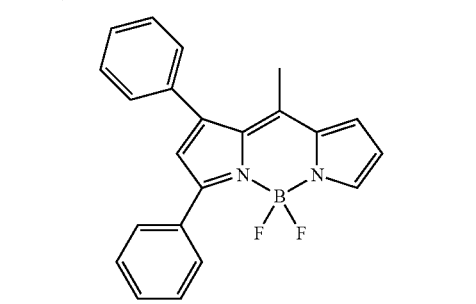
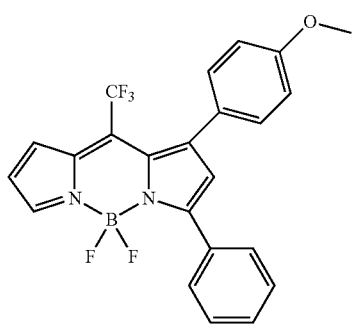
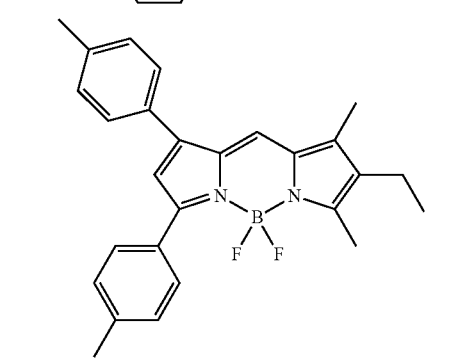
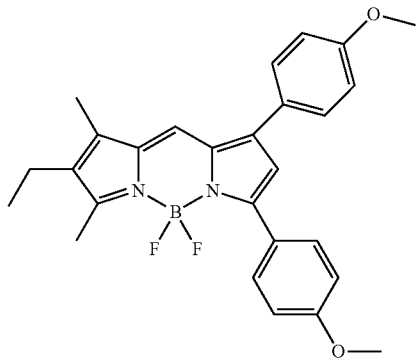

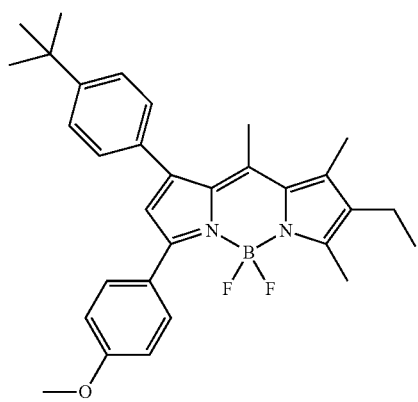
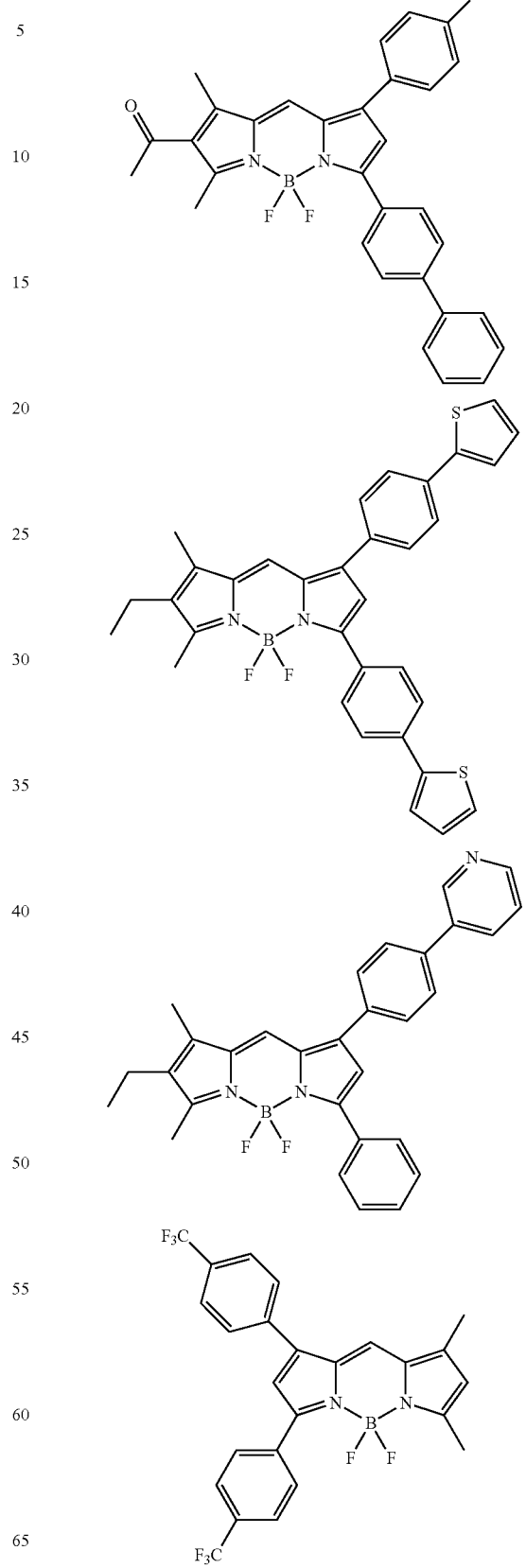

-continued
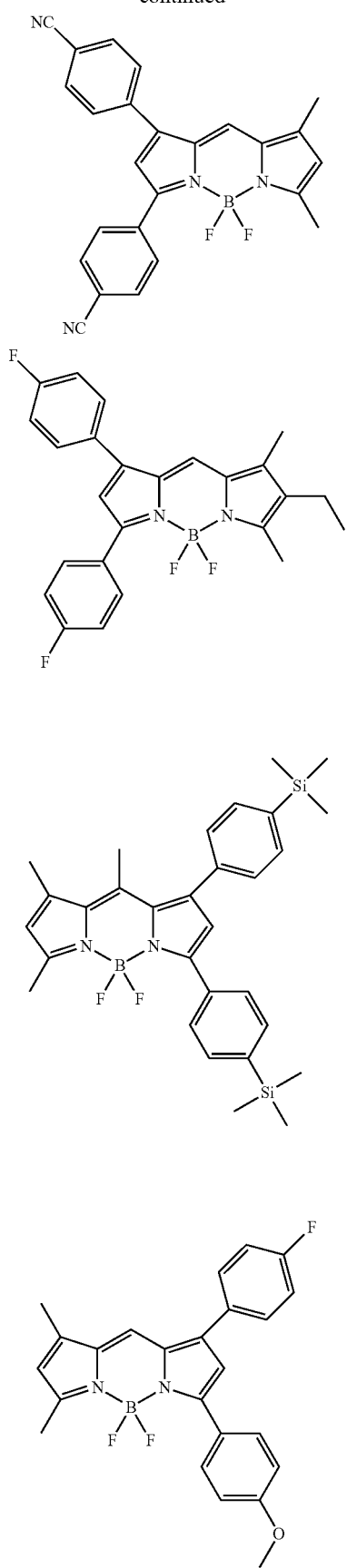
-continued
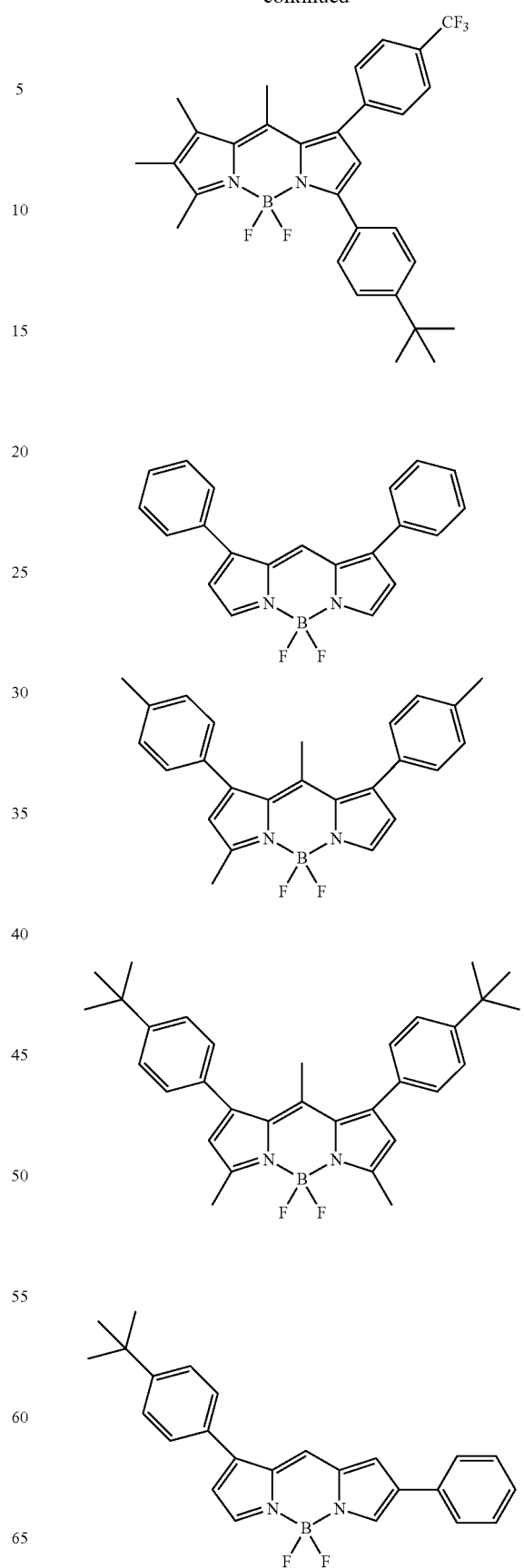

73
-continued
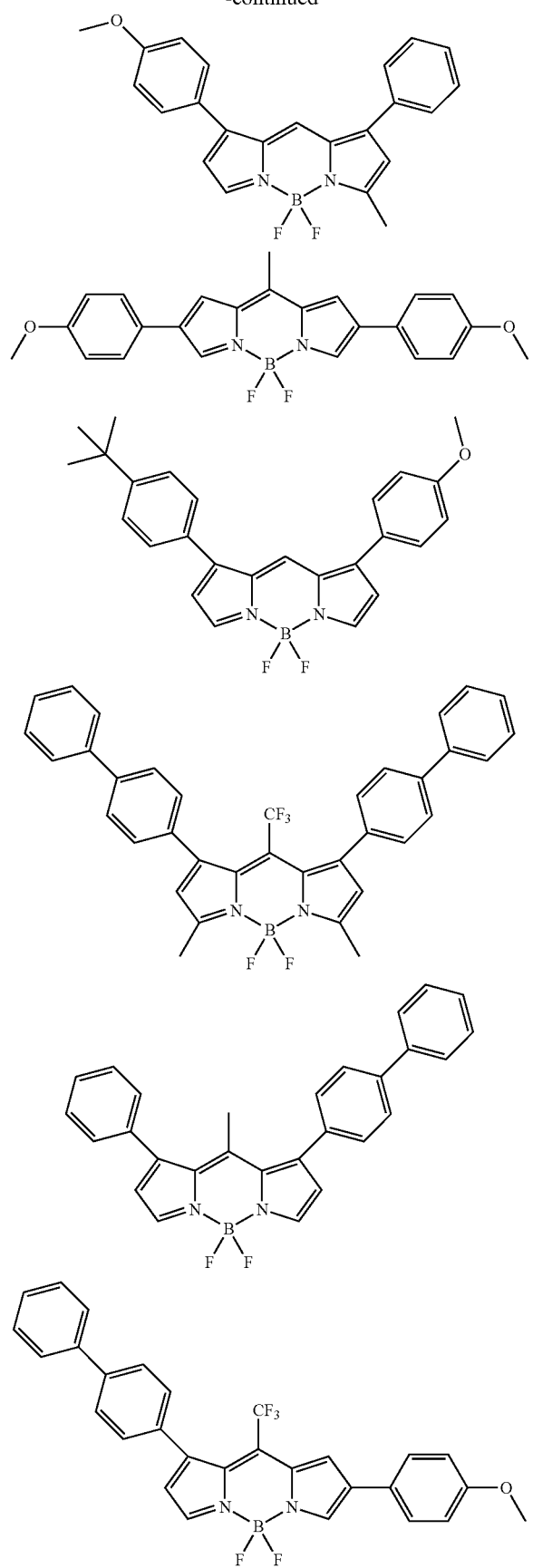
74
-continued
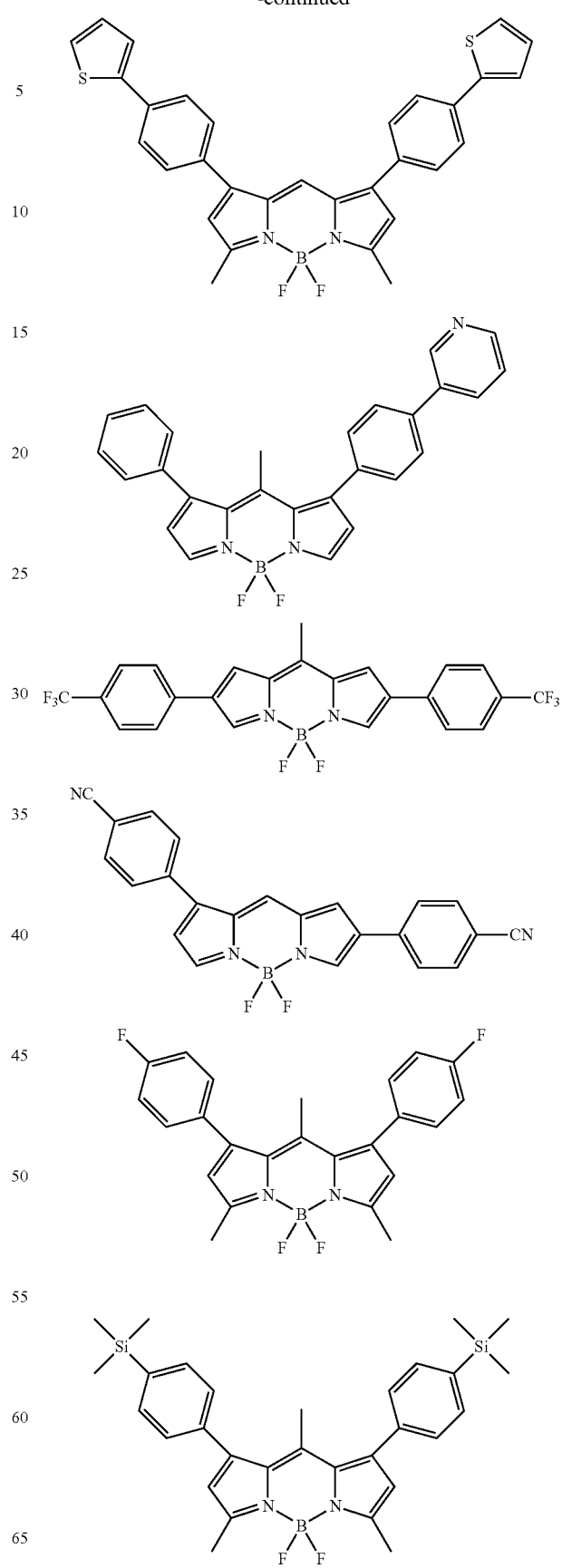

-continued
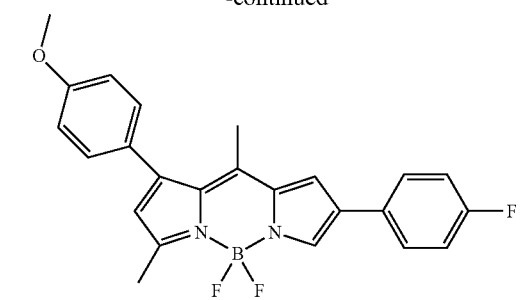
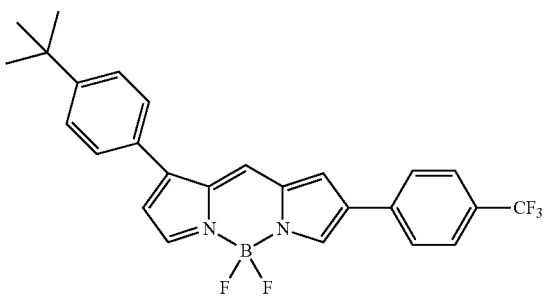
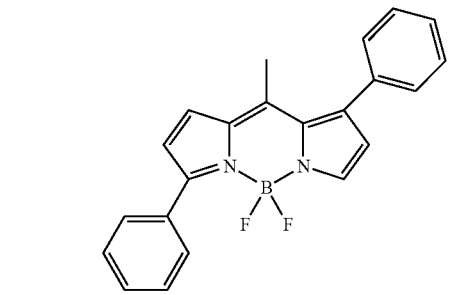
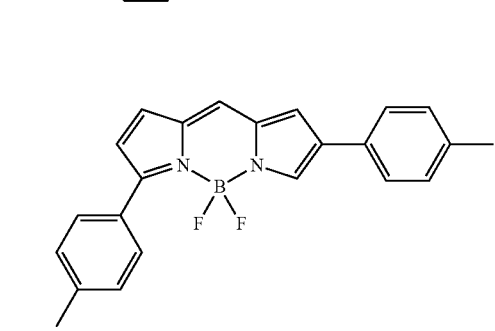
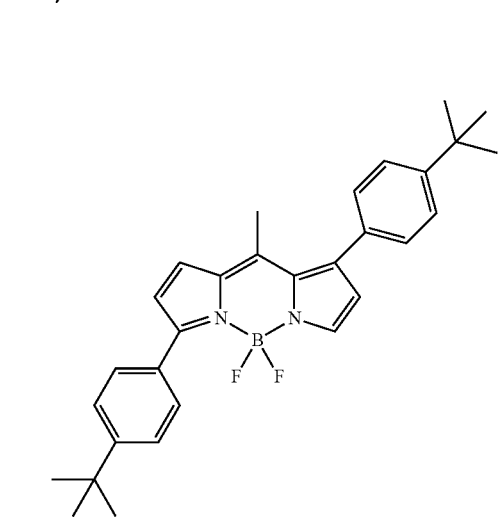
-continued
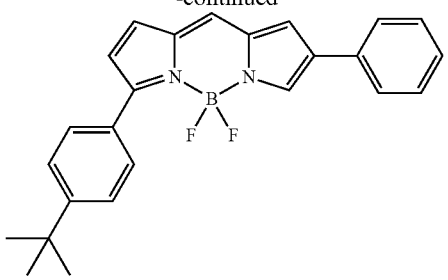
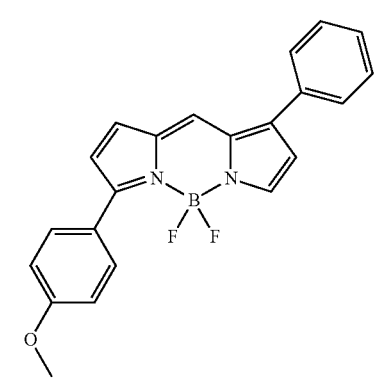
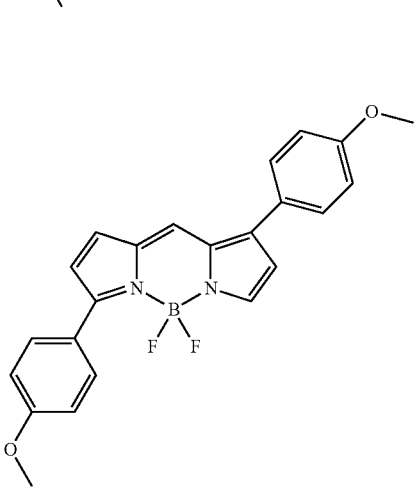
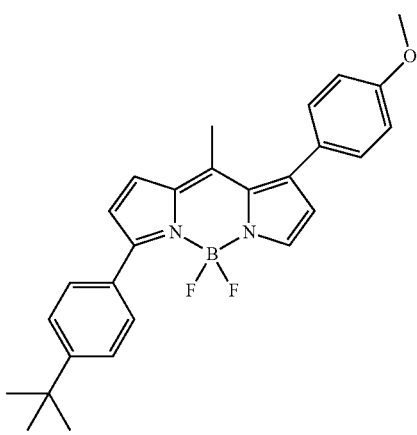

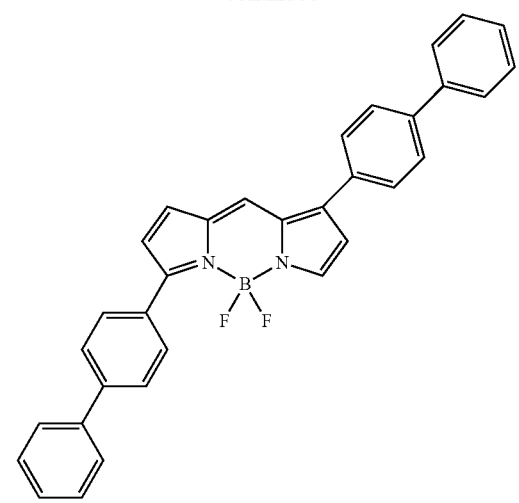
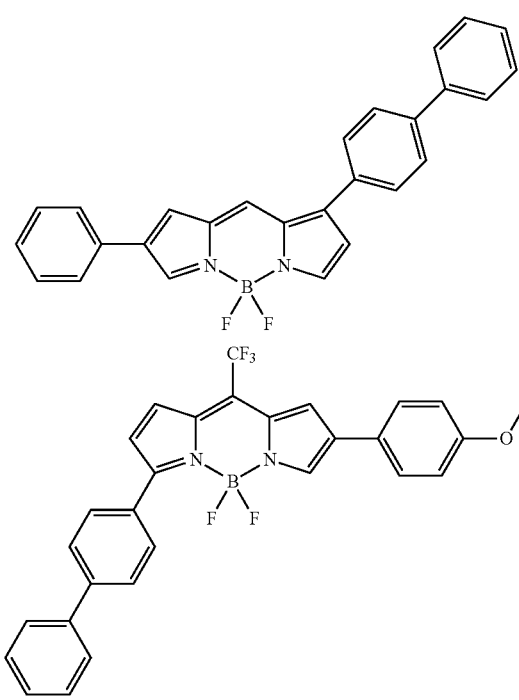
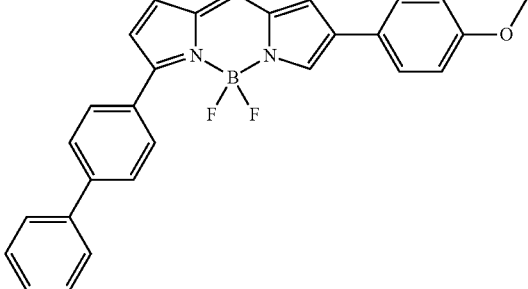
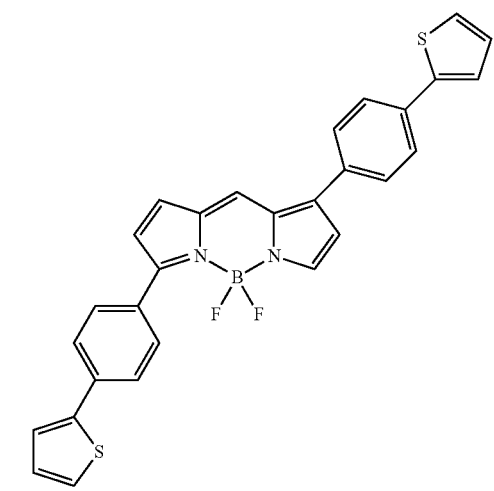
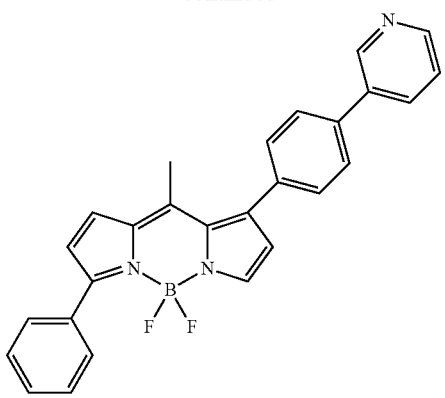
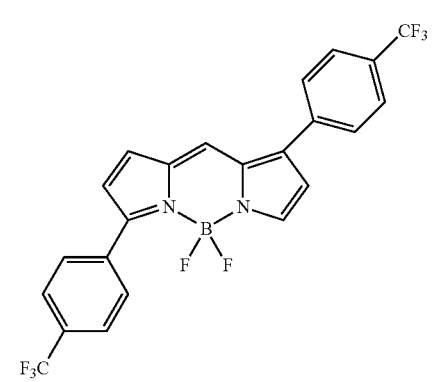
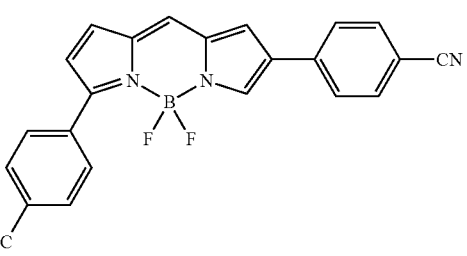
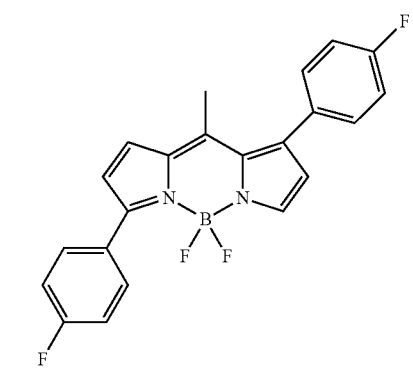

-continued
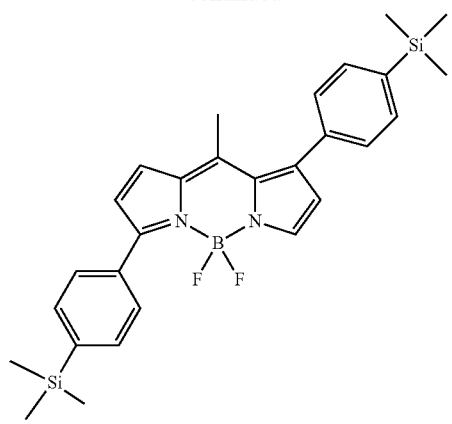
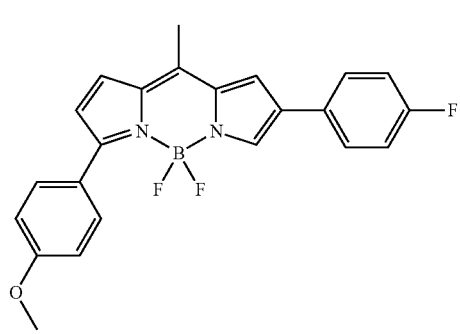
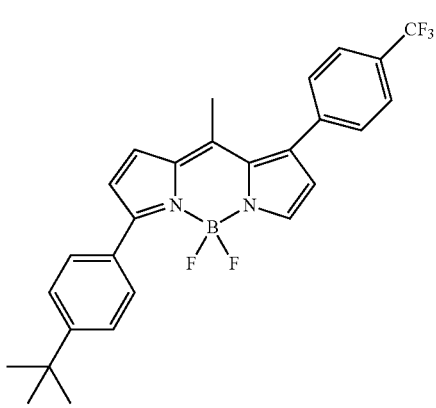
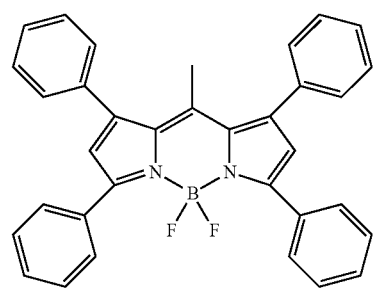
-continued
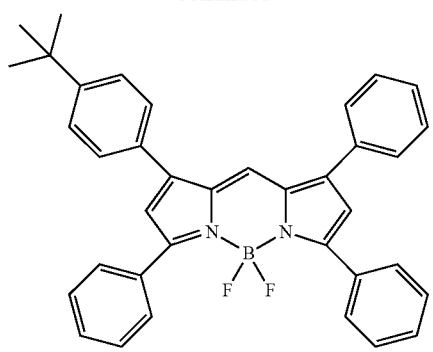
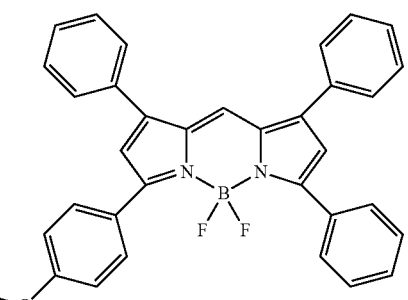
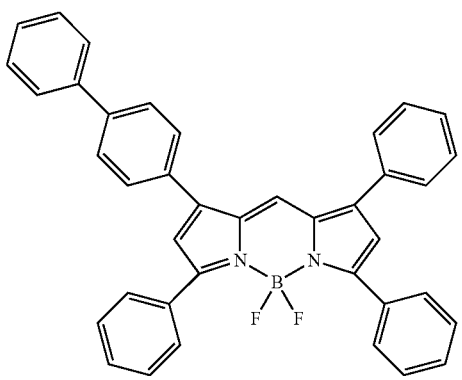
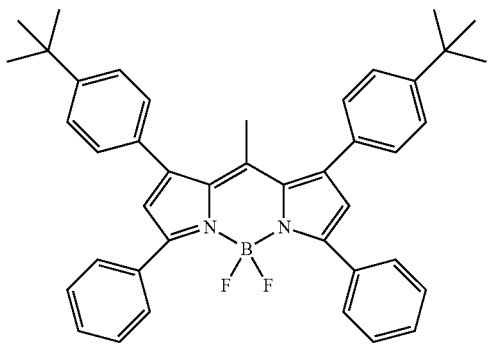

81
-continued
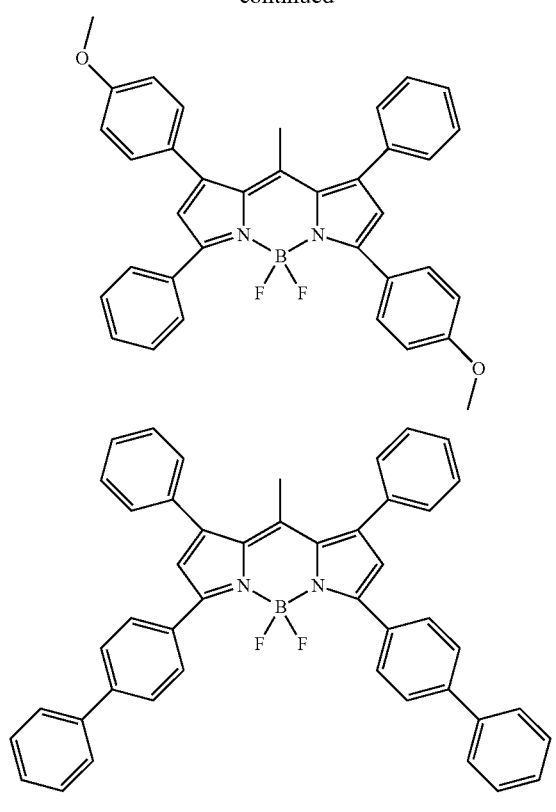
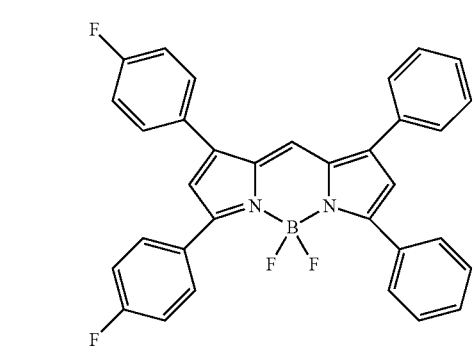
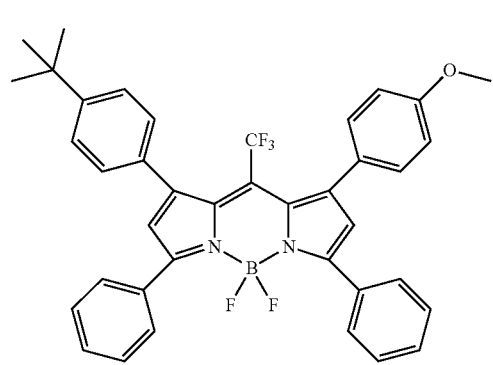
82
-continued
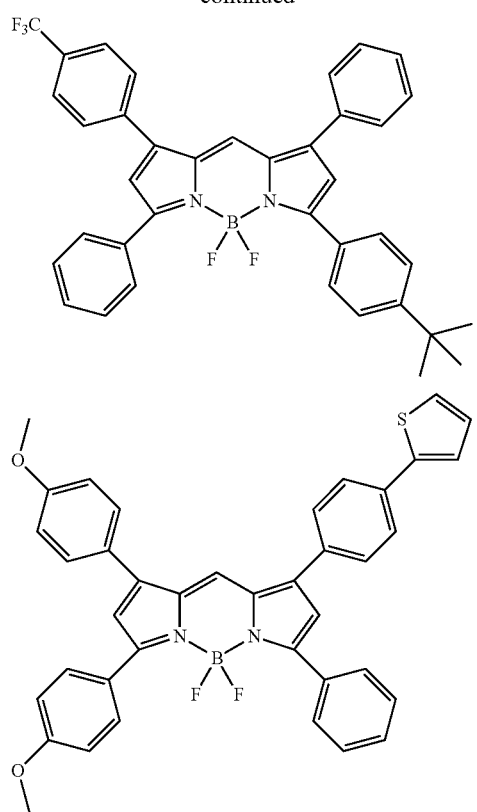
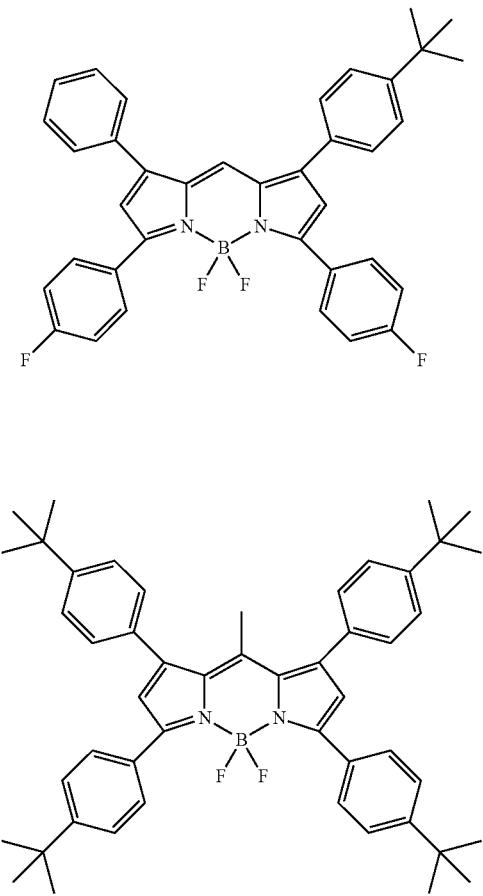

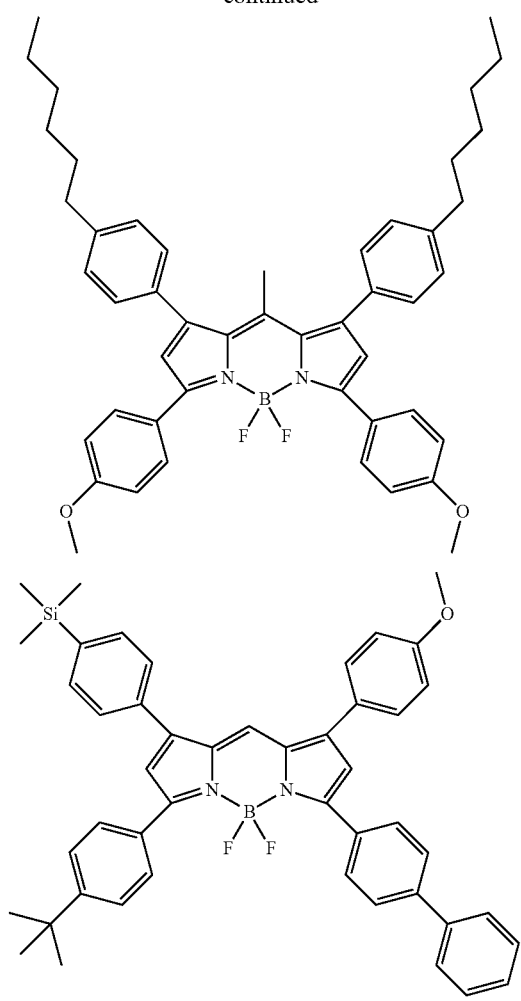
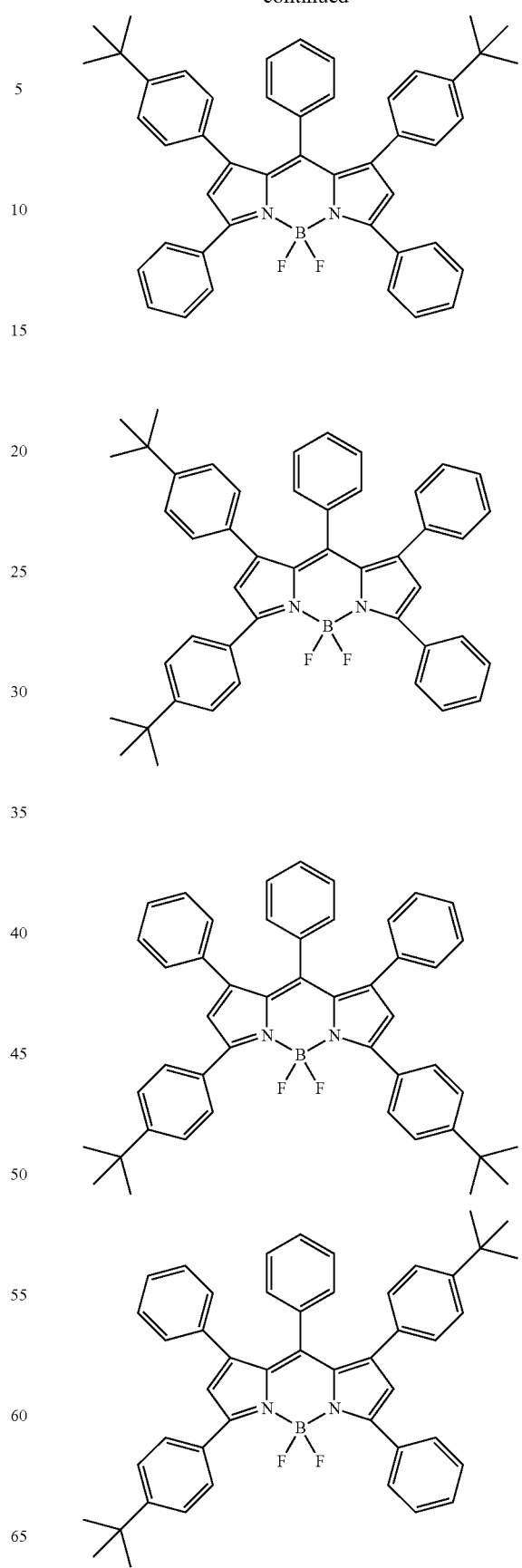

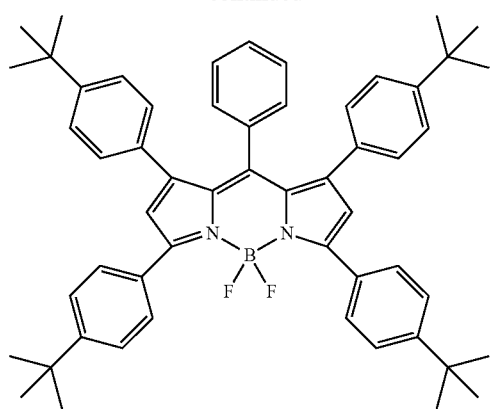
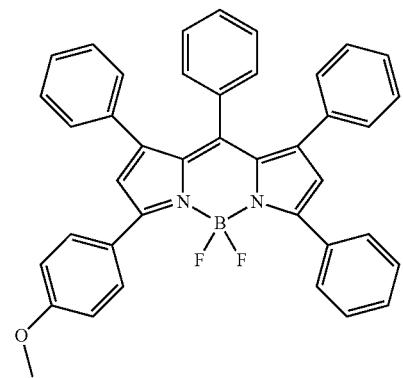
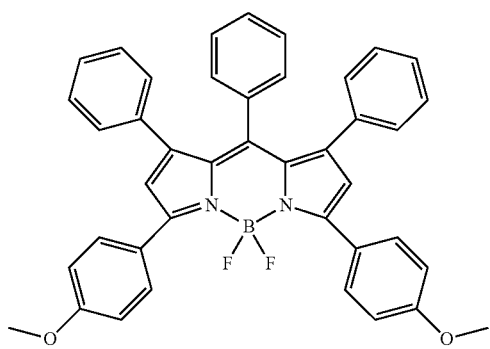
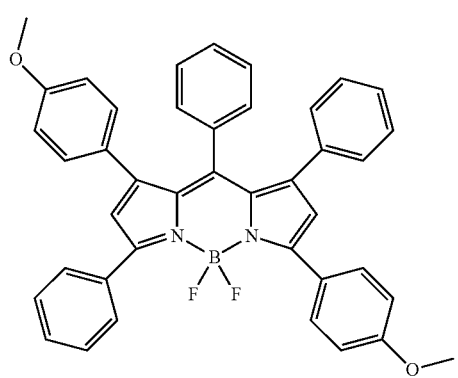
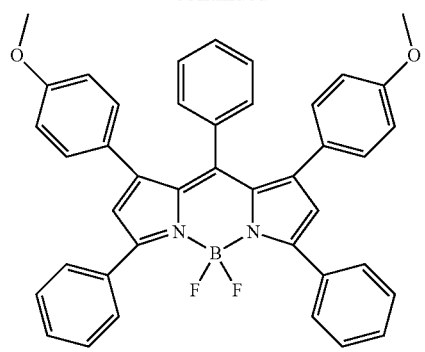
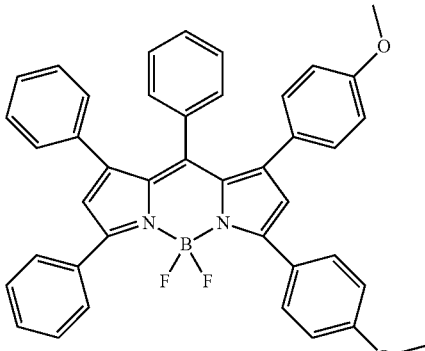
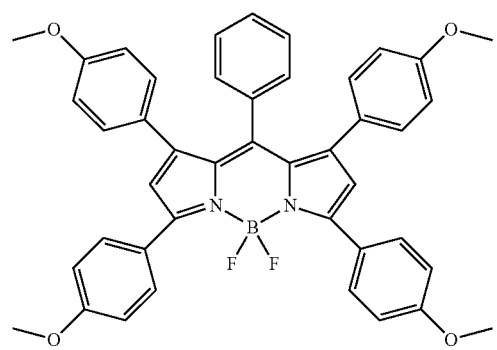
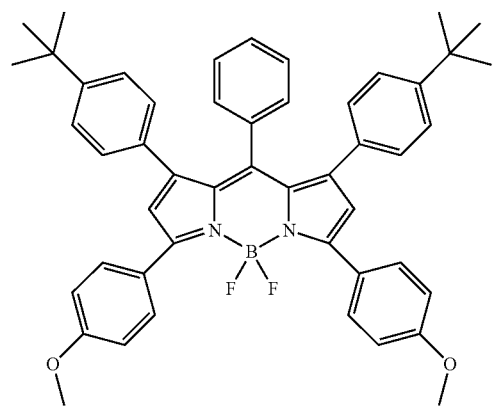

87
-continued
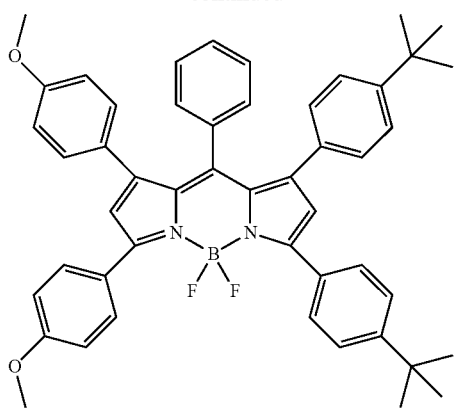
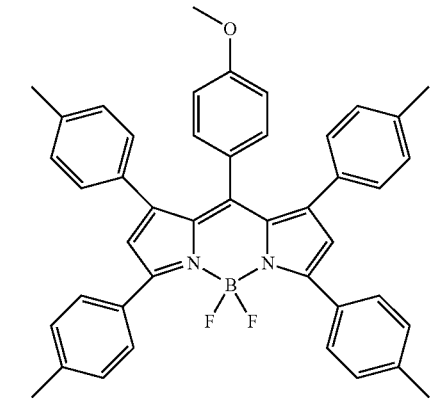
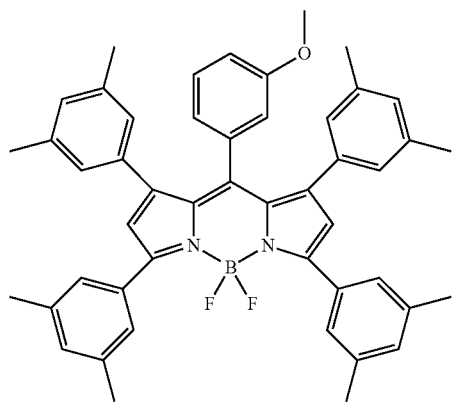
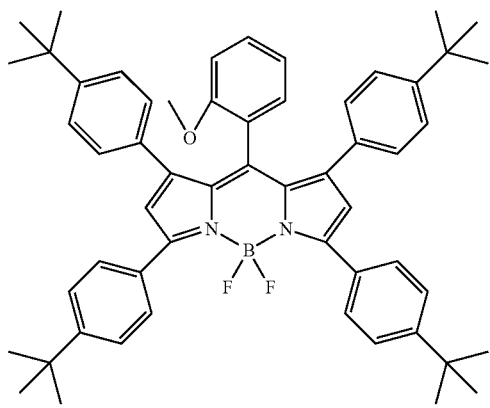
88
-continued
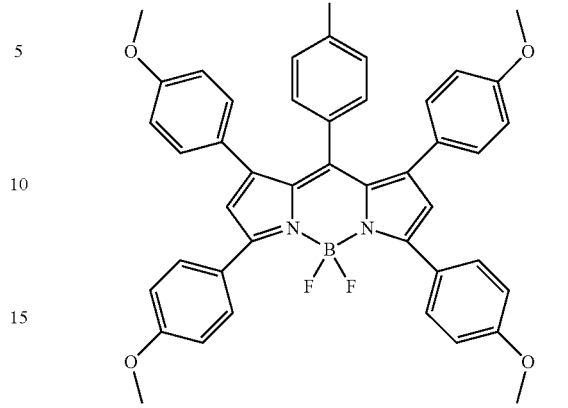
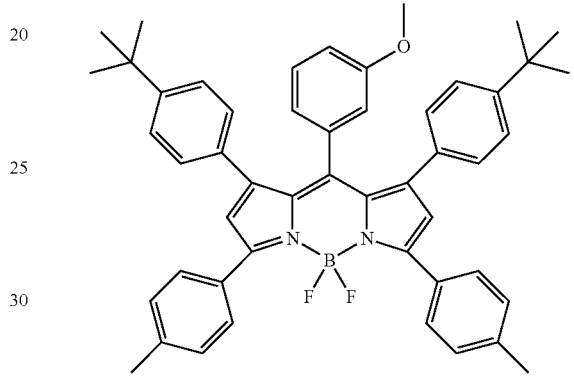
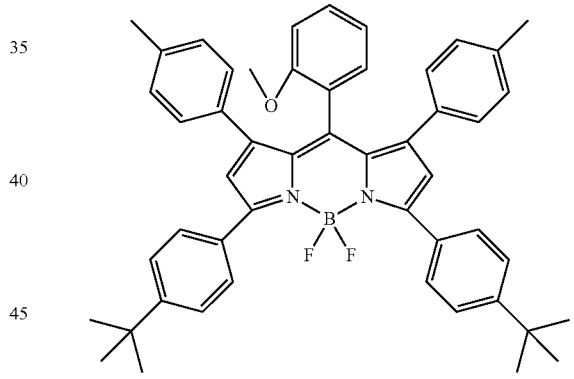
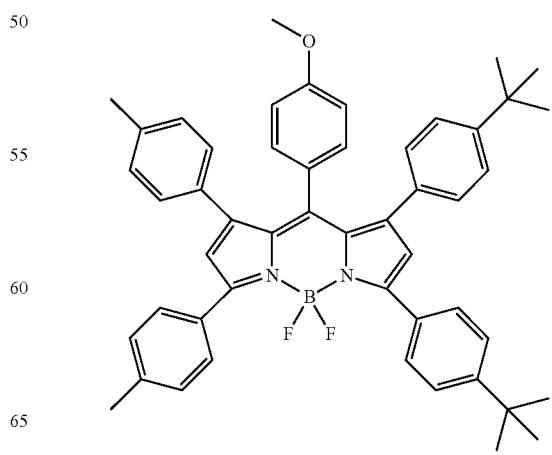

89
-continued
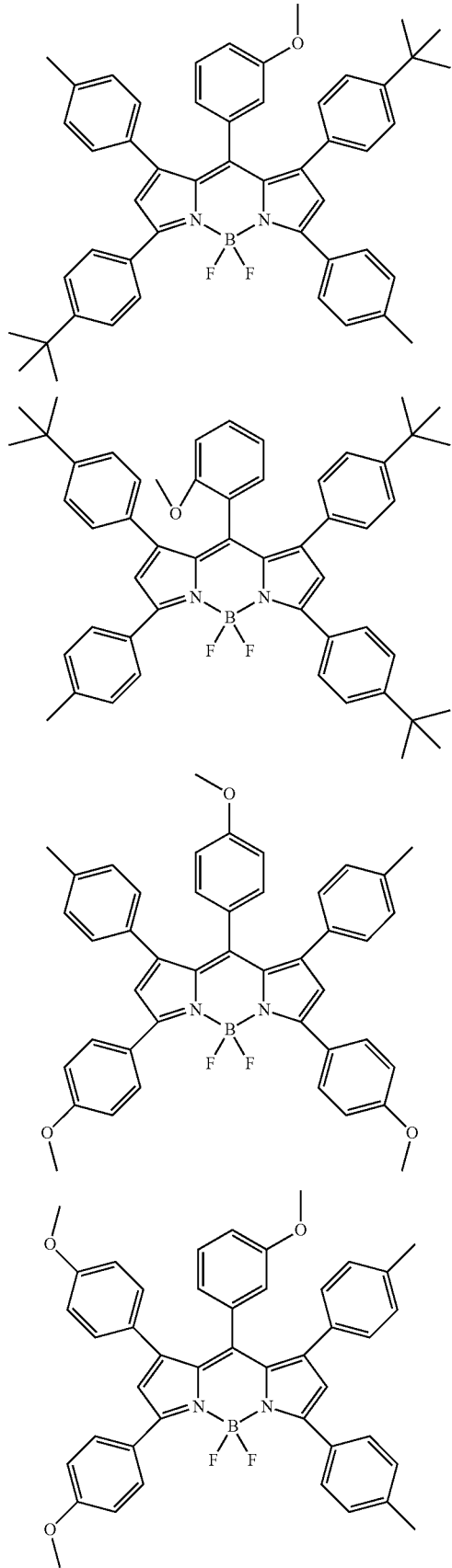
90
-continued
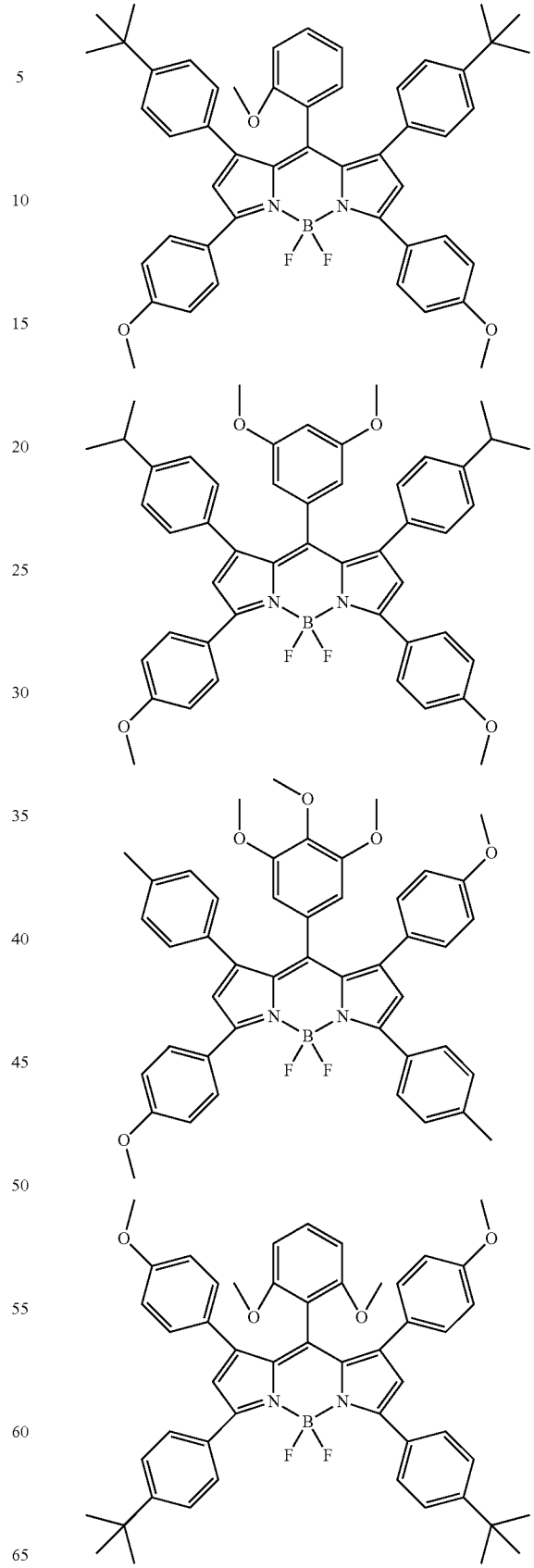

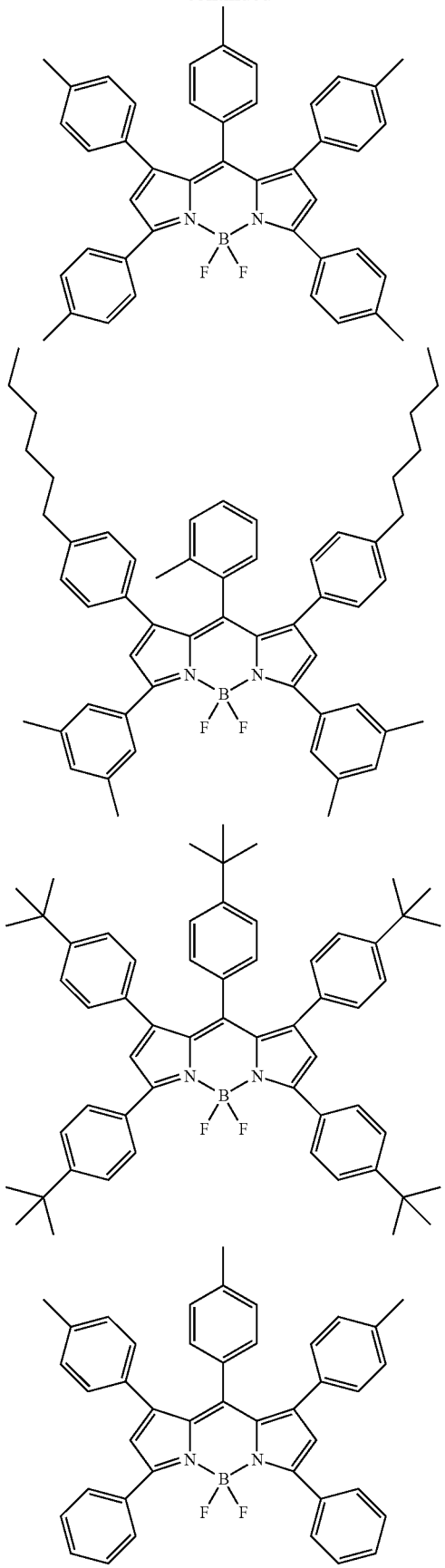
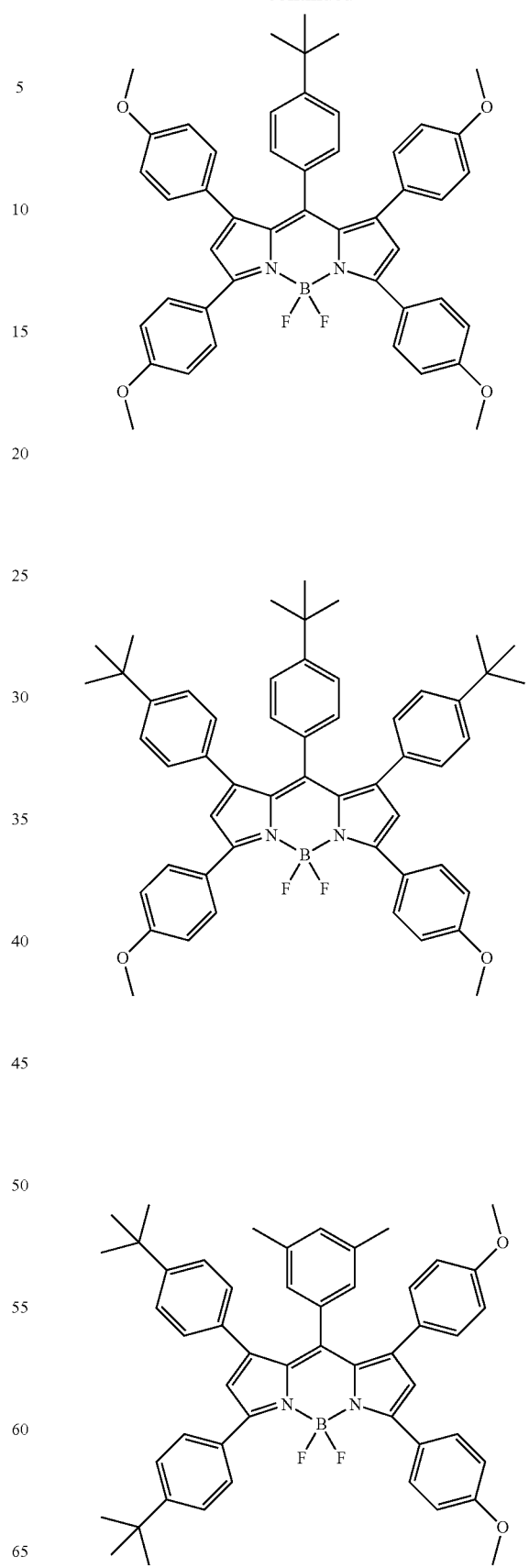

93
-continued
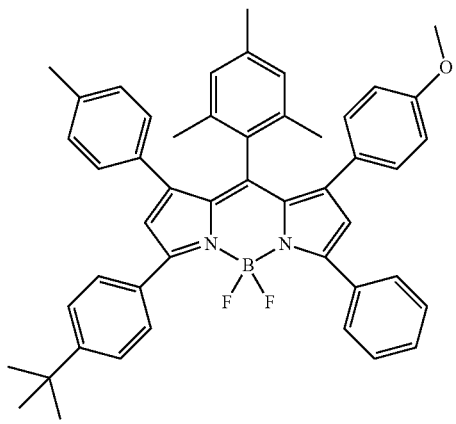
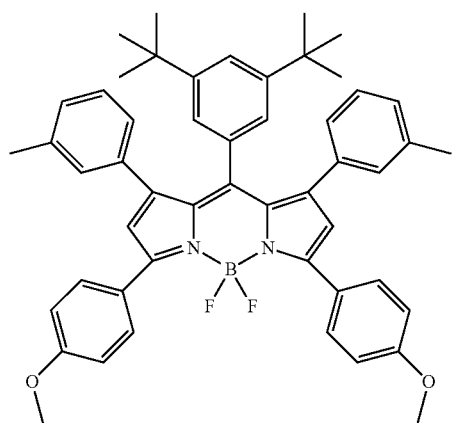
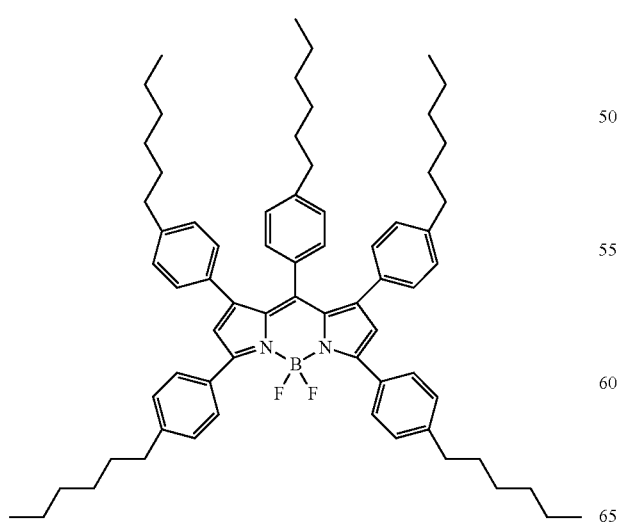
94
-continued
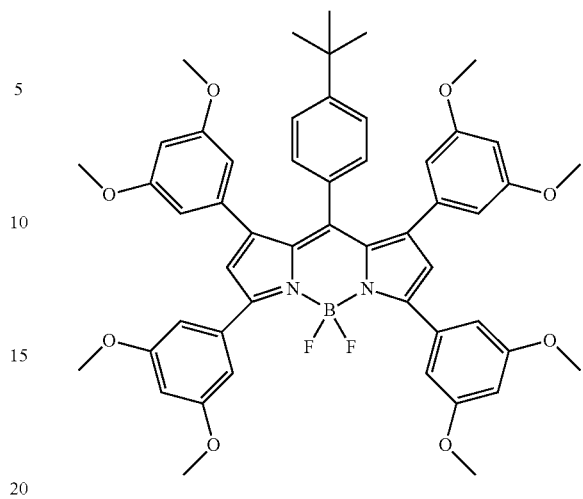
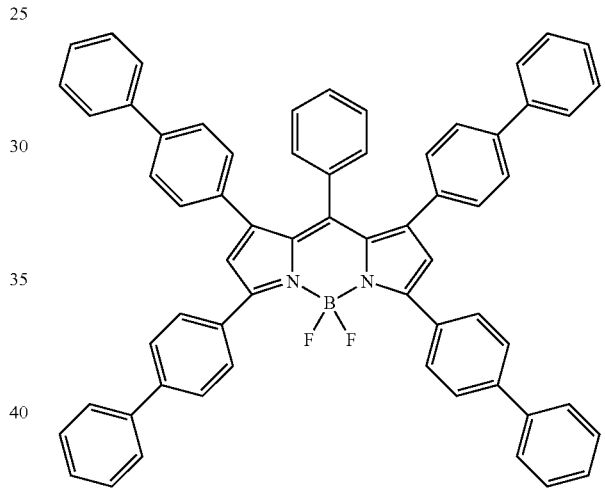
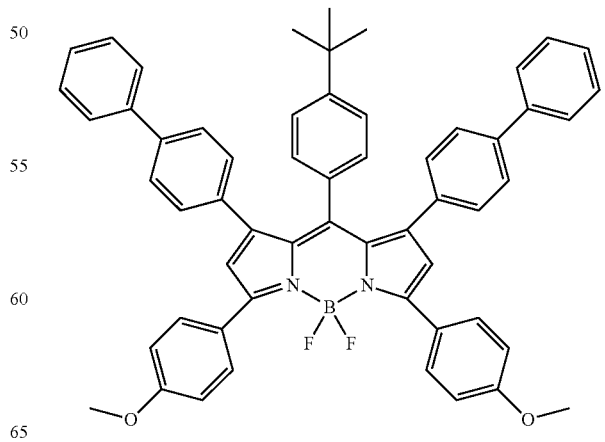

95
-continued
96
-continued
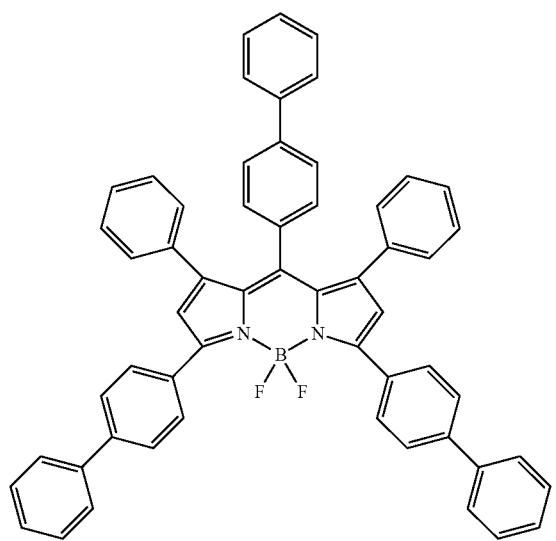
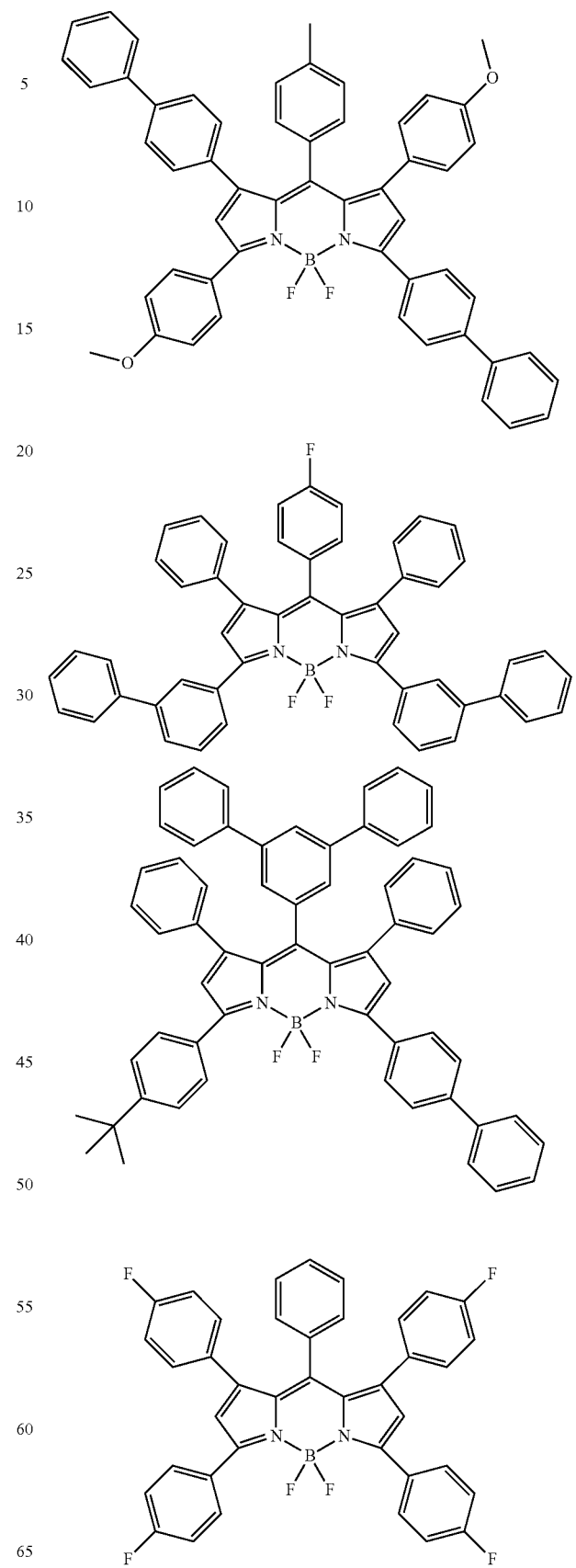

97
-continued
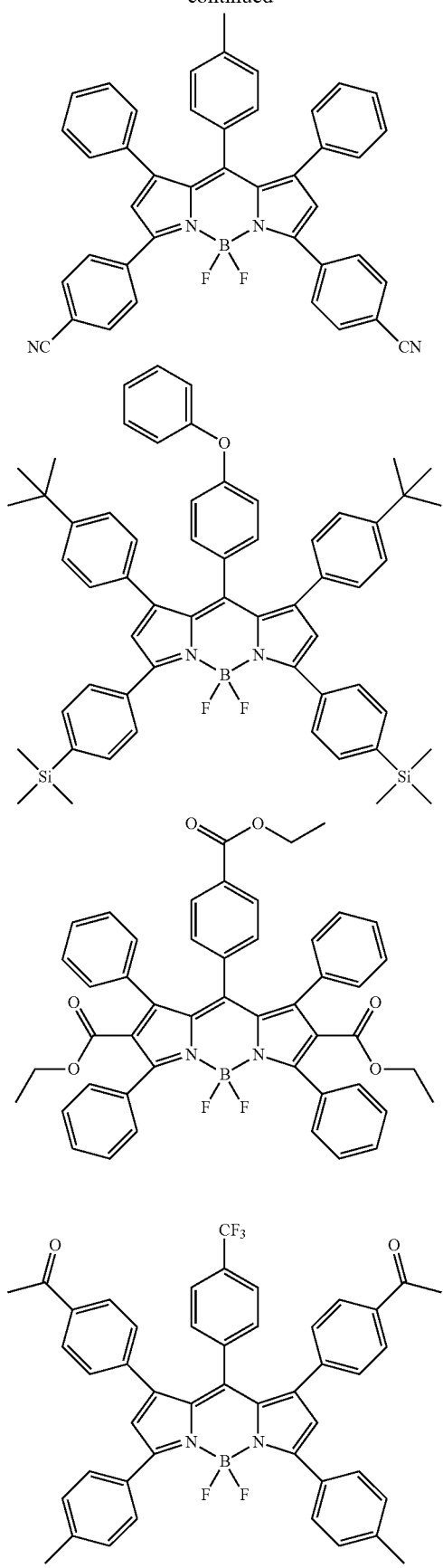
98
-continued
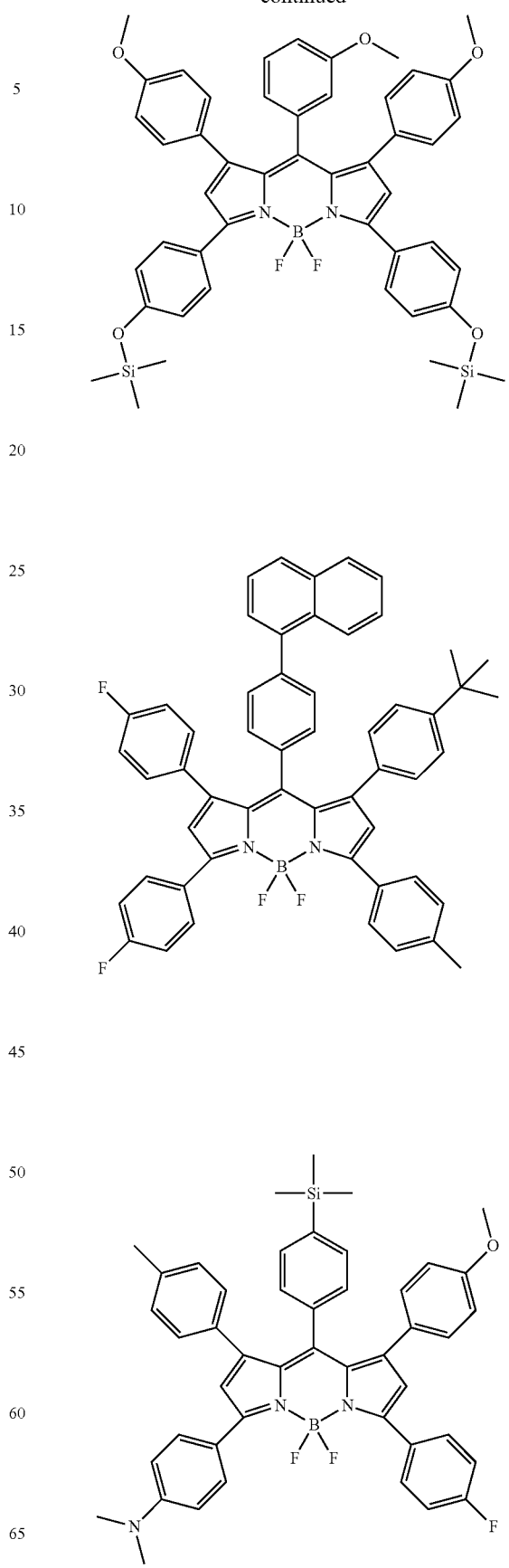

99
-continued
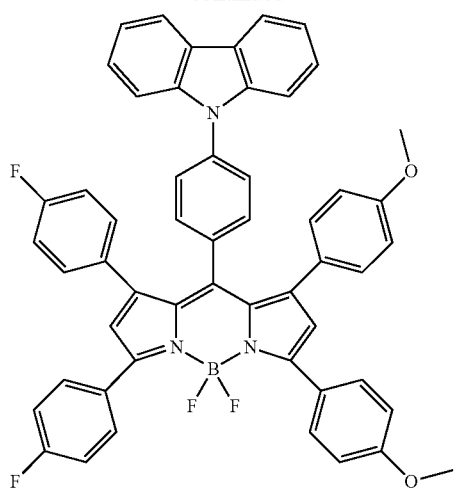
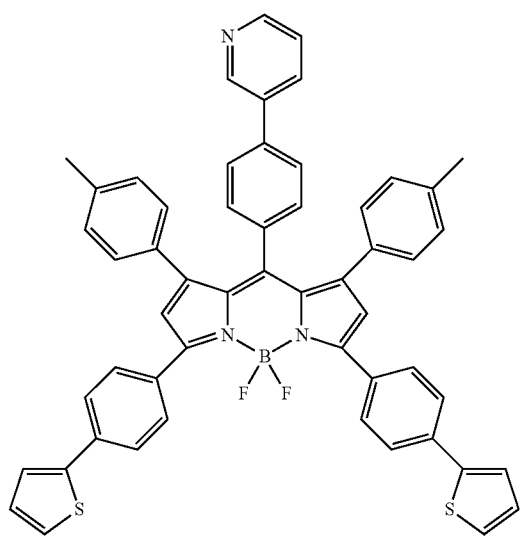
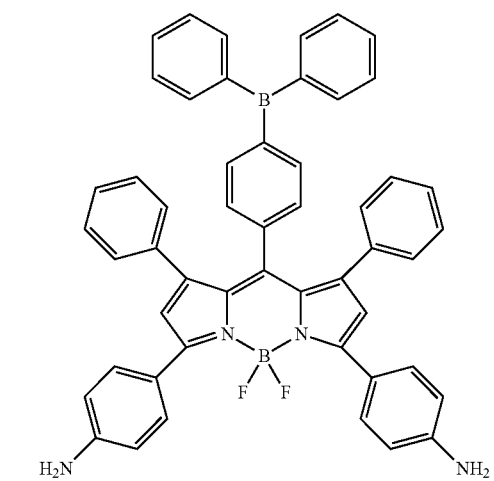
100
-continued
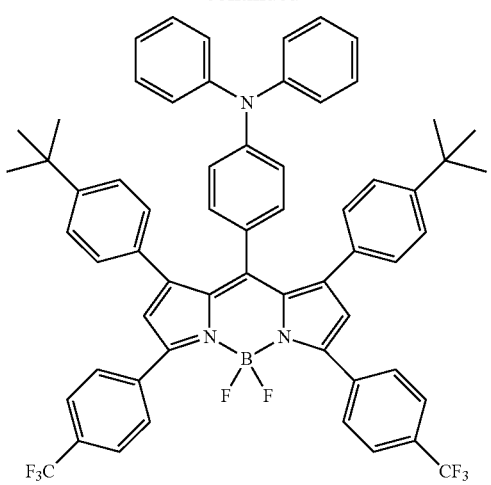
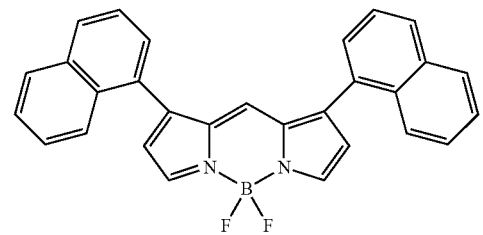
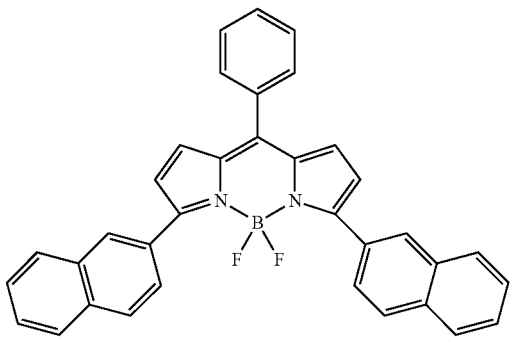
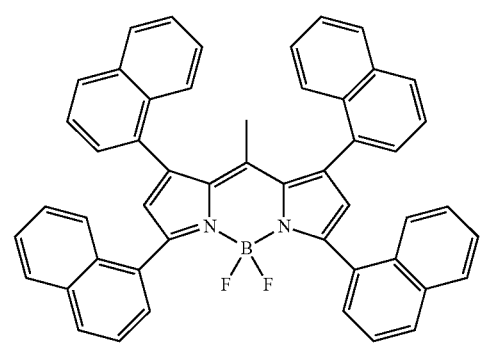

101
-continued
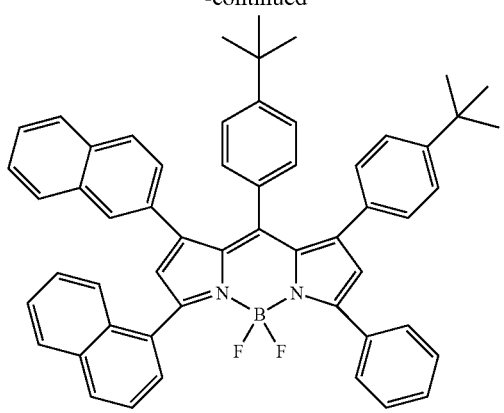
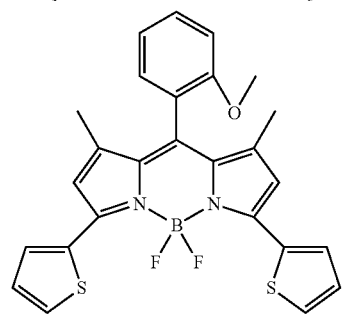
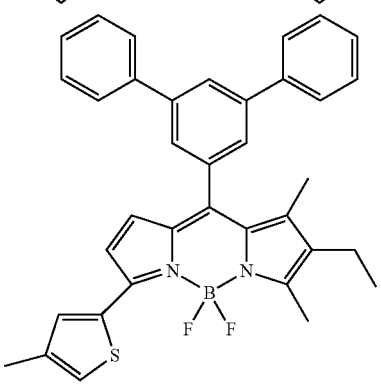
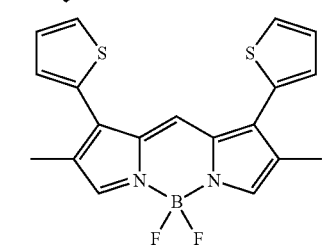
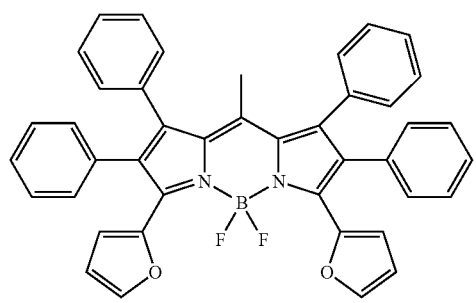
102
-continued
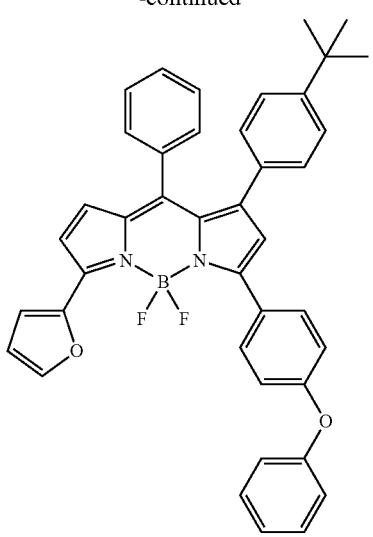
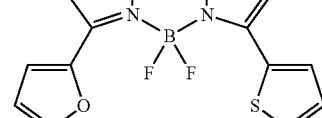
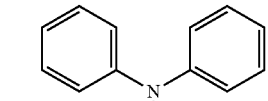
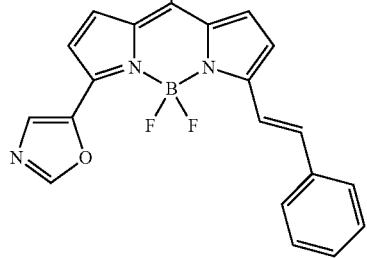

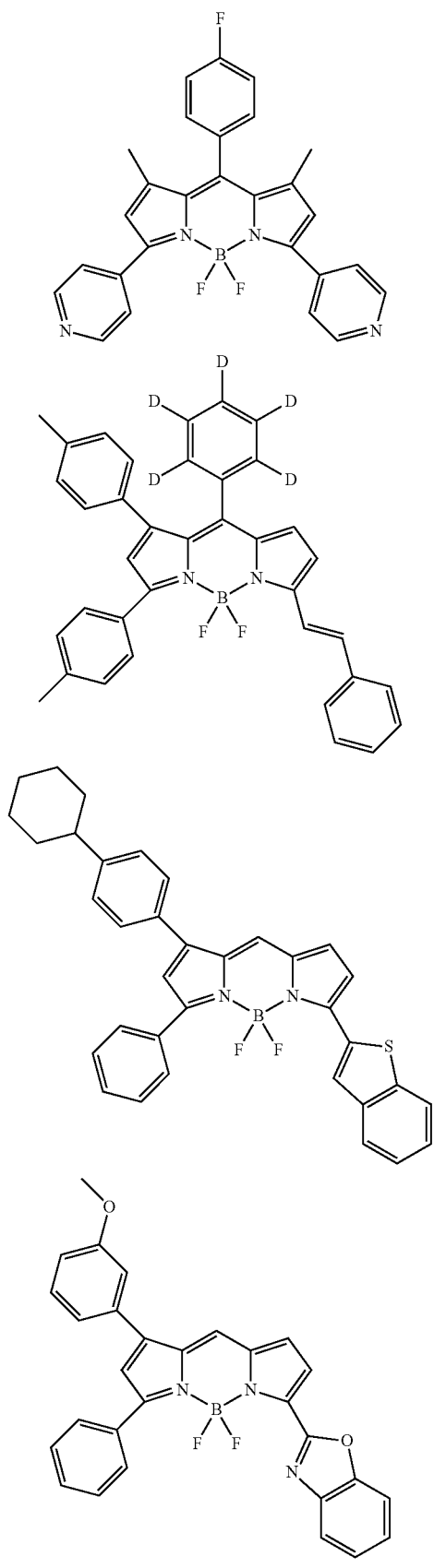
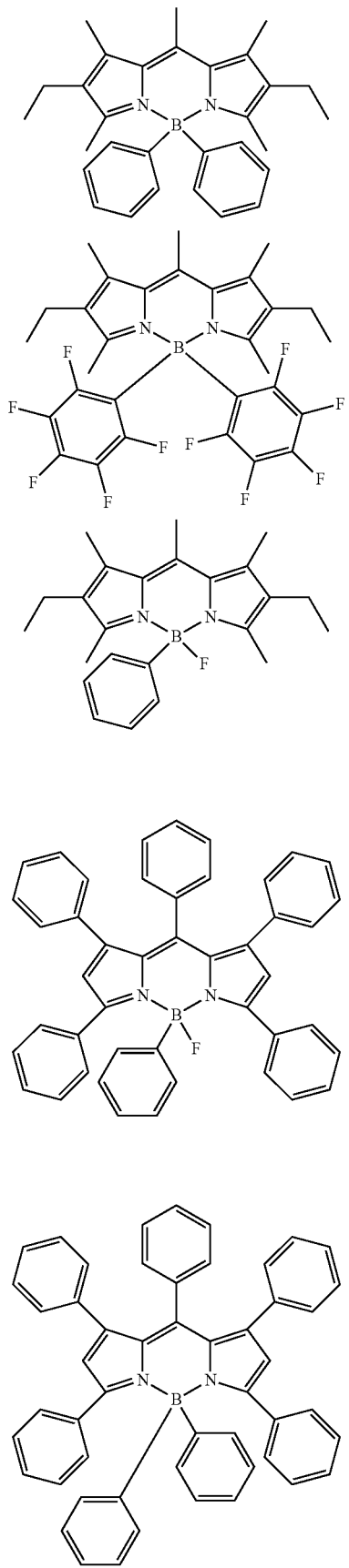

105
-continued
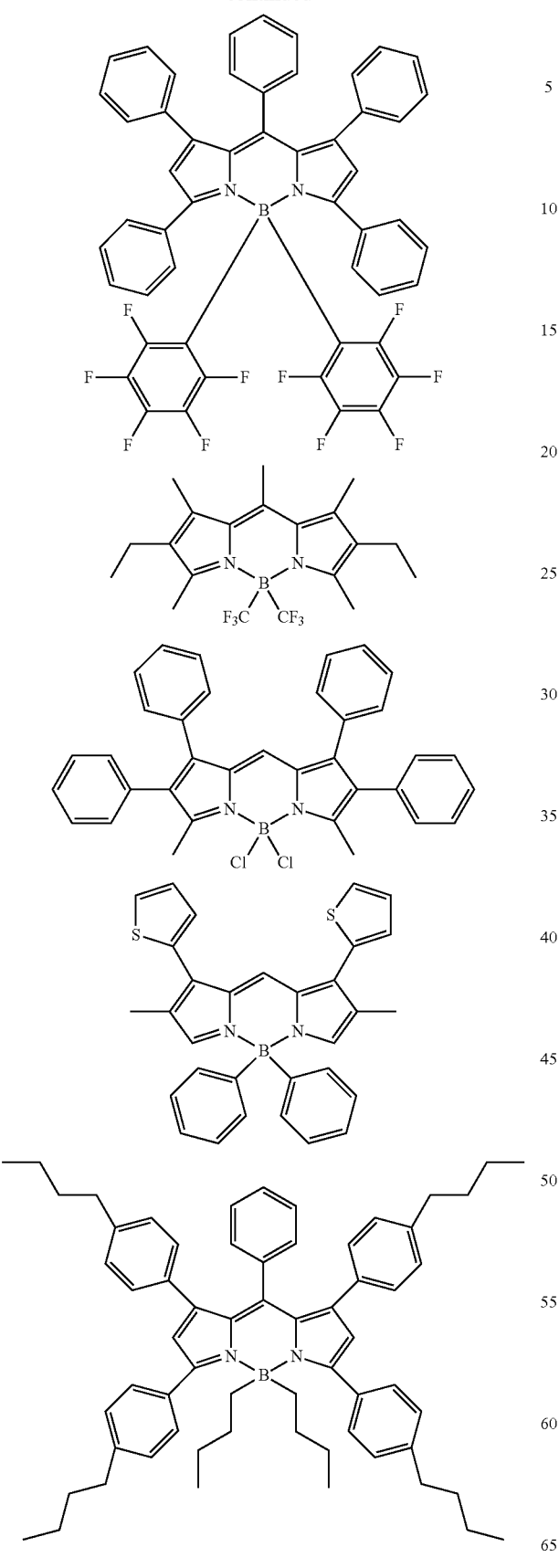
106
-continued
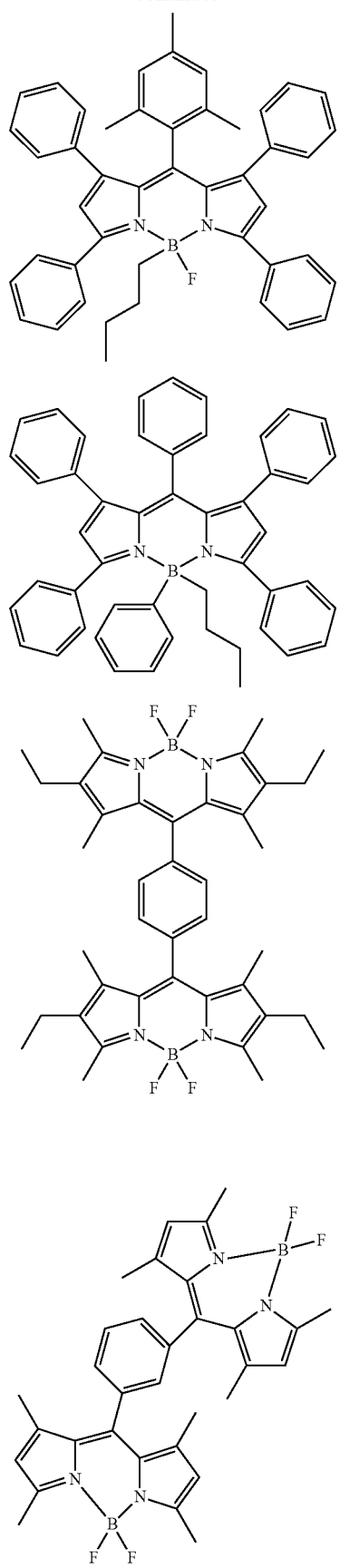

107
-continued
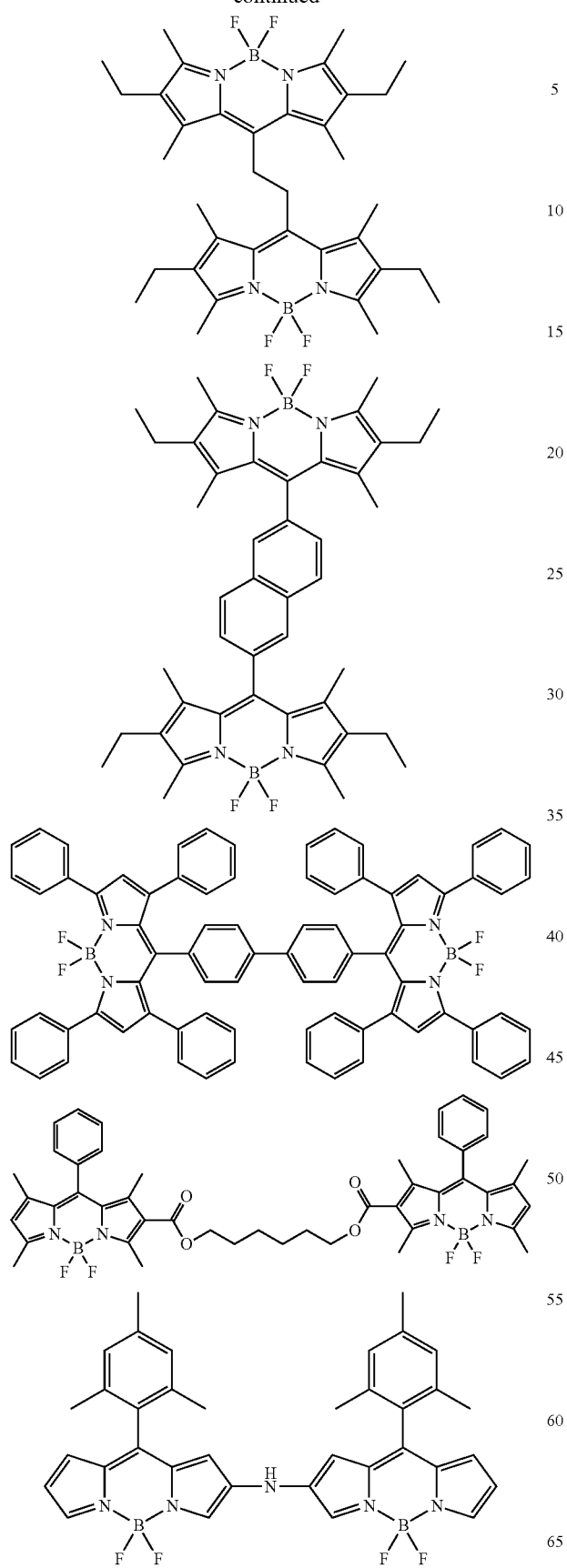
108
-continued
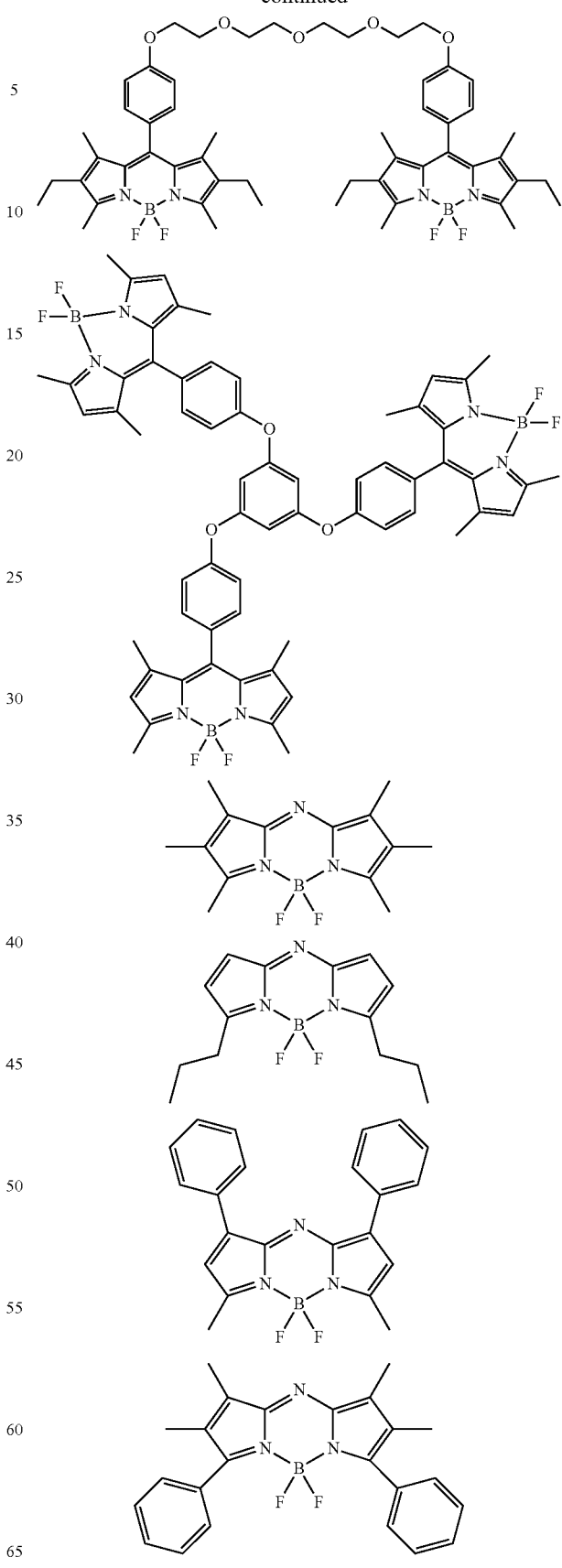

109
-continued
110
-continued
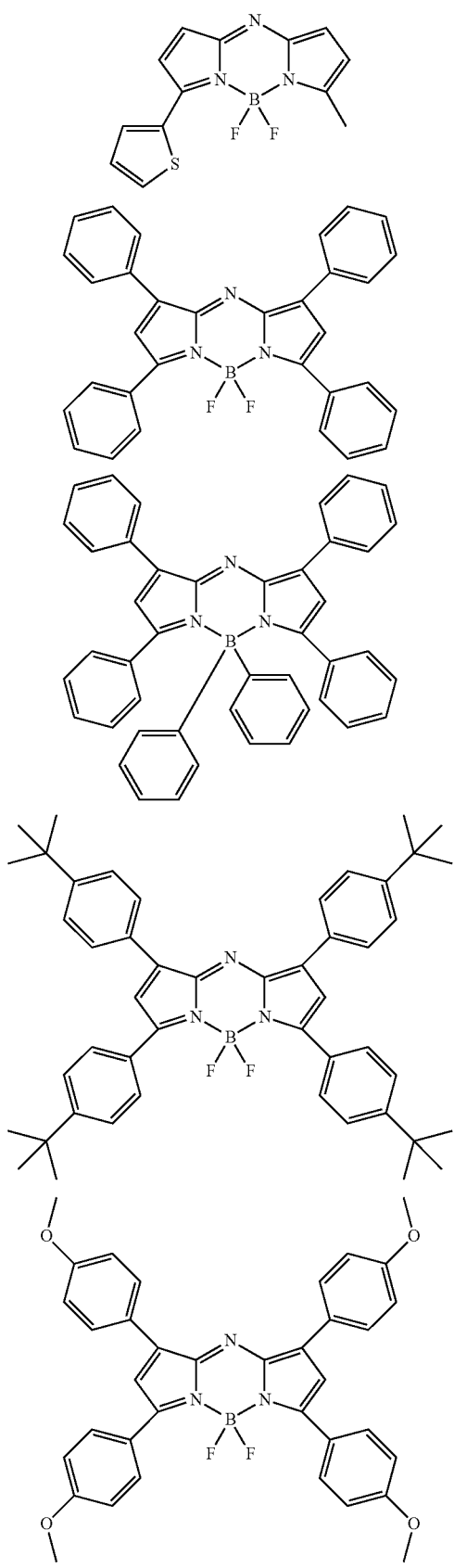
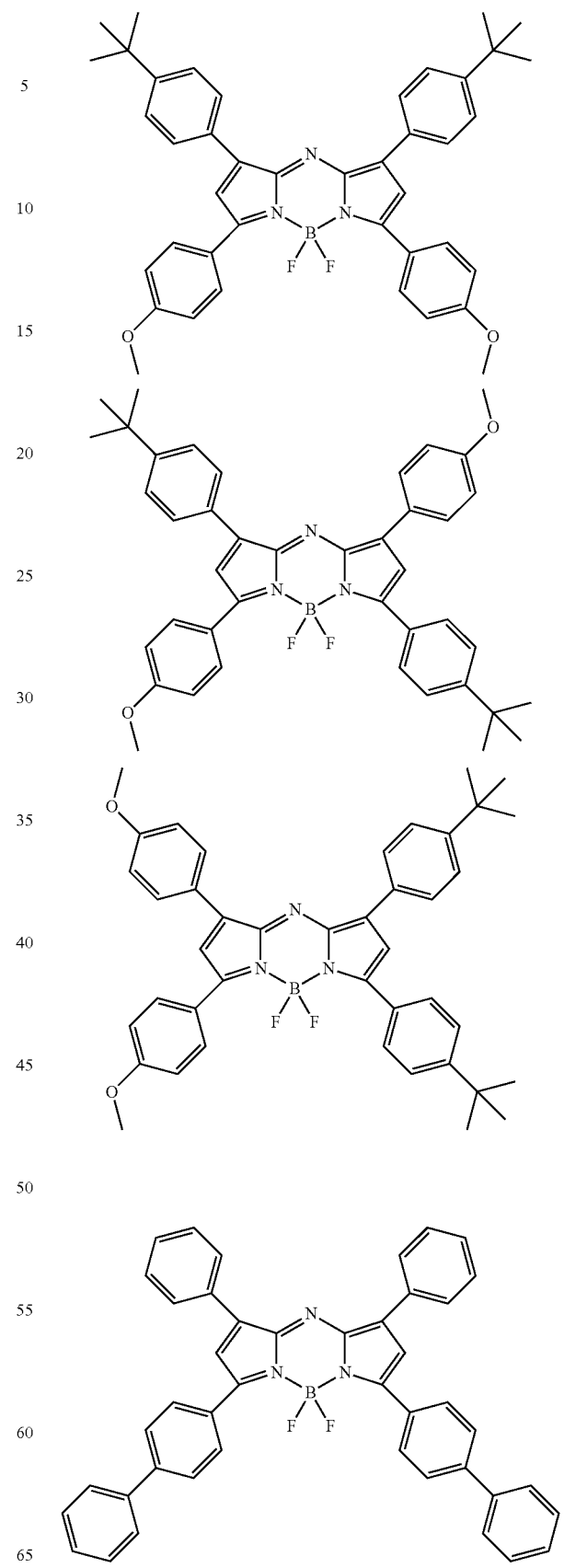

-continued

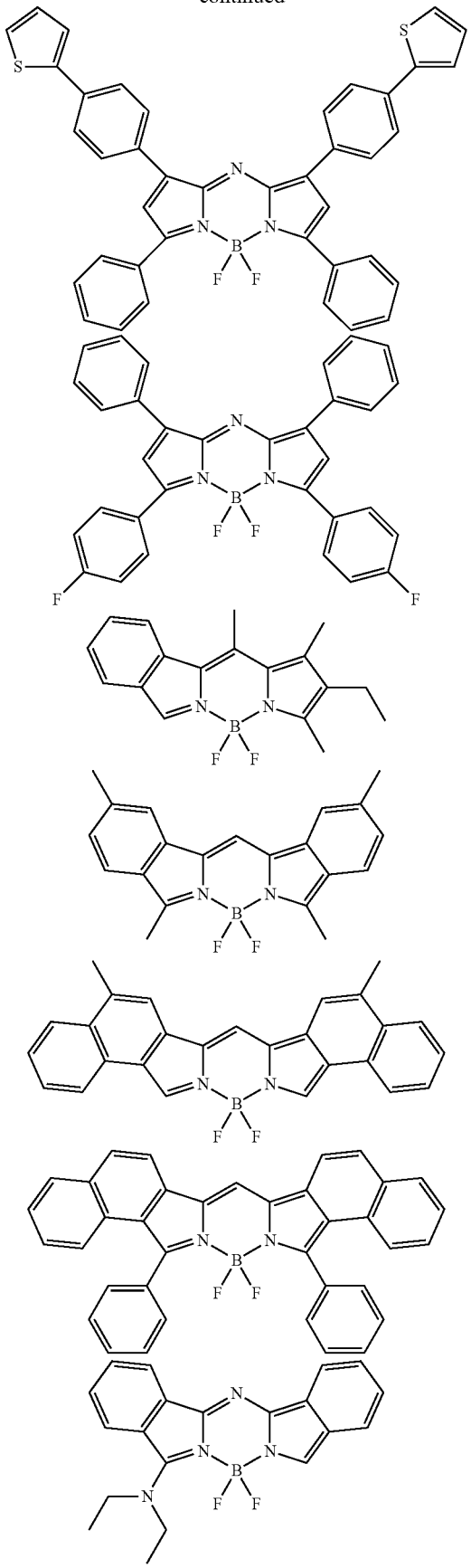

-continued

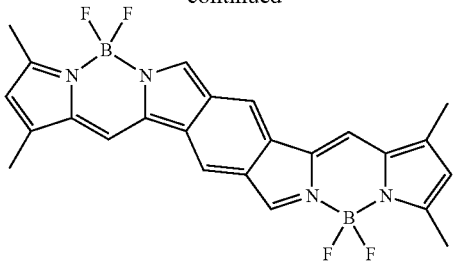

The compound of Formula (1) can be produced by, for example, a method described in Patent Literature 4 (Japanese Unexamined Patent Application Publication (Translation of PCT Application) No. H8-509471) or a method described in Patent Literature 5 (Japanese Patent Application Laid-open No. 2000-208262). Specifically, by reacting a pyrromethene compound with a metal salt in the co-presence of a base, a pyrromethene-based metal complex as a target can be obtained.

The synthesis of a pyrromethene-boron fluoride complex can be performed with reference to, for example, a method described in Non-Patent Literature 1 (J. Org. Chem., vol. 64, No. 21, pp. 7813-7819 (1999)), or Non-Patent Literature 2 (Angew. Chem., Int. Ed. Engl., vol. 36, pp. 1333-1335 (1997)). Examples of the method for the synthesis include, but are not limited to, a method of heating a compound of the following Formula (3) and a compound of the following Formula (4) in 1,2-dichloroethane in the presence of phosphorus oxychloride, and then reacting the resultant with a compound of the following Formula (5) in 1,2-dichloroethane in the presence of triethylamine. Here, $R^1$ to $R^9$ are the same as those described above. J refers to halogen.

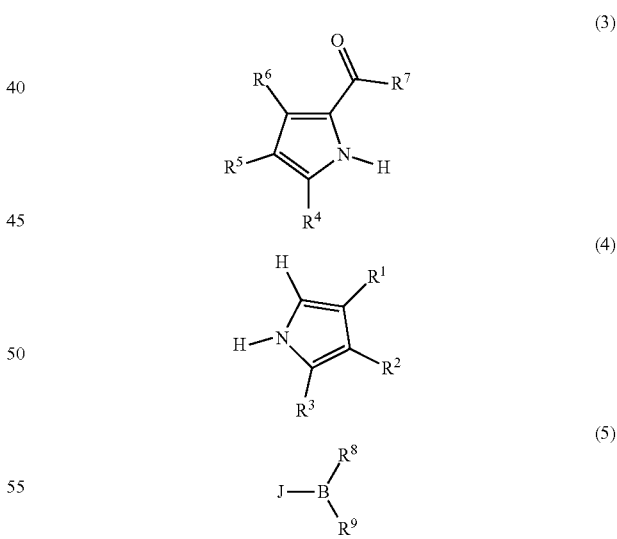

Furthermore, for introducing an aryl group or a heteroaryl group, a method of producing a carbon-carbon bond by making use of a coupling reaction between a halogenated derivative and a boronic acid or a boronic ester derivative can be mentioned, but the present invention is not limited to this method. Similarly, for introducing an amino group or a carbazolyl group, a method of producing a carbon-nitrogen bond by making use of a coupling reaction between a halogenated derivative and an amine or a carbazole derivative in the presence of a metal catalyst such as palladium can be mentioned, but the present invention is not limited to this method.

The color conversion film may include another compound, as needed, other than the compound of Formula (1). For example, the color conversion composition may include an assist dopant, such as rubrene, in order to further enhance the efficiency of energy transfer from a light source to the compound of Formula (1). When a luminescent color other than a luminescent color of the compound of Formula (1) is intended to be added, a desired organic luminescent material as described above may be added. Besides the above-mentioned organic luminescent materials, other known luminescent materials, such as inorganic fluorescent materials, fluorescent pigments, fluorescent dyes, and quantum dots, can be added in combination.

Examples of the organic luminescent material, other than the compound of Formula (1), are illustrated below, but the organic luminescent material is not limited to these examples.

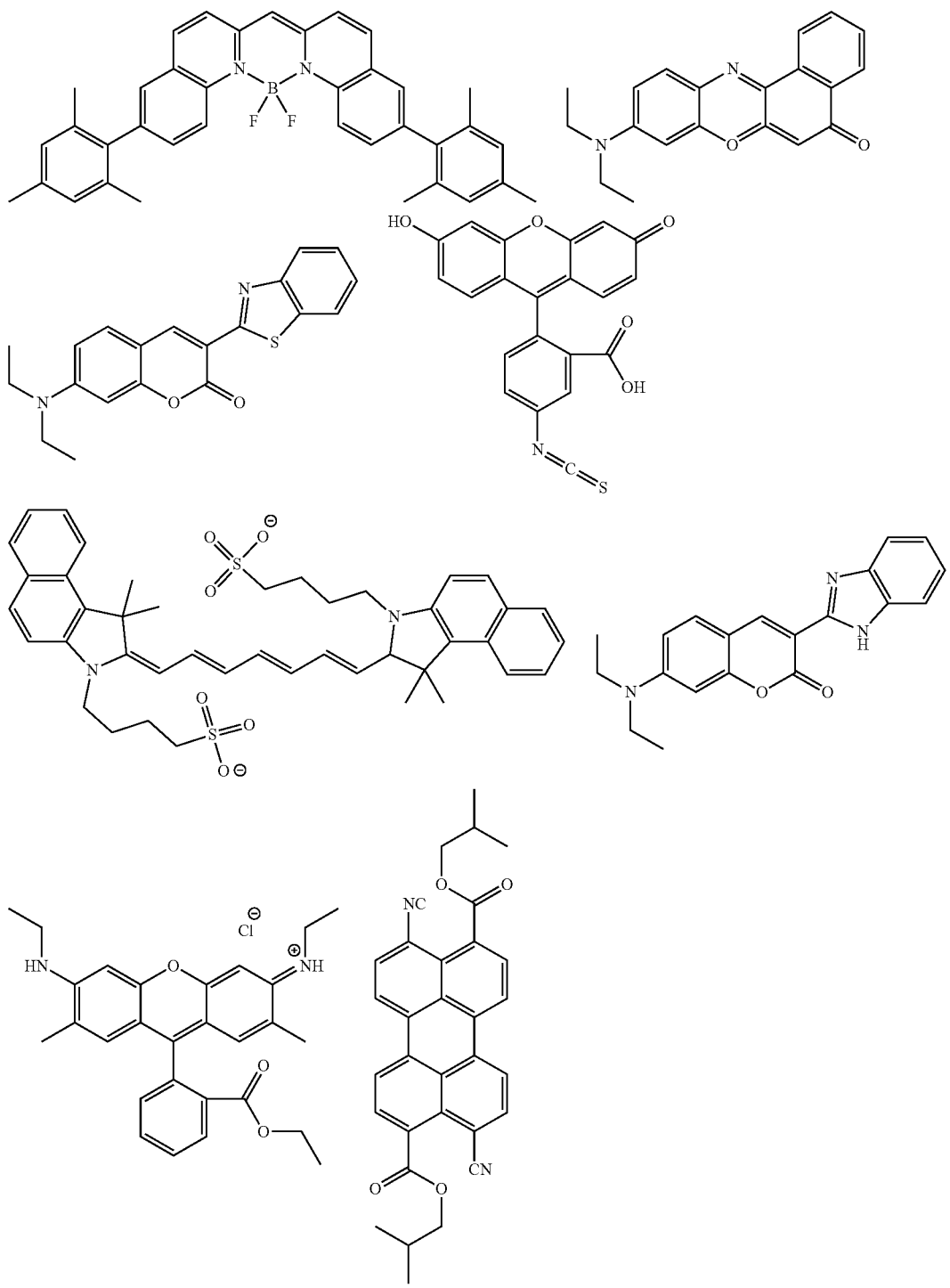

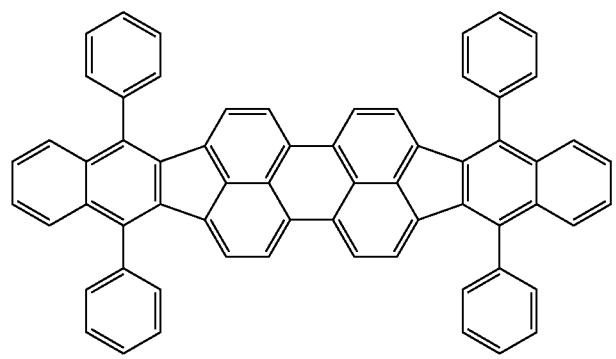
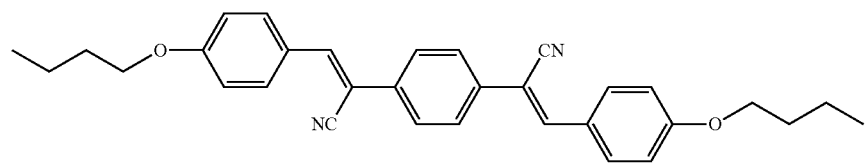
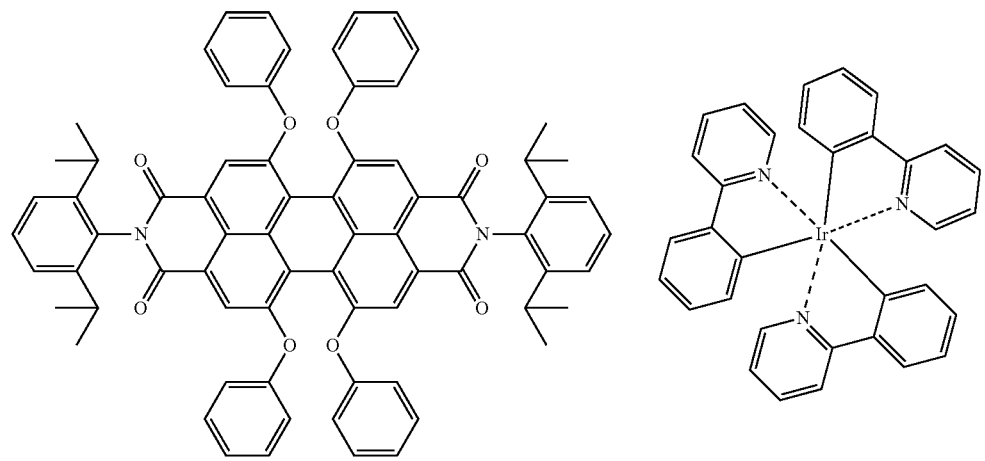
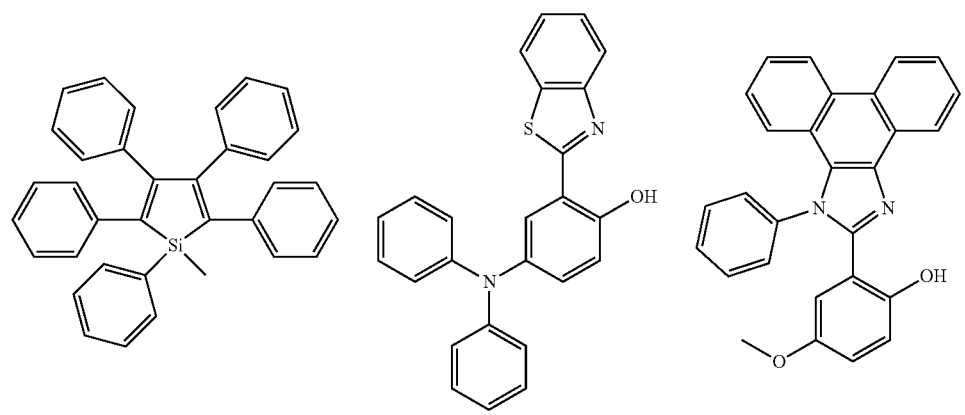

-continued

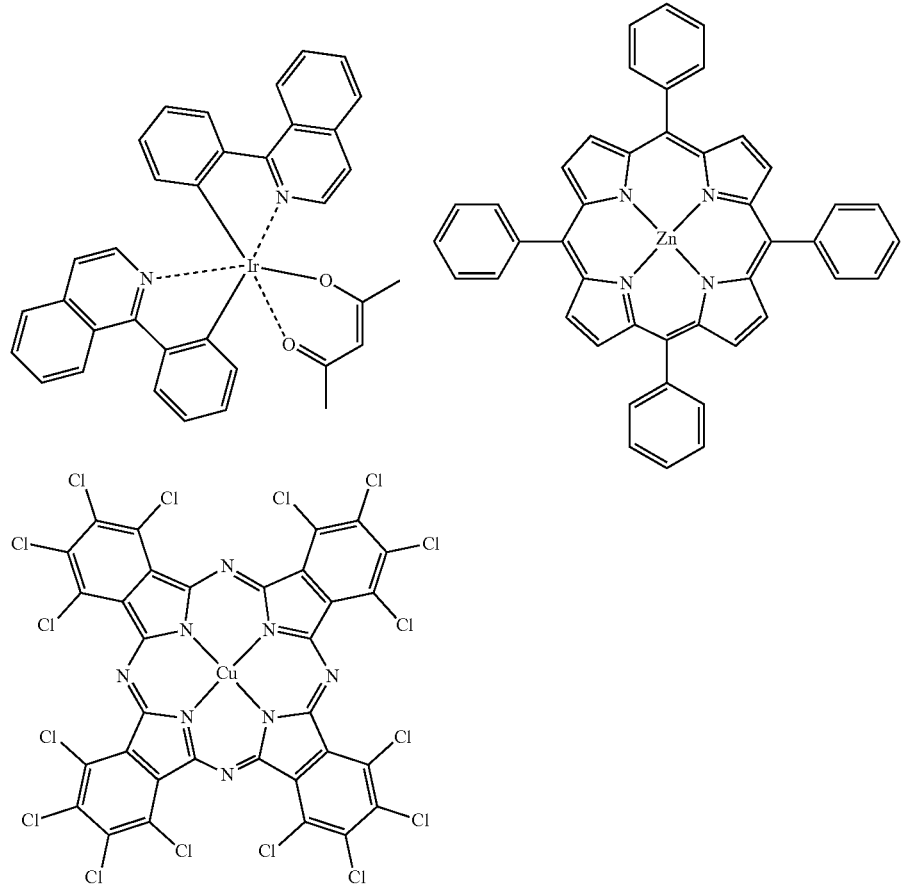

The content of the organic luminescent material in the color conversion film depends on the molar absorption coefficient, luminescence quantum yield, and absorption intensity at an excitation wavelength of the compound, and the thickness and transmittance of a sheet to be produced, but is usually $1.0 \times 10^{-4}$ part by weight to 30 parts by weight, more preferably $1.0 \times 10^{-3}$ part by weight to 10 parts by weight, and particularly preferably $1.0 \times 10^{-2}$ part by weight to 5 parts by weight, with respect to 100 parts by weight of a binder resin component.

(Binder Resin)

The color conversion film preferably includes a binder resin. The binder resin is only required to form a continuous phase and be excellent in, for example, moldability, transparency, and heat resistance. Examples of the binder resin include known resins, such as photocurable resist materials having a reactive vinyl group, such as acrylic acid-based, methacrylic acid-based, polyvinyl cinnamate-based, and cyclic rubber-based photocurable resist materials; an epoxy resin, a silicone resin (including a cured (crosslinked) organopolysiloxane such as silicone rubber and silicone gel), a urea resin, a fluororesin, a polycarbonate resin, an acrylic resin, a urethane resin, a melamine resin, a polyester resin, a polyvinyl resin, a polyamide resin, a phenol resin, a polyvinyl an alcohol resin, a polyvinyl butyral resin, a cellulose resin, an aliphatic ester resin, an aromatic ester resin, an aliphatic polyolefin resin, an aromatic polyolefin resin, and a cyclic polyolefin resin. Alternatively, copolymer resins of the above-mentioned resins may be used. By appropriately designing the above-mentioned resins, resins useful for the color conversion film can be obtained.

Among these resins, thermosetting resins are more preferred in terms of the ease of film forming process. From the viewpoints of transparency and heat resistance, an epoxy resin, a silicone resin, an acrylic resin, a polyester resin, and a mixture thereof may be preferably used.

Furthermore, among the above-mentioned thermoplastic resins, a polyester resin is particularly preferred. When a polyester resin is used as the binder resin, the absorption spectrum of the organic luminescent material is shifted to a longer wavelength, and, the long wavelength component of light emission from the green phosphor is absorbed in a higher ratio. Thus, the light emission wavelength peak of the green phosphor is shifted to a shorter wavelength, and the full width at half maximum decreases and accordingly the range of color reproduction is further expanded.

Furthermore, compared with the use of an epoxy resin, a silicone resin, and an acrylic resin, the use of a polyester resin as the binder resin enhances the dispersibility of the organic luminescent material and subsequently prevents self-absorption, and accordingly a color conversion film with high brightness can be achieved.

A polyester resin has good adhesion to a PET base material. Therefore, the use of a polyester resin as the binder resin subsequently prevents the peeling of a color conversion layer from the base material, the peeling occurring during the cut processing of a color conversion film when an epoxy resin, a silicone resin, or an acrylic resin is used.

As additives, a dispersant and a leveling agent for stabilizing a coating, and an adhesion assistant such as a silane coupling agent as a modifier for film surface may be added. Furthermore, inorganic particles such as silica particles and silicone fine particles as a color conversion material settling inhibitor may be added.

(Other Components)

Besides the organic luminescent material and the binder resin, the color conversion film may include an antioxidant; a processing-and-thermal stabilizer; a lightfast stabilizer such as an ultraviolet light absorbent; a dispersant and a leveling agent for stabilizing a coating; a plasticizer; a cross-linking agent such as an epoxy compound; a curing agent such as amine, acid anhydride, and imidazole; an adhesion assistant such as silane coupling agents as a modifier for sheet surface; and inorganic particles such as silica particles and silicone fine particles and a silane coupling agent as a color conversion material settling inhibitor.

The color conversion film is configured such that the organic luminescent material included in the color conversion composition is excited by a light source and emits light having a wavelength different from that of the light source to perform color conversion of the light. Since the cycle of excitation-light emission is repeated, the probability of generating singlet oxygen resulting from interaction between a generated excited species and oxygen included in the composition increases. Thus, the probability of the organic luminescent material colliding with singlet oxygen also increases, and consequently, the deterioration of the organic luminescent material easily proceeds.

Organic luminescent materials are more easily affected by singlet oxygen, compared with inorganic luminescent materials. In particular, the compound of Formula (1) is higher in reactivity with singlet oxygen than a compound having a condensed aryl ring such as perylene or a derivative thereof, and hence the durability of the compound of Formula (1) is affected more strongly by singlet oxygen.

Therefore, by quickly deactivating generated singlet oxygen by a singlet oxygen quencher, the durability of the compound of Formula (1) with high luminescence quantum yield and excellent color purity can be enhanced.

Examples of a compound serving as the singlet oxygen quencher include, but are not limited to, specific tertiary amines, catechol derivatives, and nickel compounds. These lightfast stabilizers may be used alone or in combination of two or more of them.

(Configuration of Color Conversion Film)

Figure 6A:
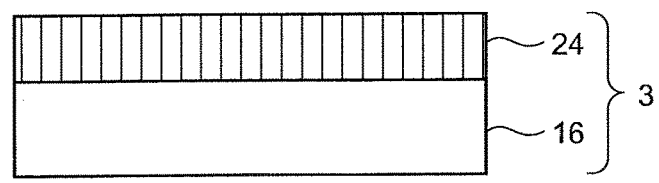
FIG. 6A is a schematic sectional view illustrating a configuration example of a color conversion film in the light source unit according to an embodiment of the present invention.
Figure 6B:
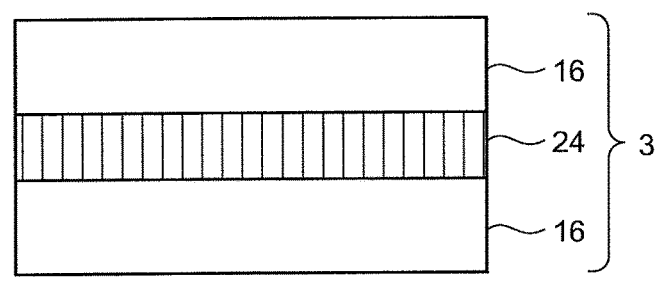
FIG. 6B is a schematic sectional view illustrating another configuration example of the color conversion film in the light source unit according to an embodiment of the present invention.
Figure 6C:
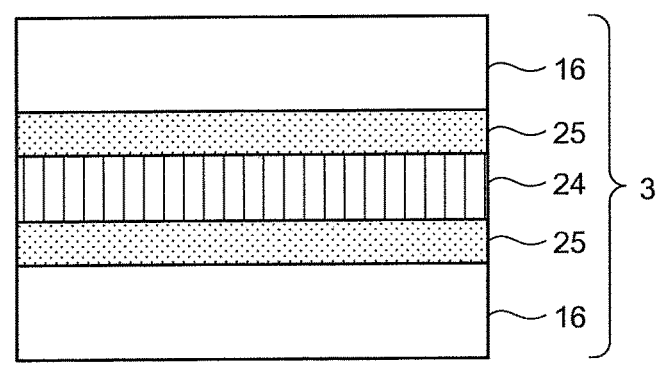
FIG. 6C is a schematic sectional view illustrating another configuration example of the color conversion film in the light source unit according to an embodiment of the present invention.
Figure 6D:
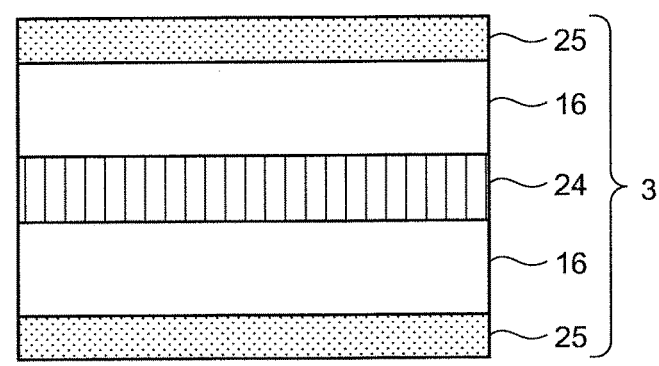
FIG. 6D is a schematic sectional view illustrating another configuration example of the color conversion film in the light source unit according to an embodiment of the present invention.

The configuration of the color conversion film is not limited to a particular one, but, as illustrated in FIG. 6A, a configuration in which a color conversion layer 24 is laminated on a base material 16 is preferred. As illustrated in FIG. 6B, a configuration in which the base material 16 is laminated on both sides of the color conversion layer 24 is more preferred. Furthermore, as illustrated in FIG. 6C and FIG. 6D, a barrier layer 25 may be provided between the color conversion layer 24 and each of the base materials 16, or on one face of each of the base materials 16, the one face being opposite to another face of the base material 16 facing the color conversion layer 24.

(Base Material)

The base material is not particularly limited, and as the base material, for example, a known metal, film, glass, ceramic, or paper may be used. Specific examples of the base material include metal plates and foil of aluminum (including aluminum alloy), zinc, copper, and iron; plastic films of cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin, and a copolymer of tetrafluoroethylene and ethylene (ETFE) as a thermoplastic fluorocarbon resin; plastic films of an α-polyolefin resin, a polycaprolactone resin, an acrylic resin, a silicone resin, and copolymer resins of these resins with ethylene; paper laminated by the above-mentioned plastics; paper coated with the above-mentioned plastics; paper laminated or vapor-deposited by the above-mentioned metals; and plastic films laminated or vapor-deposited by the above-mentioned metals. When the base material is a metal plate, the surface of the metal plate may be subjected to chromium-based or nickel-based plating treatment or ceramic treatment.

Among the above-mentioned materials, glass and resin films are preferably used from the viewpoints of the ease of preparing and shaping the color conversion film. Furthermore, a film with high strength is preferred so as not to cause breakage or other troubles during the handling of the film-shaped base material. From the viewpoints of these desired characteristics and economic efficiency, resin films are preferred. Among the resin films, a plastic film selected from the group consisting of PET, polyphenylene sulfide, polycarbonate, and polypropylene is preferred from the viewpoints of economic efficiency and the ease of handling. Furthermore, in the case where the color conversion film is dried or in the case where the color conversion film is shaped by thermo-compression using an extruder at a high temperature of 200° C. or higher, a polyimide film is preferred from the viewpoint of heat resistance. To peel off the sheet more easily, a surface of the base material may be previously subjected to releasing treatment.

The thickness of the base material is not particularly limited, but the lower limit of the thickness is preferably 25 μm or larger, and more preferably 38 μm or larger. The upper limit of the thickness of the base material is preferably 5,000 μm or smaller, and more preferably 3,000 μm or smaller.

A later-mentioned laminated film including eleven or more of alternating layers of different thermoplastic resins is preferably used as the base material.

The drying of the color conversion film can be carried out using a common heating device such as a hot air dryer or an infrared dryer. The heating of the color conversion film can be carried out using a common heating device such as a hot air dryer or an infrared dryer. In this case, the heating is performed under conditions of usually a temperature of 40° C. to 250° C. and a heating time of 1 minute to 5 hours, and preferably a temperature of 60° C. to 200° C. and a heating time of 2 minutes to 4 hours. Furthermore, stepwise thermosetting such as step-cure may be employed.

After the color conversion film is prepared, the base material may be changed, as needed. In this case, examples of a simpler method for changing the base material include, but are not limited to, a method of re-laminating the base material by using a hot plate and a method using a vacuum laminator or a dry film laminator.

(Barrier Layer)

The base material of the color conversion film may be provided with a barrier layer. Examples of the barrier layer include metal oxide thin films and metal nitride thin films made of inorganic oxides such as silicon oxide, aluminum oxide, titanium oxide, tantalum oxide, zinc oxide, tin oxide, indium oxide, yttrium oxide, and magnesium oxide, inorganic nitrides such as silicon nitride, aluminum nitride, titanium nitride, and silicon carbide nitride, mixtures of the above-mentioned oxides and nitrides, and what are obtained by adding other elements to the above-mentioned oxides and nitrides; and films made of various resins, such as polyvinylidene chloride, an acrylic resin, a silicone resin, a melamine resin, a urethane resin, a fluororesin, and a polyvinyl alcohol-based resin such as saponified vinyl acetate.

(Adhesive Layer)

The color conversion film may be provided with an adhesive layer between layers, as needed. The adhesive layer is not particularly limited as long as the adhesive layer does not excessively affect the light emission and durability of the color conversion film, and a known material can be used for the adhesive layer without any particular limitation. In the case where layers need to firmly adhere to each other, a photocurable material, a thermosetting material, an anaerobic curable material, or a thermoplastic material may be preferably used. Among these materials, a thermosetting material is more preferred. Furthermore, a thermosetting material that is curable at a temperature of 0° C. to 150° C. is particularly preferred.

The thickness of the adhesive layer is not particularly limited, but is preferably 0.01 μm or larger and 100 μm or smaller, and more preferably 0.01 μm or larger and 25 μm or smaller. The thickness of the adhesive layer is still more preferably 0.05 μm or larger and 5 μm or smaller, and particularly preferably 0.05 μm or larger and 1 μm or smaller.

(Color Conversion Composition)

A color conversion composition can be used to mold the color conversion film. The above-mentioned organic luminescent material, binder resin, and solvent, and other ingredients are mixed in their specific predetermined amounts. The above-mentioned components are mixed to achieve a predetermined composition, and subsequently homogeneously mixed and dispersed using a stirring-kneading machine, such as a homogenizer, a rotating-revolving stirrer, a three-roller, a ball mill, a planetary ball mill, or a bead mill, to obtain a color conversion composition. Defoaming under a vacuum or reduced pressure condition is preferably performed after or during the mixing and dispersing process. A specific component may be previously mixed in, or treatment such as aging may be carried out. The solvent can be removed using an evaporator to achieve a desired solid content concentration.

The solvent used for the color conversion composition is not particularly limited as long as the solvent is capable of adjusting the viscosity of a resin in a flowing state and does not excessively affect the light emission and durability of a luminescent substance. Examples of the solvent include water, 2-propanol, ethanol, toluene, methyl ethyl ketone, methyl isobutyl ketone, cyclohexanone, hexane, acetone, terpineol, texanol, methyl cellosolve, butyl carbitol, butyl carbitol acetate, and propylene glycol monomethyl ether acetate. A mixture of two or more of these solvents may also be used.

(Method for Preparing Color Conversion Film by Using Color Conversion Composition) The color conversion composition prepared using the above-described method is applied onto the base material and dried. The application of the color conversion composition can be performed using a reverse roll coater, a blade coater, a slit die coater, a direct gravure coater, an offset gravure coater, a kiss coater, a natural roll coater, an air knife coater, a roll blade coater, a two stream coater, a rod coater, a wire bar coater, an applicator, a dip coater, a curtain coater, a spin coater, or a knife coater. In order to obtain uniformity in the film thickness of the color conversion layer, the application is performed preferably using a slit die coater.

<Laminated Film>

A laminated film preferably included in the light source unit of the present invention preferably includes a thermoplastic resin. A thermoplastic resin is generally more inexpensive than a thermosetting resin and a photosetting resin, and can be easily and continuously made into a sheet by known melt-extrusion, and hence the laminated film can be obtained at low cost.

The laminated film needs to include eleven or more of alternating layers of different thermoplastic resins. The different thermoplastic resins used herein mean resins whose refraction indexes are different by 0.01 or larger from each other in arbitrarily two directions perpendicular to each other in a plane of the film, or in a direction perpendicular to the plane.

Moreover, the alternating layers mean layers of different thermoplastic resins that are laminated in a regular alignment in the thickness direction. For example, in the case where a laminated film includes two types of thermoplastic resins X and Y, layers are laminated to be X(YX)n (wherein n is a natural number) when each of the layers is expressed as a layer X or a layer Y. Such an alternate lamination of resins having different optical characteristics can cause interference reflection that allows reflection of light with a wavelength designed from the relation between the difference in refraction index between layers and the thicknesses of the layers.

When the number of layers to laminate is 10 or smaller, high reflectivity cannot be obtained in a desired wavelength range. The number of layers to laminate is 100 or larger, more preferably 200 or larger, and still more preferably 600 or larger.

The above-described interference reflection allows a wavelength range to be expanded as the number of the layers is larger, and allows high reflectivity to be achieved, and thus, a laminated film capable of reflecting light in a desired wavelength range can be achieved. The upper limit of the number of layers of the laminated film is not particularly limited, but the number of the layers is preferably 10,000 or smaller because, as the number of layers is larger, a produced device is increased in size to cause an increase in production cost, and an increase in film thickness causes handling to be more difficult.

The laminated film preferably has a reflectivity of 20% or lower when an incident angle of light incident upon the laminated film from a later-mentioned light emitting body is 10°. Specifically, in order to output white light, the light emitting body preferably exhibits blue and green light emission in which a peak wavelength is observed in a region of 400 nm or longer and 580 nm or shorter. Therefore, the laminated film preferably has a reflectivity of 20% or lower when an incident angle of light having a wavelength of 400 nm or longer and 580 nm or shorter is 10°. Here, the incident light incident upon the laminated film from the light emitting body indicates light in a region from a short wavelength end to a long wavelength end described below.

Short wavelength end: a shorter wavelength out of wavelengths having the half intensity of the peak intensity at a peak indicating the maximum intensity in the intensity distribution of wavelength of light emitted from the light source included in the light emitting body. Long wavelength end: a longer wavelength out of wavelengths having the half intensity of the peak intensity at a peak indicating the maximum intensity in the intensity distribution of wavelength of green light emitted from the green phosphor included in the light emitting body.

The reflectivity of 20% or lower when light enters at an incident angle of 10° is taken as an average reflectivity of light incident upon the laminated film from the light emitting body. In the case where a reflectivity is 20% or lower when the above-described incident angle is 10°, light incident from the light emitting body penetrates the laminated film, and accordingly the amount of light reaching the color conversion film increases, and as a result, light emission in the color conversion film can be easily enhanced.

As an example, in the case where a blue light-emitting diode described in Examples of the present invention is used as the light source, the peak wavelength of light incident upon the laminated film from the light emitting body is in a range of 400 nm to 500 nm. Furthermore, to enhance purity of blue light emission, the peak wavelength is preferably in range of 430 nm to 470 nm.

The light source is not limited to a blue light-emitting diode, but may be a light emitting diode that emits near ultraviolet rays (400 nm to 420 nm) or a light emitting diode that emits green or red light. The wavelength range of light incident upon the laminated film from the light emitting body is calculated, and the calculated result is used as a range for calculating the reflectivity of light incident upon the laminated film from the light emitting body.

The reflectivity at the above-described incident angle of 10° is preferably 15% or lower, and more preferably 10% or lower. By reducing the reflectivity, light emission in the color conversion film can be more efficiently and easily enhanced. Such a laminated film can be achieved in such a manner that the reflection wavelength range is optimized by controlling the layer thicknesses of layers of the film, and in addition, a layer including a resin with a low refractive index is provided on the top face of the film to reduce surface reflection.

The laminated film preferably has a reflectivity of 70% or higher when an incident angle of light incident upon the color conversion film from the later-mentioned light emitting body and converted into light having a longer wavelength at the time of light incidence being 60°. Specifically, to output white light, the color conversion film preferably exhibits red light emission in which a peak wavelength is observed in a region of 580 nm or longer and 750 nm or shorter, and therefore, the color conversion film preferably has a reflectivity of 70% or higher when an incident angle of light having a wavelength of 580 nm or longer and 750 nm or shorter is 60°.

Here, the light incident upon the color conversion film from the light emitting body and converted into light having a longer wavelength than a wavelength at the time of light incidence specifically means light in a range of a full width at half maximum at a peak indicating the maximum intensity in the fluorescence spectrum of the organic luminescent material when light emitted from the light emitting body included in the light source unit is taken as an excitation wavelength. The reflectivity of 70% or higher when light enters at an incident angle of 60° indicates an average reflectivity of 70% or higher within the range of the full width at half maximum.

A cause of a decrease in brightness of the light source unit including the color conversion film containing the organic luminescent material is a loss due to stray light caused by isotropic light emission from the color conversion film. In particular, a main factor of the loss is stray light emitted from the color conversion film toward the light emitting body side in the light source unit.

When the laminated film having a reflectivity of 70% or higher at the above-mentioned incident angle of 60° is provided between the light emitting body and the color conversion film, light from the color conversion film can be reflected directly under the film, and a decrease in brightness due to stray light on the light emitting body side can be more easily substantially prevented. The above-mentioned reflectivity is preferably 90% or higher, and more preferably 95% or higher. As the reflectivity is higher, the amount of light penetrating the laminated film is smaller, whereby the effect of enhancing brightness can be achieved.

When light incident upon the color conversion film from the later-described light emitting body and converted into light having a longer wavelength enters at an incident angle of 10°, the reflectivity is preferably 70% or higher. When not only light at an incident angle of 60°, but also light at an incident angle of 100 is reflected, almost all light emitted from the color conversion film is reflected on the laminated film from the light emitting body side toward the display side, and thus, a remarkable effect of enhancing brightness is achieved.

Figure 7:
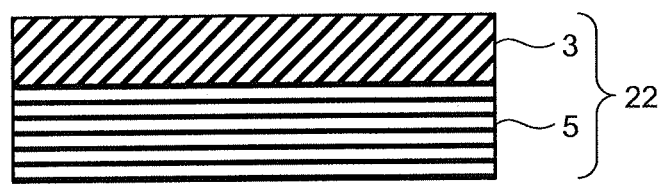
FIG. 7 is a schematic sectional view illustrating a configuration example of a laminated member in the light source unit according to an embodiment of the present invention.

In an embodiment of the present invention, as illustrated in FIG. 7, a laminated member 22 obtained by lamination of the color conversion film 3 and the laminated film 5 is preferred. The lamination used herein indicates a state in which the color conversion film and the laminated film are fixed to each other directly or via an adhesive layer, for example.

When the color conversion film and the laminated film are laminated, there is no space between the color conversion film and the laminated film. This allows a loss of light due to stray light to be reduced, and allows reflection between air and a surface of the color conversion film to be eliminated, whereby a remarkable effect of enhancing brightness is achieved.

Figure 8:
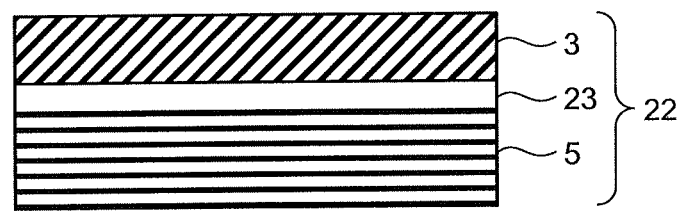
FIG. 8 is a schematic sectional view illustrating a configuration example of another laminated member in the light source unit according to the present invention.

As illustrated in FIG. 8, a functional layer 23 may be provided between the color conversion film 3 and the laminated film 5. Here, as for relations among a refraction index n1 of the laminated film 5, a refraction index n2 of the color conversion film 3, and a refraction index n3 of the functional layer 23, the refraction index n3 of the functional layer 23 is preferably between the refraction index n1 of the laminated film 5 and the refraction index n2 of the color conversion film 3. Note that a case in which n3 is between n1 and n2 does not include a case of n3=n1 or a case of n3=n2.

Here, the refraction index of the laminated film and the refraction index of the color conversion film each indicate an in-plane average refraction index of a layer serving as a top layer of the film. In this case, by the effect of the refraction index of the functional layer, the reflection between the laminated film and the color conversion film that have different indexes of refraction can be substantially prevented, and light from the light source efficiently penetrates, and thus, brightness can be more easily enhanced.

Examples of a material used for the laminated film constituting the laminated member and the light source unit include:

chain polyolefins, such as polyethylene, polypropylene, poly(4-methylpentene-1), and polyacetal;

alicyclic polyolefins, such as ring-opening methathesis polymers and addition polymers of norbornenes, and addition copolymers with other olefins;

biodegradable polymers, such as polylactic acid and polybutyl cuccinate;

polyamides, such as nylon 6, nylon 11, nylon 12, and nylon 66;

aramid, polymethyl methacrylate, polyvinyl chloride, polyvinylidene chloride, polyvinyl alcohol, polyvinyl butyral, ethylene vinyl acetate copolymers, polyacetal, polyglucolic acid, polystyrene, styrene-polymethyl methacrylate copolymers, and polycarbonate;

polyesters, such as polypropylene terephthalate, polyethylene terephthalate, polybutylene terephthalate, and polyethylene-2,6-naphthalate;

polyether sulfone, polyether ether ketone, modified polyphenylene ether, polyphenylene sulfide, polyether imide, polyimide, polyarylate, an ethylene tetrafluoride resin, an ethylene trifluoride resin, an ethylene chloride trifluoride resin, an ethylene tetrafluoride-propylene hexafluoride copolymer, and polyvinylidene fluoride.

Among the above-mentioned materials, polyesters are particularly preferably used from the viewpoints of strength, heat resistance, transparency, and versatility. The polyesters may be copolymers or may be a mixture of two or more of them.

As the polyesters, a polyester obtained by polymerization of a monomer including aromatic dicarboxylic acid or aliphatic dicarboxylic acid and diol as a main component is preferred.

Here, examples of the aromatic dicarboxylic acid include terephthalic acid, isophthalic acid, phthalic acid, 1,4-naphthalene dicarboxylic acid, 1,5-naphthalene dicarboxylic acid, 2,6-naphthalene dicarboxylic acid, 4,4'-diphenyldicarboxylic acid, 4,4'-diphenyl ether dicarboxylic acid, and 4,4'-diphenylsulfone dicarboxylic acid.

Examples of the aliphatic dicarboxylic acid include adipic acid, suberic acid, sebacic acid, dimer acid, dodecanedioic acid, and cyclohexanedicarboxylic acid, and ester derivatives thereof. Among these acid components, terephthalic acid and 2,6-naphthalene dicarboxylic acid are preferred because terephthalic acid and 2,6-naphthalene dicarboxylic acid exhibit a high refraction index. These acid components may be used alone or in combination of two or more of them, and furthermore may be partially copolymerized with, for example, oxyacid such as hydroxybenzoic acid.

Examples of the diol component include ethylene glycol, 1,2-propanediol, 1,3-propanediol, neopentylglycol, 1,3-butanediol, 1,4-butanediol, 1,5-pentanediol, 1,6-hexanediol, 1,2-cyclohexanedimethanol, 1,3-cyclohexanedimethanol, 1,4-cyclohexanedimethanol, diethylene glycol, triethylene glycol, polyalkylene glycol, 2,2-bis(4-hydroxyethoxyphenyl)propane, isosorbide, and spiroglycol. Among these diol components, ethylene glycol is preferably used. These diol components may be used alone or in combination of two or more of them.

For example, among the above-mentioned polyesters, polyethylene terephthalate and a polymer thereof, polyethylene naphthalate and a copolymer thereof, polybutylene terephthalate and a copolymer thereof, polybutylene naphthalate and a copolymer thereof, polyhexamethylene terephthalate and a copolymer thereof, and polyhexamethylene naphthalate and a copolymer thereof are preferably used as a thermoplastic resin in the laminated film.

From the viewpoints of achieving sufficient reflectivity and further improving brightness enhancement performance, in the laminated film, the difference in in-plane average refraction index between the layer X including the thermoplastic resin X and the layer Y including the thermoplastic resin Y is preferably 0.03 or larger, more preferably 0.05 or larger, and still more preferably 0.1 or larger.

To achieve the difference, for example, the thermoplastic resin X is a crystalline resin and the thermoplastic resin Y is a non-crystalline resin. In this case, in stretching and heat treatment processes during the production of the laminated film, the difference in refraction index can be easily made.

A combination of the thermoplastic resin X and the thermoplastic resin Y is preferably such that an absolute value of difference in solubility parameter (SP) value between the thermoplastic resins is 1.0 or smaller. When an absolute value of difference between the SP values is 1.0 or smaller, delamination is less likely to occur.

A solubility parameter (SP value) used herein is a value calculated from the types and ratio of monomers constituting a resin by using the Fedors' estimation method, which is used commonly and described in, for example, Non-Patent Literature 3 (Poly. Eng. Sci., vol. 14, No. 2, pp 147-154 (1974)). Also, the same method can be applied for calculation of the SP value of a mixture of two or more of resins. For example, the SP value of polymethyl methacrylate is calculated at 9.5 $(cal/cm^3)^{0.5}$; the SP value of polyethylene terephthalate (PET) is calculated at 10.7 $(cal/cm^3)^{0.5}$; and the SP value of a bisphenol An epoxy resin is calculated at 10.9 $(cal/cm^3)^{0.5}$.

A combination of the thermoplastic resin X and the thermoplastic resin Y both having the same basic skeleton is preferred. Here, the basic skeleton refers to a repeating unit constituting a resin. For example, in the case where polyethylene terephthalate is used as the thermoplastic resin X, the thermoplastic resin Y preferably includes ethylene terephthalate, which has the same basic skeleton as that of polyethylene terephthalate, from the viewpoint of easily achieving a laminated structure of high precision. When the thermoplastic resin X and the thermoplastic resin Y have the same basic skeleton, high-precision lamination is achieved, and furthermore, delamination is less likely to occur in a lamination interface.

From the viewpoint of offering good uniformity in thickness when a laminated film is formed, a preferred combination of the thermoplastic resin X and the thermoplastic resin Y is such that the difference in glass transition temperature between the thermoplastic resins is 20° C. or lower.

Furthermore, a preferred case is that the thermoplastic resin X is a crystalline resin, the thermoplastic resin Y is a non-crystalline resin, and the glass transition temperature of the thermoplastic resin X is lower than the glass transition temperature of the thermoplastic resin Y. In this case, in the laminated film, when the crystalline resin is stretched at a stretching temperature suitable for orientation and crystallization, the orientation of the non-crystalline resin can be reduced, compared with the crystalline resin, and thus a difference in refraction index can be more easily made.

Here, the crystalline resin is specifically a resin being such that, in differential scanning calorimetry (hereinafter, sometimes referred to as DSC) in accordance with JIS K7122 (1999), a resin is heated from 25° C. to 300° C. at a temperature rise rate of 20° C./min (1st RUN), and this state is kept for 5 minutes, and subsequently the resin is rapidly cooled to a temperature of 25° C. or lower, and the temperature is increased again from 25° C. to 300° C. at a temperature rise rate of 20° C./min, and in the resultant differential scanning calorimetry chart of the 2nd RUN, the resin has a melting enthalpy (ΔHm) of 15 J/g or higher, the melting enthalpy being calculated from the peak area of a melting peak.

The crystalline resin is a resin having a melting enthalpy (ΔHm) of 5 J/g or lower, the melting enthalpy being calculated under the same conditions as the above-described conditions.

A preferred example of a combination of the thermoplastic resins to satisfy the above-described conditions is such that the thermoplastic resin X includes polyethylene terephthalate or polyethylene naphthalate, and that the thermoplastic resin Y is a polyester including a polyester derived from spiroglycol.

The polyester derived from spiroglycol is a polyester including spiroglycol as a diol component, the polyester being a copolymer with another ester structure unit, being a polyester including spiroglycol as a single diol component, or being a polyester obtained by blending the above-mentioned copolymer or polyester with another polyester resin, in which spiroglycol residues preferably amount to half or more of all diol residues in the resultant polyester resin. The polyester derived from spiroglycol is preferred because the difference in glass transition temperature between the polyester derived from spiroglycol and polyethylene terephthalate or polyethylene naphthalate is small, and accordingly, at the time of film production, excessive stretching and delamination are both less likely to occur.

A more preferred case is that the thermoplastic resin X includes polyethylene terephthalate or polyethylene naphthalate, and the thermoplastic resin Y is a polyester including spiroglycol and cyclohexanedicarboxylic acid. There is a bigger difference in in-plane average refraction index between the polyester including spiroglycol and cyclohexanedicarboxylic acid and polyethylene terephthalate or polyethylene naphthalate, and accordingly higher reflectivity can be more easily attained. Furthermore, there is a smaller difference in glass transition temperature between the polyester including spiroglycol and cyclohexanedicarboxylic acid and polyethylene terephthalate or polyethylene naphthalate, and the polyester is excellent in adhesiveness, and accordingly, at the time of film production, excessive stretching and delamination are both less likely to occur.

Another preferred case is that the thermoplastic resin X includes polyethylene terephthalate or polyethylene naphthalate, and the thermoplastic resin Y is a polyester derived from cyclohexane dimethanol.

The polyester derived from cyclohexane dimethanol is a polyester including cyclohexane dimethanol as a diol component, the polyester being a copolymer with another ester structure unit, being a polyester including cyclohexane dimethanol as a single diol component, or being a polyester obtained by blending the above-mentioned copolymer or polyester with another polyester resin, in which cyclohexane dimethanol residues preferably amount to half or more of all diol residues in the resultant polyester resin. The polyester derived from cyclohexane dimethanol is preferred because the difference in glass transition temperature between the polyester derived from cyclohexane dimethanol and polyethylene terephthalate or polyethylene naphthalate is small, and accordingly, at the time of molding, excessive stretching and delamination are less likely to occur.

The polyester is more preferably such that at least one of the thermoplastic resins is an ethylene terephthalate polycondensate having a copolymerization amount of cyclohexane dimethanol of 15 mol % or larger and 60 mol % or smaller. This leads to higher reflection performance, and at the same time leads to a smaller change in optical characteristics, in particular, due to heating and the lapse of time, and leads to less occurrence of delamination. The ethylene terephthalate polycondensate having a copolymerization amount of cyclohexane dimethanol of 15 mol % or larger and 60 mol % or smaller strongly adheres to polyethylene terephthalate. Furthermore, a cyclohexane dimethanol group of the polycondensate includes cis or trans cyclohexane dimethanol as a geometrical isomer, and chair or boat cyclohexane dimethanol as a conformational isomer. Therefore, the polycondensate is less likely to cause oriented-crystallization even when stretched together with polyethylene terephthalate, has higher reflectivity, leads to a further smaller change in optical characteristics by thermal histeresis, and leads to less occurrence of breakage during film production.

In the present invention, the color conversion film or the laminated film is preferably kept separated from the light emitting body. When the color conversion film or the laminated film is kept separated from the light emitting body, heat from the light emitting body is less likely to be transferred to the color conversion film, whereby deterioration of the organic luminescent material is substantially prevented.

(Method for Producing Laminated Film)

Next, a preferred method for producing the laminated film will be described below, using a laminated film including the thermoplastic resins X and Y as an example. Note that the present invention should not be interpreted in a restrictive way by the example of the production method. The laminated structure of the laminated film used in the present invention can be obtained by making use of the same manner as that described in paragraphs [0053] to [0063] of Patent Literature 6 (Japanese Patent Application Laid-open No. 2007-307893).

The thermoplastic resins are each prepared, for example, in a pellet form. The pellets are dried in a hot blast or under vacuum, as needed, and then supplied to separate extruders. In the case where the laminated film includes an ultraviolet absorber, a pellet is prepared in advance by kneading each of the thermoplastic resins with the ultraviolet absorber, and the thermoplastic resin and the ultraviolet absorber are kneaded in the extruder.

The resins are melted through heating to a temperature equal to or higher than the melting point in the respective extruders, and the amounts of the resins extruded are made uniform using a gear pump or other tools, and foreign matters and a deformed resin are removed via a filter or other tools. Using a die, the resins are molded to have a target shape, and then ejected therefrom. Subsequently, a multilayer laminated sheet ejected from the die is extruded onto a cooler, such as a casting drum, to be cooled and solidified, whereby a casting film is obtained.

At this time, by using an electrode in the shape of, for example, a wire, a tape, a needle, or a knife, the sheet is preferably stuck fast to the cooler such as a casting drum with electrostatic force to be rapidly cooled and solidified. Alternatively, by blowing air from a device in a slit, spot, or plane shape, the sheet is preferably stuck fast to the cooler such as a casting drum to be rapidly cooled and solidified. Alternatively, the sheet is preferably stuck fast to the cooler with a nip roller to be rapidly cooled and solidified.

The thermoplastic resin X and the thermoplastic resin Y are preferably sent to a multilayer lamination device via different passages by using two or more extruders to produce a laminated film.

As the multilayer lamination device, for example, a multi-manifold die, a feed block, or a static mixer may be used, and a feed block having 51 fine slits or more is particularly preferably used. When such a feed block is used, the device is not extremely large in size, and accordingly, foreign matters due to heat deterioration are reduced, and even when the number of laminations is extremely large, lamination with high precision can be achieved. Furthermore, lamination precision in the width direction is remarkably higher than that in the prior art. Furthermore, this device can adjust the thicknesses of layers in accordance with the shape (length, width) of a slit, and therefore, allows any layer thickness to be achieved.

The thus-formed melt multilayer laminate having a desired lamination structure is introduced into a die to obtain a casting film in the same manner as that described above.

The obtained casting film is preferably biaxially stretched. The biaxial stretching used herein means stretching in both a longitudinal direction and a width direction. The stretching may be conducted in the two directions serially or in the two directions simultaneously. Furthermore, re-stretching may be conducted in the longitudinal direction and/or the width direction.

The serial biaxial stretching will be described first. Stretching in a longitudinal direction used herein means stretching for providing a molecular orientation in the longitudinal direction to a film. Usually, stretching is performed by making use of the difference in peripheral speed between rollers. This stretching may be conducted in one step, or may be conducted in multistep by using two or more roller pairs. The magnification of the stretching depends on the types of resins, but, is usually 2× to 15× magnification, and in the case where polyethylene terephthalate is used for any of the resins constituting the laminated film, the magnification is particularly preferably 2× to 7× magnification. The temperature of the stretching is preferably the glass transition temperature of the resins constituting the laminated film or higher and (the glass transition temperature+100° C.) or lower.

The thus-obtained monoaxially stretched film may be subjected to surface treatment, such as corona treatment, flame treatment, or plasma treatment, as needed, and subsequently, provided with functions, such as lubricity, adhesiveness, and antistatic properties, by in-line coating. In particular, when a laminated member including the laminated film and the color conversion film is formed, the in-line coating is preferably performed with a resin having a refraction index lower than the refraction index of the thermoplastic resin X serving as the top layer of the laminated film and higher than the refraction index of a film serving as the top layer of the color conversion film.

Stretching in a width direction means stretching for providing an orientation in the width direction to a film. Usually, the film is transferred using a tenter, with each end of the film being held with a clip, and stretched in the width direction. The magnification of the stretching depends on the types of resins, but, is usually preferably 2× to 15× magnification, and in the case where polyethylene terephthalate is used for any of the resins constituting the laminated film, the magnification is particularly preferably 2× to 7× magnification. The temperature of the stretching is preferably the glass transition temperature of the resins constituting the laminated film or higher and (the glass transition temperature+120° C.) or lower.

The biaxially stretched film is preferably subjected to heat treatment at the stretching temperature or higher and the melting point or lower in the tenter in order to be provided with flatness and dimensional stability. When the film is subjected to the heat treatment, the dimensional stability of the film for molding is enhanced. The film is thus subjected to the heat treatment and cooled slowly and uniformly, and then cooled to room temperature and rolled up. During the heat treatment and the slow-cooling, for example, relaxation treatment may be also performed, as needed.

Next, the simultaneous biaxial stretching will be described. In the simultaneous biaxial stretching, the obtained casting may be subjected to surface treatment, such as corona treatment, flame treatment, or plasma treatment, as needed, and subsequently, provided with functions, such as lubricity, adhesiveness, and antistatic properties, by in-line coating.

Next, the casting film is introduced into a simultaneous biaxial tenter, and transferred with each end of the film being held with a clip, and stretched simultaneously and/or step by step in the longitudinal direction and the width direction. Examples of a simultaneous biaxial-stretching machine include pantograph type, screw type, drive-motor type, and linear-motor type biaxial-stretching machines. Drive-motor and linear-motor biaxial-stretching machines are preferred because these machines allow stretching magnification to be arbitrarily changed, and allow relaxation treatment to be performed at any portion. The stretching magnification depends on the types of resins, but, area magnification is usually preferably 6× to 50× magnification, and in the case where polyethylene terephthalate is used for any of the resins constituting the laminated film, area magnification is particularly preferably 8× to 30× magnification. In particular, in the case of the simultaneous biaxial stretching, in order to reduce an orientation difference in a plane, a stretching magnification in the longitudinal direction and a stretching magnification in the width direction are preferably made the same, and the stretching rate in the longitudinal direction and the stretching rate in the width direction are also preferably made approximately the same. The temperature of stretching is preferably the glass transition temperature of the resins constituting the laminated film or higher and (the glass transition temperature+120° C.) or lower.

Subsequently, the biaxially stretched film is preferably subjected to heat treatment at the stretching temperature or higher and the melting point or lower in the tenter in order to be provided with flatness and dimensional stability. In this heat treatment, in order to control the distribution of the main orientation axis in the width direction, the film is preferably subjected to relaxation treatment in the longitudinal direction in a moment immediately before and/or after the film enters a heat treatment zone. The film is thus subjected to the heat treatment and cooled slowly and uniformly, and then cooled to room temperature and rolled up. During the heat treatment and the slow-cooling, the film may be subjected to relaxation treatment in the longitudinal direction and/or the width direction, as needed. The relaxation treatment is applied in the longitudinal direction in a moment immediately before and/or after the film enters the heat treatment zone.

<Light Diffusing Film>

In the light source unit according to the present invention, a light diffusing film is preferably laminated on either or both faces of the color conversion film. This is because the light diffusing film has the effects of reducing unevenness in light from the light source and diffusing the light uniformly, and also has the effect of condensation of light as does a later-mentioned prism sheet, thereby contributing to enhancement in brightness in the front direction. Furthermore, the light diffusing film has the effects of reducing the directivity of light emitted from the light source and more easily extracting light emitted from the organic luminescent material to the outside of the color conversion film, thereby optimizing the ratio of light emission from the light source and light emission from the organic luminescent material.

The light diffusing film is classified into an upper diffusing film arranged on the top face of the prism sheet in order to prevent Moiré and reduce gloss, and a lower diffusing film arranged on the bottom face of the prism sheet with high transparency. For display and lighting device applications, only the lower diffusing film is usually used, but the lower diffusing film and the upper diffusing film may be used in combination in accordance with purposes.

Examples of the light diffusing film include LIGHT-UP and Chemical Matte (manufactured by KIMOTO Co., Ltd.), OPALUS (manufactured by KEIWA Incorporated), D-series (manufactured by TSUJIDEN Co., Ltd.), and CH/JS (manufactured by SKC Haas Display Films).

<Prism Sheet>

The light source unit according to the present invention is preferably provided with a prism sheet on a light emission face of the color conversion film. This is because, by condensing-light emitted from the light source, brightness in the front direction can be enhanced, and also the brightness of a back light can be made uniform. Here the light emission face indicates a face on a display side in the case of display applications, and indicates a face on a light emission side in the case of lighting device applications.

Commonly prism sheets have a structure in which a prism pattern in the shape of an isosceles triangle having a vertex angle of 90° or a micro-lens is formed on an optical transparent PET film. The number of the prism sheets used is only required to be one or more, but, in order to further enhance front brightness, two prism sheets perpendicular to each other are preferably used. The use of a combination of the prism sheet and the above-described light diffusing film exhibits the effect of enhancing front brightness more strongly.

Examples of the prism sheet include BEF series (manufactured by 3M.), DIA ART (manufactured by MITSUBISHI RAYON CO., LTD.), and GTL5000 and GTL6000 series (manufactured by GOYO PAPER WORKING CO., LTD.).

The light source unit of the present invention can be used for applications of, for example, a display, a lighting device, interior, a label, and signboard applications, and, in particular, is suitably used for a display and lighting device applications.

EXAMPLES

Hereinafter, the present invention will be described using examples, but the present invention is not limited to by these examples.

<Green Phosphor>

Green Phosphor 1: "GR-MW540K" (Eu-activated β-sialon phosphor), manufactured by Denka Company Limited Green Phosphor 2: "GR-SW532D" (Eu-activated β-sialon phosphor), manufactured by Denka Company Limited Green Phosphor 3: "GR-SW531B" (Eu-activated β-sialon phosphor), manufactured by Denka Company Limited Green Phosphor 4: "GR-SW529Y" (Eu-activated β-sialon phosphor), manufactured by Denka Company Limited Green Phosphor 5: Ce-activated lutetium aluminum garnet phosphor, manufactured by Mitsubishi Chemical Corporation <Red Phosphor>

Red Phosphor 1: Mn-activated complex fluoride phosphor, manufactured by Nemoto Lumi-Materials Co., Ltd.

<Measurement of Fluorescence Spectra of Green Phosphor and Red Phosphor>

The fluorescence spectrum of each of the green phosphors and the red phosphor was obtained by measuring a light emission spectrum at the time of exciting each of the phosphors at a wavelength of 450 nm by using a goniophotometric measurement system GP-500 (manufactured by Otsuka Electronics Co., Ltd.).

Table 2 lists values of light emission peak wavelengths and full widths at half maximum thereof that are read from light emission spectra of Green Phosphors 1 to 5 and Red Phosphor 1.

TABLE 2

| | Green Phosphor 1 | Green Phosphor 2 | Green Phosphor 3 | Green Phosphor 4 | Green Phosphor 5 | Red Phosphor 1 |
|---|---|---|---|---|---|---|
| Peak Wavelength (nm) | 544 | 538 | 535 | 529 | 540 | 631 |
| Full width at half maximum (nm) | 54 | 50 | 50 | 48 | 105 | 7 |

<Organic Luminescent Material>

In Examples and Comparative Example, Compounds R-1 and R-2 are compounds illustrated below.

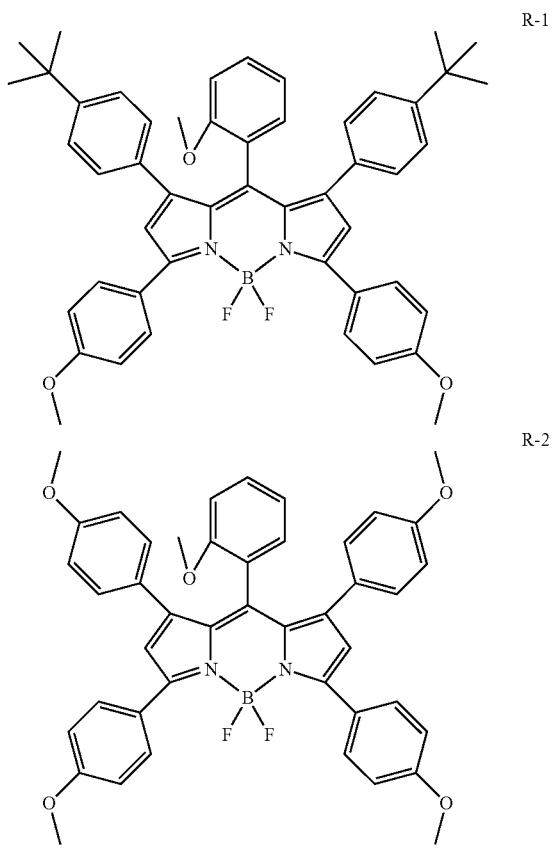

<Measurement of Absorption Spectrum of Organic Luminescent Material>

The absorption spectrum of each of the compounds was measured using Spectrophotometer U-3200 (manufactured by Hitachi, Ltd.) after dissolving the compound in toluene at a concentration of $1\times10^{-6}$ mol/L.

<Measurement of Fluorescence Spectrum of Organic Luminescent Material>

The fluorescence spectrum of each of the compounds was obtained in such a manner that, using Spectrofluorophotometer F-2500 (manufactured by Hitachi, Ltd.), a fluorescent spectrum at the time of dissolving the compound in toluene at a concentration of $1 \times 10^{-6}$ mol/L and exciting the resultant solution at a wavelength of 460 nm was measured.

Table 3 lists values of light emission peak wavelengths and full widths at half maximum thereof that are read from the absorption spectra and fluorescence spectra of Compounds R-1 and R-2.

TABLE 3

| | Compound | R-1 | R-2 |
|---|---|---|---|
| Absorption Spectrum | Peak Wavelength (nm) | 589 | 590 |
| | Full width at half maximum (nm) | 60 | 61 |
| Fluorescence Spectrum | Peak Wavelength (nm) | 631 | 633 |
| | Full width at half maximum (nm) | 42 | 43 |

<Measurement of Absorption Spectrum of Color Conversion Film>

The absorption spectrum of the color conversion film was measured using Spectrophotometer U-3200 (manufactured by Hitachi, Ltd.) by exciting the color conversion film at a wavelength of 460 rm. Here, the absorption peak wavelength of the color conversion film in later-mentioned Example 1 was 596 nm, and the absorption peak wavelength of the color conversion film in Example 13 was 589 nm.

<Measurement of Reflectivity of Laminated Film>

An angle variable transmission attachment device included in a spectrophotometer (Spectrophotometer U-4100) (manufactured by Hitachi, Ltd.) was installed, and absolute reflectivities at a wavelength in a range of 250 nm to 800 nm at incident angles 4 of 100 and 600 were measured. Measurement Conditions: a slit was 2 nm in size (for visible ray)/automatically controlled (for infrared ray); a gain was set at 2; and a scanning rate was 600 nm/min. A sample was cut out in a size of 5 cm×10 cm from a central portion in the film width direction, and measured.

<Brightness Measurement>

Brightness in the case of a configuration including the light emitting body, the diffusing plate, the laminated film, the color conversion film (sometimes the laminated member including the laminated film and the color conversion film), the prism sheet, and a polarization reflection film was measured using a spectral luminance meter manufactured by Konica Minolta Sensing Inc. Table 4 lists relative brightness with brightness in Comparative Example 1 being taken as 100.

TABLE 4

| | | | Example 1 | Example 2 | Example 3 | Example 4 | Example 5 | Example 6 | Example 7 | Example 8 |
|---|---|---|---|---|---|---|---|---|---|---|
| Wavelength at Maximum Light Emission of Light Source | | nm | | | | 447 | | | | |
| Phosphor | | | | | Green Phosphor 1 | | | | Green Phosphor 2 | Green Phosphor 3 |
| Luminescent Material | | | | | | R-1 | | | | |
| Binder Resin | | | | | | Polyester | | | | |
| Peak Wavelength | Green | nm | 532 | 532 | 532 | 532 | 532 | 532 | 529 | 527 |
| | Red | nm | 641 | 641 | 641 | 641 | 641 | 641 | 641 | 641 |
| Full width at half maximum | Green | nm | 41 | 41 | 41 | 41 | 41 | 41 | 37 | 37 |
| | red | nm | 48 | 48 | 48 | 48 | 48 | 48 | 48 | 48 |
| Laminated Film Reflectivity at Incident Angle of 10° | Reflectivity for Light Having Wavelength of 400 nm or Longer and 580 nm or Shorter | % | — | 9 | 9 | 9 | 12 | 12 | 12 | 12 |
| | Reflectivity for Light Having Wavelength of 580 nm or Longer and 750 nm or Shorter | % | — | 9 | 72 | 96 | 95 | 95 | 95 | 95 |
| Laminated Film Reflectivity at Incident Angle of 60° | Reflectivity for Light Having Wavelength of 580 nm or Longer and 750 nm or Shorter | % | — | 11 | 83 | 100 | 100 | 100 | 100 | 100 |
| Relative Brightness | | | 105 | 106 | 112 | 116 | 114 | 112 | 118 | 117 |
| Color Coordinate | x | | 0.298 | 0.298 | 0.298 | 0.298 | 0.298 | 0.298 | 0.296 | 0.296 |
| | y | | 0.297 | 0.297 | 0.297 | 0.297 | 0.297 | 0.297 | 0.294 | 0.297 |
| Area of Color Gamut (u', v') | | | 88% | 88% | 88% | 88% | 88% | 88% | 90% | 88% |

TABLE 4-continued

| | | | Example 9 | Example 10 | Example 11 | Example 12 | Example 13 | Comparative Example 1 |
|---|---|---|---|---|---|---|---|---|
| Wavelength at Maximum Light Emission of Light Source | | nm | | | 447 | | | |
| Phosphor | | | Green Phosphor 4 | Green Phosphor 5 | | Green Phosphor 1 | | |
| Luminescent Material | | | R-1 | | R-2 | R-1 | | KSF |
| Binder Resin | | | | Polyester | | | Acrylic Resin | Polyester |
| Peak Wavelength | Green | nm | 521 | 530 | 531 | 531 | 535 | 544 |
| | Red | nm | 641 | 641 | 643 | 641 | 641 | 631 |
| Full width at half maximum | Green | nm | 36 | 95 | 41 | 41 | 44 | 55 |
| | red | nm | 48 | 48 | 49 | 48 | 48 | 7 |
| Laminated Film Reflectivity at Incident Angle of 10° | Reflectivity for Light Having Wavelength of 400 nm or Longer and 580 nm or Shorter | % | 12 | 12 | 12 | 12 | 9 | — |
| | Reflectivity for Light Having Wavelength of 580 nm or Longer and 750 nm or Shorter | % | 95 | 95 | 95 | 95 | 96 | — |
| Laminated Film Reflectivity at Incident Angle of 60° | Reflectivity for Light Having Wavelength of 580 nm or Longer and 750 nm or Shorter | % | 100 | 100 | 100 | 100 | 100 | — |
| Relative Brightness | | | 115 | 107 | 116 | 105 | 109 | 100 |
| Color Coordinate | x | | 0.294 | 0.298 | 0.298 | 0.261 | 0.298 | 0.25 |
| | y | | 0.296 | 0.296 | 0.295 | 0.297 | 0.297 | 0.22 |
| Area of Color Gamut (u', v') | | | 84% | 73% | 91% | 82% | 86% | 75% |

<Calculation of Color Gamut>

From light emission spectrum data obtained by the brightness measurement, the peak wavelength of green light emission and a full width at half maximum thereof and the peak wavelength of red light emission and a full width at half maximum thereof were determined. Furthermore, from the light emission spectrum data obtained by the brightness measurement and spectrum data of transmittance of a color filter, a color gamut in a color space (u',v') when color purity was enhanced by the color filter was calculated. The area of the calculated color gamut in the color space (u',v') was evaluated, with the area of BT.2020 color gamut being taken as 100%. When this ratio is higher, color reproducibility is better.

Example 1

<Preparation of Phosphor Composition>

Into a 100-ml polyethylene container, 16.0 g of a silicone resin serving as a matrix resin and 8.0 g of Green Phosphor 1 were put and mixed. Subsequently, using a planetary stirring/defoaming device, the resultant mixture was stirred and defoamed at 2,000 rpm for 5 minutes to prepare a phosphor composition.

<Preparation of Light Emitting Body>

The obtained phosphor composition was poured into a package frame (a frame "TOP LED BASE", manufactured by ENOMOTO Co., Ltd.) mounted with an LED chip ("GM2QT450G", manufactured by Showa Denko K.K. average wavelength: 454 nm) by using a dispenser ("MPP-1", manufactured by Musashino Engineering, Inc.), and cured at 80° C. for 1 hour and then cured at 150° C. for 2 hours to prepare a light emitting body.

<Preparation of Color Conversion Composition>

As a binder resin, a polyester resin (SP value=10.7 $(cal/cm^3)^{0.5}$) was used. 0.017 part by weight of the compound R-1 as an organic luminescent material and 300 parts by weight of toluene as a solvent were mixed with 100 parts by weight of the binder resin. Subsequently, using a planetary stirring/defoaming device, "MAZERUSTAR KK-400" (manufactured by KURABO INDUSTRIES LTD.), the resultant mixture was stirred and defoamed at 300 rpm for 20 minutes to obtain a color conversion composition.

<Preparation of Color Conversion Film>

Using a slit die coater, the color conversion composition was applied onto the PET-base-material side of a light diffusion film "Chemical Matte" 125PW (manufactured by KIMOTO Co., Ltd., thickness: 138 μm), and heated and dried at 100° C. for 20 minutes to form a color conversion layer having an average film thickness of 48 μm. Next, on the resultant, a PET film "Lumirror" U48 (manufactured by Toray Industries, Inc., thickness: 50 μm) was heat-laminated to prepare a color conversion film having a configuration of "base material/color conversion layer/base material/light diffusion layer".

Table 4 lists evaluation results of the color conversion film in Example 1 and a light source unit including this color conversion film. Table 4 reveals that the area of a color gamut in a color space (u',v') was 88% with respect to the area of BT.2020 color gamut, and this result was excellent.

Example 2

<Preparation of Laminated Film>

As the thermoplastic resin X, polyethylene terephthalate (PET) having a melting point of 258° C. was used. As the thermoplastic resin Y, ethylene terephthalate (PE/SPG•T/CHDC) that is a noncrystalline resin having no melting point and obtained by copolymerizing 25-mol % spiroglycol and 30-mol % cyclohexanedicarboxylic acid was used.

The prepared crystalline polyester and thermoplastic resin Y were fed into two single-shaft extruders, respectively, and melted at 280° C. and kneaded. Next, the resultant crystalline polyester and the resultant thermoplastic resin Y were each passed through five FSS leaf disc filters, and then, while being weighed using a gear pump, flows of the resins were joined at a lamination device having eleven slits to form a laminate in which eleven layers were alternately laminated in the thickness direction. The method of forming the laminate was conducted as described in paragraphs [0053] to [0056] in Patent Literature 6. Here, the lengths of the slits and intervals between the slits were fixed. The obtained laminate included six layers of the thermoplastic resin X and five layers of the thermoplastic resin Y, and had a laminated structure in which the layers were alternately laminated in the thickness direction. A width expansion ratio inside a mouthpiece, specifically, a value obtained by dividing the film-width-direction length of a mouthpiece lip by the film-width-direction length at the inlet portion of the mouthpiece was set at 2.5.

The obtained casting film was heated by rollers set at 80° C., and subsequently, while being rapidly heated from both sides of the film in a stretching section having a length of 100 mm by using a radiation heater, the film was stretched 3.3 times in the longitudinal direction thereof, and then once cooled. Next, both faces of this monoaxially stretched film were subjected to corona-discharge treatment in the air so that the base material film had a wetting tension of 55 mN/m. Onto the treated faces, a lamination-forming-film liquid including (a polyester resin having a glass transition temperature of 18° C.)/(a polyester resin having a glass transition temperature of 82° C.)/silica particles having an average particle diameter of 100 nm was applied to form a transparent film with smoothness and easy adhesiveness. The film with easy adhesiveness had a refraction index of 1.57.

This monoaxially stretched film was introduced into a tenter and preheated using a hot blast at a temperature of 100° C., and subsequently stretched 3.3 times in the width direction at a temperature of 110° C. Here, the stretching rate and temperature were fixed. Then, the stretched film was subjected to heat treatment in the tenter by using a hot blast at a temperature of 240° C. Subsequently, the film was subjected to 2% relaxation treatment in the width direction under the same temperature condition, and furthermore, rapidly cooled to 100° C., and subsequently subjected to 5% relaxation treatment in the width direction. Thereafter, a rolled-up laminated film was obtained.

A color conversion film was prepared in the same manner as in Example 1, except that the laminated film was used in place of the PET film "Lumirror" U48 (manufactured by Toray Industries, Inc., thickness: 50 μm). Thus, a laminated member having a configuration of "the laminated film/the color conversion layer/the base material/the light diffusion layer" was obtained.

Table 4 lists evaluation results of the laminated member in Example 2 and a light source unit including this laminated member. Table 4 reveals that Example 2 was slightly higher in brightness than Example 1 in which a laminated film was not used. Example 2 was equivalent in color gamut area to Example 1.

Example 3

A laminated film, a color conversion film, and a laminated member were obtained in the same manner as in Example 2, except that the number of layers X made of the thermoplastic resin X was 101, and the number of layers Y made of the thermoplastic resin Y was 100.

Table 4 lists evaluation results of the laminated member in Example 3 and a light source unit including this laminated member. Table 4 reveals that Example 3 was higher in brightness than Example 2 in which the number of the layers was smaller. Example 3 was equivalent in color gamut area to Example 1.

Example 4

A laminated film, a color conversion film, and a laminated member were obtained in the same manner as in Example 2, except that the number of layers X made of the thermoplastic resin X was 301, and the number of layers Y made of the thermoplastic resin Y was 300.

Table 4 lists evaluation results of the laminated member in Example 4 and a light source unit including this laminated member. Table 4 reveals that Example 4 was considerably higher in brightness than Example 2. Example 4 was equivalent in color gamut area to Example 1.

Example 5

A laminated film, a color conversion film, and a laminated member were obtained in the same manner as in Example 4, except that the film with adhesiveness was not provided by in-line coating.

Table 4 lists evaluation results of the laminated member in Example 5 and a light source unit including this laminated member. It was revealed that Example 5 was higher in brightness than Example 1, but slightly lower in brightness than Example 4 because the reflectivity at the wavelength of the light emitting body was higher. Example 5 was equivalent in color gamut area to Example 1.

Example 6

A laminated film and a color conversion film were obtained in the same manner as in Example 5, except that the laminated member included neither the laminated film nor the color conversion film.

Table 4 lists evaluation results of the laminated film and the color conversion film in Example 6, and a light source unit including this laminated film and this color conversion film. Table 4 reveals that Example 6 was higher in brightness than Example 1, but slightly lower in brightness than Example 5 because, in Example 6, the laminated film and the color conversion film were used without being stuck together. Example 6 was equivalent in color gamut area to Example 1.

Example 7

A laminated film, a color conversion film, and a laminated member were obtained in the same manner as in Example 4, except that Green Phosphor 2 was used as the green phosphor of the phosphor composition.

Table 4 lists evaluation results of the laminated member in Example 7 and a light source unit including this laminated member. Table 4 reveals that, as in the case of Example 4, Example 7 was considerably high in brightness, and was excellent in color tone and brightness uniformity. Furthermore, it was revealed that the area of a color gamut in a color space (u',v') was 90% with respect to the area of BT.2020 color gamut, and that this result was excellent.

Example 8

A laminated film, a color conversion film, and a laminated member were obtained in the same manner as in Example 4, except that Green Phosphor 3 was used as the green phosphor of the phosphor composition.

Table 4 lists evaluation results of the laminated member in Example 8 and a light source unit including this laminated member. Table 4 reveals that, as in the case of Example 4, Example 8 was considerably high in brightness, and was excellent in color tone and brightness uniformity. Furthermore, it was revealed that the area of a color gamut in a color space (u',v') was 88% with respect to the area of BT.2020 color gamut, and that this result was excellent.

Example 9

A laminated film, a color conversion film, and a laminated member were obtained in the same manner as in Example 4, except that Green Phosphor 4 was used as the green phosphor of the phosphor composition.

Table 4 lists evaluation results of the laminated member in Example 9 and a light source unit including this laminated member. Table 4 reveals that, as in the case of Example 4, Example 9 was considerably high in brightness, and was excellent in color tone and brightness uniformity. Furthermore, it was revealed that the area of a color gamut in a color space (u',v') was 84% with respect to the area of BT.2020 color gamut, and that this result was excellent, but slightly inferior to that in Example 4.

Example 10

A laminated film, a color conversion film, and a laminated member were obtained in the same manner as in Example 4, except that Green Phosphor 5 was used as the green phosphor of the phosphor composition.

Table 4 lists evaluation results of the laminated member in Example 10 and a light source unit including this laminated member. Table 4 reveals that, as in the case of Example 4, Example 10 was considerably high in brightness, and was excellent in color tone and brightness uniformity. Furthermore, it was revealed that the area of a color gamut in a color space (u',v') was 73% with respect to the area of BT.2020 color gamut, and that this result was inferior to that in Example 4.

Example 11

A laminated film, a color conversion film, and a laminated member were obtained in the same manner as in Example 4, except that the compound R-2 was used as the organic luminescent material of the color conversion film.

Table 4 lists evaluation results of the laminated member in Example 11 and a light source unit including this laminated member. Table 4 reveals that, as in the case of Example 4, Example 10 was considerably high in brightness, and was excellent in color tone and brightness uniformity. Furthermore, it was revealed that the area of a color gamut in a color space (u',v') was 91% with respect to the area of BT.2020 color gamut, and that this result was excellent.

Example 12

A laminated film, a color conversion film, and a laminated member were prepared in the same manner as in Example 4, except that a PET film "Lumirror" U48 (manufactured by Toray Industries, Inc., thickness: 50 μm) was used in place of the light diffusion film.

Table 4 lists results obtained by evaluating the laminated member in Example 12 and a light source unit including this laminated member without using a prism sheet. The results were that, compared with Example 1 in which a laminated film was not used, blue-greenish white light was exhibited, and Example 12 was equivalent in brightness to Example 1, but slightly smaller in color gamut area than Example 1.

Example 13

A laminated film, a color conversion film, and a laminated member were obtained in the same manner as in Example 4, except that an acrylic resin (SP value=9.5 $(cal/cm^3)^{0.5}$) was used as the binder resin of the color conversion film.

Table 4 lists evaluation results of the laminated member in Example 13 and a light source unit including this laminated member. Table 4 reveals that, as in the case of Example 4, Example 13 was considerably high in brightness, and was excellent in color tone and brightness uniformity. Furthermore, it was revealed that the area of a color gamut in a color space (u',v') was 86% with respect to the area of BT.2020 color gamut, and that this result was excellent, but slightly inferior to that in Example 4.

The absorption spectra of the color conversion films prepared in Example 1 and Example 13 were measured, and the absorption peak wavelengths in the respective spectra were read. The results were that the absorption peak wavelength of the color conversion film in Example 1 was 596 nm, and the absorption peak wavelength of the color conversion film in Example 13 was 589 nm.

Comparative Example 1

<Preparation of Phosphor Composition>

Into a 100-ml polyethylene container, 16.0 g of a silicone resin serving as a matrix resin, 4.0 g of Green Phosphor 1, and 10.0 g of Red Phosphor 1 were added and mixed. Subsequently, using a planetary stirring/defoaming device, the resultant mixture was stirred and defoamed at 2,000 rpm for 5 minutes to prepare a phosphor composition.

<Preparation of Light Emitting Body>

The obtained phosphor composition was poured into a package frame (a frame "TOP LED BASE", manufactured by ENOMOTO Co., Ltd.) mounted with an LED chip ("GM2QT450G", manufactured by Showa Denko K.K. average wavelength: 454 nm) by using a dispenser ("MPP-1", manufactured by Musashino Engineering, Inc.), and cured at 80° C. for 1 hour and then cured at 150° C. for 2 hours to prepare an LED package. A light source unit having the same configuration as that in Example 1 was obtained, except that any color conversion layer was not formed.

Table 4 lists evaluation results of the light source unit in Comparative Example. Table 4 reveals that Comparative Example was inferior in both brightness and color gamut to Example 1.

As described above, the light source unit, the display, and the lighting device according to the present invention are respectively suitable as a light source unit, a display, and a lighting device, each being capable of achieving both high brightness and high color reproducibility.

REFERENCE SIGNS LIST

1 light source unit
2 light emitting body
3 color conversion film
4 light-guiding plate
5 laminated film
6 reflector
7 printed circuit board
8 package frame
9 LED chip
10 wire
11 phosphor layer
12, 12a, 12b transparent sealant
13 LED package
14 lens
15 cutter
16 base material
17 phosphor sheet
18 phosphor layer piece
19 collet
22 laminated member
23 functional layer
24 color conversion layer
25 barrier layer
41 incidence face

The invention claimed is:

1. A light source unit, comprising:
a light emitting body; and
a color conversion film including an organic luminescent material configured to convert at least a part of incident light incident from the light emitting body into light having a wavelength longer than a wavelength of the incident light,
wherein the light emitting body includes
a light source, and
a layer including a green phosphor and formed on the light source, and
wherein the organic luminescent material has a light emission wavelength peak in a wavelength region of 580 nm or longer and 750 nm or shorter.

2. The light source unit according to claim 1, wherein the green phosphor is an Eu-activated β-sialon phosphor.

3. The light source unit according to claim 1, wherein the green phosphor has a light emission wavelength peak in a range of 525 nm or longer and 545 nm or shorter.

4. The light source unit according to claim 1, wherein a laminated film including eleven or more of alternating layers of different thermoplastic resins is provided between the light emitting body and the color conversion film.

5. The light source unit according to claim 4, wherein the laminated film has a reflectivity of 70% or higher when light having a wavelength of 580 nm or longer and 750 nm or shorter enters the laminated film at an incident angle of 60°.

6. The light source unit according to claim 4, wherein the laminated film has a reflectivity of 20% or lower when light having a wavelength of 400 nm or longer and 580 nm or shorter enters the laminated film at an incident angle of 10°.

7. The light source unit according to claim 1, wherein the color conversion film includes a polyester resin.

8. The light source unit according to claim 1, wherein the organic luminescent material includes a pyrromethene derivative.

9. The light source unit according to claim 1, wherein the organic luminescent material includes a compound of Formula (1):

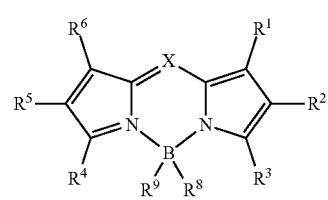

(1)

wherein X is C—$R^7$ or N; $R^1$ to $R^9$ are the same as or different from each other, and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring each formed between adjacent substituents.

10. The light source unit according to claim 9, wherein, in the Formula (1), X is C—$R^7$, $R^7$ being a group of Formula (2):

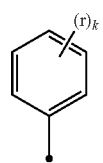

(2)

wherein r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group; k is an integer of 1 to 3; and, when k is 2 or larger, rs are the same as or different from each other.

11. The light source unit according to claim 9, wherein, in the Formula (1), $R^1$, $R^3$, $R^4$, and $R^6$ are the same as or different from each other, and are a substituted or unsubstituted aryl group.

12. The light source unit according to claim 1, wherein a light diffusion film is laminated on either or both faces of the color conversion films.

13. The light source unit according to claim 1, wherein a prism sheet is provided on a light emission face of the color conversion film.

14. The light source unit according to claim 4, wherein the color conversion film and the laminated film are laminated.

15. The light source unit according to claim 4, wherein a functional layer is provided between the color conversion film and the laminated film, and a refraction index n3 of the functional layer is between a refraction index n1 of the laminated film and a refraction index n2 of the color conversion film.

16. The light source unit according to claim 4, wherein the color conversion film or the laminated film arranged is kept separated from the light emitting body.

17. A display, comprising the light source unit according to claim 1.

18. A lighting device, comprising the light source unit according to claim 1.

* * * * *

UNITED STATES PATENT AND TRADEMARK OFFICE
CERTIFICATE OF CORRECTION

PATENT NO. : 10,669,474 B2  
APPLICATION NO. : 16/338841  
DATED : June 2, 2020  
INVENTOR(S) : Tatsuya Kanzaki et al.

Page 1 of 1

It is certified that error appears in the above-identified patent and that said Letters Patent is hereby corrected as shown below:

On the Title Page

Item [72], Inventors:
"Tatsuya Kanzaki, Otsu (JP)" should read --Tatsuya Kanzaki, Otsu-shi, Shiga (JP)--
"Yuichiro Iguchi, Otsu (JP)" should read --Yuichiro Iguchi, Otsu-shi, Shiga (JP)--
"Masaaki Umehara, Otsu (JP)" should read --Masaaki Umehara, Otsu-shi, Shiga (JP)--

Signed and Sealed this
Fourteenth Day of July, 2020

Andrei Iancu
*Director of the United States Patent and Trademark Office*